United States Patent [19]
Yieh et al.

[11] Patent Number: 5,994,209
[45] Date of Patent: Nov. 30, 1999

[54] METHODS AND APPARATUS FOR FORMING ULTRA-SHALLOW DOPED REGIONS USING DOPED SILICON OXIDE FILMS

[75] Inventors: Ellie Yieh, Millbrae; Li-Qun Xia, Santa Clara; Paul Gee, San Jose; Bang Nguyen, Fremont, all of Calif.

[73] Assignee: Applied Materials, Inc., Santa Clara, Calif.

[21] Appl. No.: 08/748,094

[22] Filed: Nov. 13, 1996

[51] Int. Cl.⁶ .............................. H01L 21/24; H01L 21/40
[52] U.S. Cl. ............................................ 438/541; 438/542
[58] Field of Search ................................... 438/541, 542, 438/550, 554, 563, 558

[56] References Cited

U.S. PATENT DOCUMENTS

| | | | |
|---|---|---|---|
| 4,619,719 | 10/1986 | Thomas et al. | 148/188 |
| 4,791,005 | 12/1988 | Becker et al. | 427/255.3 |
| 4,872,947 | 10/1989 | Wang et al. | 156/643 |
| 4,951,601 | 8/1990 | Maydan et al. | 118/719 |
| 5,272,361 | 12/1993 | Yamazaki | 257/66 |
| 5,308,790 | 5/1994 | Allman et al. | 437/164 |
| 5,340,752 | 8/1994 | Allman et al. | 437/31 |
| 5,340,770 | 8/1994 | Allman et al. | 437/164 |
| 5,354,387 | 10/1994 | Lee et al. | 148/33.3 |
| 5,504,031 | 4/1996 | Hsu et al. | 438/231 |
| 5,559,049 | 9/1996 | Cho | 438/304 |
| 5,567,630 | 10/1996 | Matsumoto et al. | 438/21 |

FOREIGN PATENT DOCUMENTS 3-273630  12/1991  Japan .

OTHER PUBLICATIONS

S. Wolf and R.N. Tauber. "Silicon Processing for the VLSI Era vol. 1—Process Technology" Lattice Press, Sunset Beach, CA. USA, 1986.

Davari, B. et al., "A Variable–Size Shallow Trench Isolation (STI) Technology With Diffused Sidewall Doping for Sub-micron CMOS," *IEEE*, 1988, pp. 92–95.

D.B. Lee, "Diffusion Into Silicon From An Arsenic–Doped Oxide", *Solid–State Electronics*, vol. 10, pp. 623–624, (1967).

Tanikawa et al., "Doped Oxide Films by Chemical Vapor Deposition in an Evacuated System", *Denki Kagaku*, vol. 41, No. 7, pp. 491–497, (1971).

H. Binder et al., "Doping of Trench Capacitors for 4 Megabit DRAMs", *Ex. Abs. of the 18th (1986 International) Conference on Solid State Devices and Materials*, pp. 299–302, (1986).

K. Yamada et al., "A Deep–Trenched Capacitor Technology for 4 Mega Bit Dynamic Ram", *IEDM Tech. Dig.*, pp. 702–705, (1985).

J. Scott et al., "A Solid–to–Solid Diffusion Technique", *RCA Rev.* 26, pp. 357–368, (1995).

G. Hoffmann, et al., "Investigation of the Diffusion Parameters of the Borosilicate–Silicon System By Infrared Absorption", *J. Phys. D. Appl. Phys.*, vol. 8, pp. 1044–1052, (1975).

E. Tanikawa et al., "Chemical Vapor Deposition in an Evacuated System", *Chemical Vapor Deposition (Wakefield and Blocher eds)*, pp. 261–275, (1973).

(List continued on next page.)

*Primary Examiner*—Charles Bowers
*Assistant Examiner*—Craig Thompson
*Attorney, Agent, or Firm*—Townsend & Townsend & Crew

[57] ABSTRACT

The present invention provides systems, methods and apparatus for high temperature (at least about 500–800° C.) processing of semiconductor wafers. The systems, methods and apparatus of the present invention allow multiple process steps to be performed in situ in the same chamber to reduce total processing time and to ensure high quality processing for high aspect ratio devices. Performing multiple process steps in the same chamber also increases the control of the process parameters and reduces device damage. In particular, the present invention can provide high temperature deposition, heating and efficient cleaning for forming dielectric films having thickness uniformity, good gap fill capability, high density, low moisture, and other desired characteristics.

18 Claims, 42 Drawing Sheets

OTHER PUBLICATIONS

K. Takeuchi et al., "High Performance Sub–Tenth CMOS Using Advanced Boron Doping and $WSi_2$ Dual Gate Process," *VLSI Technology Conference, Kyoto, Japan—1995 Symposium on VLSI Technology Digest of Technical Papers*, pp. 9–10, (1995).

B. Davari et al., "A Variable–Size Shallow Trench Isolation (STI) Technology With Diffused Sidewall Doping for Submicron CMOS," *International Electron Devices Meeting—IEDM Technical Digest*, pp. 92–95, (1988).

T, Yoshitomi et al., "Silicided Silicon–Sidewall Source and Drain ($S^4D$) Structure for High–Performance 75–nm Gate Length pMOSFETs," *VLSI Technology Conference, Kyoto, Japan—1995 Symposium on VLSI Technology Digest of Technical Papers*, pp. 11–12, (1995).

P. Lee et al., "Sub–Atmospheric Chemical Vapor Deposition (SACVD) of TEOS–Ozone USG and BPSG," *VMIC Conference*, pp. 396–398, (1990).

M. Saito et al., "P–MOSFET's With Ultra–Shallow Solid–Phase–Diffused Drain Structure Produced By Diffusion From BSG Gate–Sidewall," *IEEE Transactions on Electron Devices*, vol. 40, No. 12, pp. 2264–2272, (1993).

J. Gibbons et al., "Limited Reaction Processing: Silicon and III–V Materials," *Materials Research Society Symposium Proc.*, vol. 92, pp. 281–295, (1987).

METHODS AND APPARATUS FOR FORMING ULTRA-SHALLOW DOPED REGIONS USING DOPED SILICON OXIDE FILMS

CROSS-REFERENCE TO RELATED APPLICATIONS

This application is related to concurrently filed and commonly assigned patent application Ser. No. 08/749,283 (filed Nov. 13, 1996) entitled "HEATER/LIFT ASSEMBLY FOR HIGH TEMPERATURE PROCESSING CHAMBER," having Jonathan Frankel, Hari Ponnekanti, Inna Shmurun, and Visweswaren Sivaramakrishnan listed as co-inventors; and to concurrently filed and commonly assigned patent application Ser. No. 08/746,748 (filed Nov. 13, 1996) entitled "CHAMBER LINER FOR HIGH TEMPERATURE PROCESSING CHAMBER," having Jonathan Frankel and Visweswaren Sivaramakrishnan listed as co-inventors; and to concurrently filed and commonly assigned patent application Ser. No. 08/747,830 (filed Nov. 13, 1996) entitled "SUBSTRATE PROCESSING APPARATUS WITH BOTTOM-MOUNTED REMOTE PLASMA SYSTEM," having Gary Fong and Irwin Silvestre listed as co-inventors; and to concurrently filed and commonly assigned patent application Ser. No. 08/749,284 (filed Nov. 13, 1996) entitled "LIFT ASSEMBLY FOR HIGH TEMPERATURE PROCESSING CHAMBER," having Jonathan Frankel listed as inventor; and to concurrently filed and commonly assigned patent application Ser. No. 08/749,286 (filed Nov. 13, 1996) entitled "SYSTEMS AND METHODS FOR DETECTING END OF CHAMBER CLEAN IN A THERMAL (NON-PLASMA) PROCESS," having Visweswaren Sivaramakrishnan and Gary Fong listed as co-inventors; and to concurrently filed and commonly assigned patent application Ser. No. 08/749,925 (filed Nov. 13, 1996) entitled "LID ASSEMBLY FOR HIGH TEMPERATURE PROCESSING CHAMBER," having Jonathan Frankel, Inna Shmurun, Visweswaren Sivaramakrishnan, and Eugene Fukshanski listed as co-inventors; and to concurrently filed and commonly assigned patent application Ser. No. 08/748,095 (filed Nov. 13, 1996) entitled "METHODS AND APPARATUS FOR CLEANING SURFACES IN A SUBSTRATE PROCESSING SYSTEM," having Gary Fong, Li-Qun Xia, Srinivas Nemani, and Ellie Yieh listed as co-inventors; and to concurrently filed and commonly assigned patent application Ser. No. 08/747,892 (filed Nov. 13, 1996) entitled "METHODS AND APPARATUS FOR GETTERING FLUORINE FROM CHAMBER MATERIAL SURFACES," having Li-Qun Xia, Visweswaren Sivaramakrishnan, Srinivas Nemani, Ellie Yieh, and Gary Fong listed as co-inventors; and to concurrently filed and commonly assigned patent application Ser. No. 08/748,960 (filed Nov. 13, 1996) entitled "METHODS AND APPARATUS FOR DEPOSITING PREMETAL DIELECTRIC LAYER AT SUB-ATMOSPHERIC AND HIGH TEMPERATURE CONDITIONS," having Li-Qun Xia, Ellie Yieh, and Srinivas Nemani listed as co-inventors; and to concurrently filed and commonly assigned patent application Ser. No. 08/746,631 (filed Nov. 13, 1996) entitled "METHODS AND APPARATUS FOR SHALLOW TRENCH ISOLATION," having Ellie Yieh, Li-Qun Xia, and Srinivas Nemani listed as co-inventors; and to concurrently filed and commonly assigned patent application Ser. No. 08/746,657 (filed Nov. 13, 1996) entitled "SYSTEMS AND METHODS FOR CONTROLLING THE TEMPERATURE OF A VAPOR DEPOSITION APPARATUS," having Jonathan Frankel listed as inventor; and to concurrently filed and commonly assigned patent application Ser. No. 08/746,658 (filed Nov. 13, 1996) entitled "METHODS AND APPARATUS FOR PRE-STABILIZED PLASMA GENERATION FOR MICROWAVE CLEAN APPLICATIONS," having Gary Fong, Fong Chang, and Long Nguyen listed as co-inventors; and to concurrently filed and commonly assigned patent application Ser. No. 08/748,883 (filed Nov. 13, 1996) entitled "SYSTEMS AND METHODS FOR HIGH TEMPERATURE PROCESSING OF SEMICONDUCTOR WAFERS," having Visweswaren Sivaramakrishnan, Ellie Yieh, Jonathan Frankel, Li-Qun Xia, Gary Fong, Srinivas Nemani, Irwin Silvestre, Inna Shmurun, and Tin Levine listed as co-inventors. Each of the above referenced applications are assigned to Applied Materials Inc., the assignee of the present invention, and each of the above referenced applications are hereby incorporated by reference.

BACKGROUND OF THE INVENTION

The present invention relates to semiconductor processing. More specifically, the invention relates to a method and apparatus for forming dielectric films over high aspect ratio features at temperatures greater than about 500° C., with the dielectric films having low moisture content and low shrinkage. Embodiments of the present invention are particularly useful to deposit doped dielectric films, such as borophosphosilicate glass (BPSG) films, borosilicate glass (BSG) films, or phosphosilicate glass (PSG) films, and to form ultra-shallow doped regions used, for example, as source/drain junctions or as channel stop diffusions in shallow trench isolation. In addition, embodiments of the present invention may also be used to deposit doped dielectric films used as premetal dielectric (PMD) layers, intermetal dielectric (IMD) layers, or other dielectric layers. Further embodiments of the present invention may further be used to deposit undoped dielectric films, such as undoped silicate glass (USG) films used as shallow trench isolation filling oxides, insulating layers, capping layers, or other layers.

One of the primary steps in fabricating modern semiconductor devices is forming a dielectric layer on a semiconductor substrate. As is well known, such a dielectric layer can be deposited by chemical vapor deposition (CVD). In a conventional thermal CVD process, reactive gases are supplied to the substrate surface where heat-induced chemical reactions (homogeneous or heterogeneous) take place to produce a desired film. In a conventional plasma process, a controlled plasma is formed to decompose and/or energize reactive species to produce the desired film. In general, reaction rates in thermal and plasma processes may be controlled by controlling one or more of the following: temperature, pressure, and reactant gas flow rate.

Semiconductor device geometries have dramatically decreased in size since such devices were first introduced several decades ago. Since then, integrated circuits have generally followed the two-year/half-size rule (often called "Moore's Law") which means that the number of devices which will fit on a chip doubles every two years. Today's wafer fabrication plants are routinely producing 0.5 $\mu$m and even 0.35 $\mu$m feature size devices, and tomorrow's plants soon will be producing devices having even smaller feature sizes. As device feature sizes become smaller and integration density increases, issues not previously considered crucial by the industry are becoming of greater concern. In particular, devices with increasingly high integration density have features with high (for example, greater than about 3:1 or 4:1) aspect ratios. (Aspect ratio is defined as the height-to-spacing ratio of two adjacent steps.)

Increasingly stringent requirements for processes in fabricating these high integration devices are needed in order to produce high quality devices, and conventional substrate processing systems are becoming inadequate to meeting these requirements. One requirement is that the dielectric films formed in the process of fabricating such devices need to be uniformly deposited over these high aspect ratio features without leaving substantial gaps or voids. Another requirement is that these films need to exhibit low shrinkage so that subsequent heating and/or wet etching steps do not cause voids to open up in the deposited film. However, conventional substrate processing systems that typically deposit dielectric films at temperatures less than about 450° C. are unable to produce low moisture films having good gap-filling capabilities without opening substantial voids in subsequent heating and/or wet etching steps. As is well known, these gaps or voids may contribute to device performance unreliability and other problems. Dielectric films used, for example, as PMD or IMD layers in such devices need good high aspect ratio gap-fill capability to avoid problems caused by these gaps or voids. A further requirement is that metal contamination into the wafer during the processing steps be minimized to avoid short circuits and other problems in the devices. As is well known, conventional substrate processing systems using in situ plasma during processing experience physical sputtering of ions which attack chamber surfaces, such as aluminum walls, resulting in metal contamination of the substrate. Use of in situ plasma is therefore undesirable. An improved substrate processing system, which does not use in situ plasma, is needed to provide dielectric films with the desired characteristics of low moisture, high density, low shrinkage, good high aspect ratio gap-filling capability.

In addition to meeting these stringent requirements, substrate processing systems must be able to meet the higher demands for forming ultra-shallow doped regions, which are necessary for high integration devices with shrinking device geometries. With the advent of smaller device geometries, ultra-shallow doped regions in semiconductors are needed for various applications including, for example, source/drain junctions, channel stop diffusions for shallow trench isolation, etc. For example, MOS devices with channel lengths of less than 0.8 $\mu$m often require source/drain junctions having depths less than about 250 nanometers (nm) for adequate device performance. For transistors separated by trench isolation structures of about 0.35 $\mu$m depth, ultra-shallow channel stop regions having a depth on the order of hundreds of nm are usually required. For applications requiring ultra-shallow doped regions, it is important to provide uniform dopant distribution in the doped regions and good control of junction depth.

Current approaches to forming ultra-shallow doped regions, such as ion implantation and gaseous diffusion, are inadequate in some applications. With these current approaches, the ability to control dopant distribution and junction depth is limited, especially as the doped regions become shallower. With an approach like ion implantation, controlling dopant distribution is made difficult due to the built-up concentration of ions at the surface of the semiconductor material. Also, ion implantation causes damage to the semiconductor surface, and methods for repairing this substrate damage often make it more difficult to control dopant distribution and junction depth for ultra-shallow doped regions. For example, ions bombarded at relatively high energy levels have a tendency to tunnel or channel through the semiconductor material and cause damage such as point defects. These point defects, which may lead to irregular and nonuniform junction depths, may be fixed by annealing the implanted semiconductor material at high temperatures (greater than about 900° C.). Annealing the implanted semiconductor material, however, may further increase the junction depth beyond that desired. With an approach like gaseous diffusion, controlling dopant distribution and junction depth is difficult to control in forming ultra-shallow doped regions. As technology progresses to even smaller geometry devices, an alternative approach that is able to control the dopant uniformity and junction depth in ultra-shallow doped regions is needed.

In forming ultra-shallow doped regions, one alternative approach to the current approaches of ion implantation and gaseous diffusion is the use of a doped dielectric film as a dopant diffusion source. In this alternative approach, a doped dielectric film is deposited onto a substrate and used as a source of dopants which are diffused into the substrate to form ultra-shallow doped regions. For example, doped dielectric films are deposited at temperatures less than 500° C. in a deposition chamber, and subsequently heated at temperatures greater than 500° C. in a different chamber, such as an annealing furnace, to perform the dopant diffusion to form the doped region. Controlling thickness, uniformity, and moisture content of the doped dielectric film is important in efficiently forming ultra-shallow doped junctions in the semiconductor material. Specifically, controlling the thickness and uniformity of the deposited doped dielectric film provides some control over the amount of dopants available for diffusion. Limiting the thickness of doped dielectric films used as diffusion sources also helps to increase wafer throughput by saving deposition (and subsequent etching) time. Moreover, a uniformly deposited film with even dopant uniformity can provide a more controlled diffusion of dopants from the film into the substrate. As is well known, moisture in doped dielectric films reacts with dopants to bind them in a crystal structure, resulting in fewer dopants available for diffusion into the substrate to form doped regions. It is desirable to use doped dielectric films having a low moisture content, since these films have more dopants available for use in the diffusion.

Several problems are encountered with conventional substrate processing systems when using a doped dielectric film as a dopant diffusion source. One problem is that it is difficult to obtain a high degree of control over film thickness and uniformity when using conventional systems to deposit the doped dielectric film. Another problem is that it is often difficult to ensure that adequate amounts of dopants in the doped dielectric film are available for diffusion into the substrate to form the ultra-shallow doped regions. A further problem is the existence of native oxides, which act as a barrier layer preventing dopants from diffusing into the substrate from the doped dielectric film, on substrate surfaces where the ultra-shallow doped regions are to be formed. These problems are discussed in further detail below.

Despite the advantages of using doped dielectric films as dopant diffusion sources to form ultra-shallow doped regions, the problem of being unable to control thickness and uniformity of the deposited doped dielectric film when using conventional deposition systems is of particular concern for two primary reasons. First, the inability to adequately control thickness and uniformity of the deposited doped dielectric film using conventional methods and apparatus undesirably results in a diminished ability to control the dopant uniformity and junction depth of the ultra-shallow doped region formed. For example, in a conventional sequential CVD chamber, a substrate rests on a belt and travels through various portions of the chamber. In each portion of the chamber, a layer having a certain thickness may be deposited. Thickness of the deposited film may be controlled by changing the belt speed, which provides limited control. Further, control over the thickness and dopant uniformity of the films deposited on different wafers is difficult when attempting to control film thickness and dopant concentration using belt speed. That is, the thicknesses of the deposited films on different wafers may vary and be unpredictable, leading to wafer-to-wafer unreliability. Second, being able to control the thickness of the deposited doped dielectric film, even for very thin films, is desirable for overall efficiency and increased wafer throughput. However, conventional approaches have only been capable of forming doped dielectric films with thicknesses on the order of thousands of Angstroms (Å). Also, it may be difficult to maintain the thickness of the deposited film as thin as possible using systems relying on belt speed to control thickness of the deposited film. With thicker films deposited conventionally, some dopants may take longer to diffuse into the substrate, since they have greater distances to travel before reaching the semiconductor material. Also, removal of such a thick film used as a dopant diffusion source by etching or other technique often increases the total time to process the wafer. With growing pressures on manufacturers to improve efficiency, it is desirable to form the doped dielectric film as thin as possible in order to decrease the time needed to deposit and then remove the film. It is desirable to have a method and apparatus that can easily control the thickness and dopant uniformity of a doped dielectric film (less than about 500 Å thick at ±0.2 weight percentage dopant variation across the wafer) that is used as a dopant diffusion source.

Another problem with using doped dielectric films as dopant diffusion sources for ultra-shallow doped regions is that adequate amounts of dopants must be available for diffusion into the substrate. Films with high dopant concentration are often needed to provide adequate amounts of dopants for uniform diffusion into the substrate to form ultra-shallow junctions. However, moisture absorption and outgassing are two problems relating to adequate dopant availability. Doped dielectric films, especially those with high dopant concentrations, tend to absorb moisture shortly after a wafer is exposed to ambient moisture in a clean room (e.g. when the wafer is transferred from the deposition chamber after deposition of the doped dielectric film to a different processing chamber for the next processing step in a multiple-step process). The absorbed moisture ($H_2O$) then reacts with the dopants in the dielectric film, causing the film to crystallize. Due to the crystal structure binding the dopants within the film, these dopants become unavailable for diffusion into the substrate, even after a subsequent heating of the wafer by rapid thermal processing or annealing in another chamber. Moisture absorption thus reduces the amount of dopants for diffusion into the substrate. In addition to the moisture absorption problem, outgassing of dopants from the doped dielectric film also may occur in subsequent heating steps. These dopants diffuse out of the film away from the substrate, resulting in fewer dopants available to be diffused into the substrate to form ultra-shallow doped regions.

Even if adequate dopants are available for diffusion, the problem of native oxides remains an important consideration when using doped dielectric films as diffusion sources. Native oxides existing on the substrate surface where ultra-shallow doped regions are to be formed prevent effective and uniform dopant diffusion into the silicon. Therefore, native oxides, which act as a diffusion barrier layer to the dopants, need to be removed. Removing native oxides has been done using conventional techniques such as wet etching using liquid etchants, and dry etching using an in situ plasma. However, using liquid etchants is often difficult to control and may result in overetching the substrate. Substrates that have native oxides cleaned by conventional methods such as wet etching have shelf lives of less than about one week before native oxides begin to form again, making it desirable to process the wafers shortly after the native oxides have been removed. Using dry etching to remove native oxides with an in situ plasma results in plasma damage to the surface of the substrate. In addition to causing surface plasma damage, in situ plasma dry etching may undesirably result in more metal contamination, as discussed earlier. Accordingly, it is important to efficiently remove native oxides without damaging the substrate surface so dopants may diffuse into the substrate uniformly for ultra-shallow doped regions.

In addition to providing dense, low moisture dielectric films having uniform thickness and high aspect ratio gap-filling capability with low metal contamination, improved quality and overall efficiency in fabricating integrated circuit devices is also important. An important way to improve quality and overall efficiency in fabricating devices is to clean the chamber effectively and economically. With growing pressures on manufacturers to improve processing quality and overall efficiency, eliminating the total down-time in a multiple-step process without compromising the quality of the wafers has become increasingly important for saving both time and money. During CVD processing, reactive gases released inside the processing chamber form layers such as silicon oxides or nitrides on the surface of a substrate being processed. Undesirable oxide deposition occurs elsewhere in the CVD apparatus, such as in the area between the gas mixing box and gas distribution manifold. Undesired oxide residues also may be deposited in or around the exhaust channel and the walls of the processing chamber during such CVD processes. Over time, failure to clean the residue from the CVD apparatus often results in degraded, unreliable processes and defective substrates. Without frequent cleaning procedures, impurities from the residue built up in the CVD apparatus can migrate onto the substrate. The problem of impurities causing damage to the devices on the substrate is of particular concern with today's increasingly small device dimensions. Thus, CVD system maintenance is important for the smooth operation of substrate processing, as well as resulting in improved device yield and better product performance.

Frequently, periodic chamber cleanings between processing of every N wafers is needed to improve CVD system performance in producing high quality devices. Providing an efficient, non-damaging clean of the chamber and/or substrate is often able to enhance performance and quality of the devices produced. In addition to improving the quality of the above-discussed chamber cleanings (which are done without breaking the vacuum seal), preventive maintenance chamber cleanings (where the vacuum seal is broken by opening the chamber lid to physically wipe down the chamber) are performed between multiple periodic chamber cleanings. Often, performing the necessary preventive maintenance chamber cleanings involves opening the chamber lid and any other chamber parts that might obstruct the lid, which is a time-consuming procedure that interferes with normal production processing.

In light of the above, improved methods, systems and apparatus are needed for depositing dense, low moisture dielectric films with uniform thicknesses and high aspect ratio gap-filling capabilities. Optimally, these improved methods and apparatus will also provide a chamber clean with low metal contamination. Improved methods and apparatus are also needed for forming doped dielectric films as dopant diffusion sources for ultra-shallow junctions. These methods and apparatus should be capable of efficiently removing native oxides to ensure effective and uniform dopant diffusion from the doped dielectric layer without causing significant surface damage to the silicon wafer. Further, for some applications it is desirable to provide multiple deposition and cleaning capabilities in a single chamber with a simplified design to minimize the time consumed for different types of cleanings. What is needed, therefore, are systems and methods that are capable of high quality, efficient, high temperature deposition and efficient, gentle cleaning. In particular, these systems and methods should be designed to be compatible with processing requirements for forming devices with high aspect ratio features, and for forming ultra-shallow doped regions.

SUMMARY OF THE INVENTION

The present invention provides systems, methods and apparatus for high temperature (at least about 500–800° C.) processing of semiconductor wafers. Embodiments of the present invention include systems, methods and apparatus which enable multiple process steps to be performed in situ in the same chamber to reduce total processing time and to ensure high quality processing to produce high integration devices having high aspect ratio features. Performing multiple process steps in the same chamber also increases the control over process parameters, substantially reduces moisture content in deposited films, and minimizes device damage due to metal contamination or process residue contamination.

In particular, the present invention provides high temperature deposition, heating and efficient cleaning for forming dielectric films having relatively thin film thicknesses. Embodiments of the present invention are particularly useful to deposit doped dielectric films, such as borophosphosilicate glass (BPSG) films, borosilicate glass (BSG) films, or phosphosilicate glass (PSG) films, and to form an ultra-shallow doped region used, for example, as source/drain junctions or as channel stop diffusions in shallow trench isolation. In addition, embodiments of the present invention may also be used to deposit doped dielectric films used as premetal dielectric (PMD) layers, intermetal dielectric (IMD) layers, or other dielectric layers. Further embodiments of the present invention may further be used to deposit undoped dielectric films used as shallow trench isolation filling oxides, insulating layers, capping layers, or other layers.

Methods according to the present invention include depositing dielectric films by CVD on a substrate in a vacuum chamber having a pressure between about 10–760 torr, and heating the substrate to a temperature greater than about 500° C. The substrate may be heated for a variety of purposes, such as performing reflow of deposited dielectric layers for planarization, or for driving in dopants from a deposited doped dielectric layer. The process may be carried out in a single step (e.g., depositing and reflowing the film on the wafer at temperatures greater than 500° C.), or in multiple steps (e.g., depositing the film on the wafer at temperatures less than 500° C. and then heating the film on the wafer after the film has been deposited). In either case, high temperature processing is accomplished without removing the wafer from the vacuum chamber, which advantageously reduces moisture absorption in the dielectric film. The high temperature processing also enables in situ deposition of doped dielectric films with capping layers to advantageously reduce outgassing of dopants from the doped film and lower moisture content. In a specific embodiment, reactive gases are delivered to the substrate surface, where heat-induced chemical reactions take place to produce the dielectric film. Additionally or alternatively, a controlled plasma may be formed to facilitate the decomposition of the reactive species.

In an exemplary embodiment, the dielectric film is a thin doped film used as a dopant diffusion source for an ultra-shallow junction. The film is deposited at temperatures greater than about 500° C. onto the substrate and heated to higher temperatures, usually greater than 600° C. and preferably greater than about 700° C., to diffuse dopants from the dielectric layer to the underlying substrate. Performing the deposition and heating steps in the same chamber provides better control of the thickness, uniformity, and moisture content of the doped dielectric film. Improving the moisture content of the film increases the amounts of available dopants in the film, which is particularly advantageous for forming ultra-shallow junctions in high integration devices.

In another aspect of the invention, a remote plasma system is provided for etching undesired deposits on the inner walls of the vacuum chamber and components of the apparatus, and for cleaning native oxides and other residue from the semiconductor wafer prior to processing. A gentle cleaning technique using a remote energy source is preferably employed instead of a conventional in situ plasma process to lower metal contamination. For example, the remote plasma system provides a remote plasma and preferably fluorine radicals from the plasma are able to enter the chamber, which is at high temperatures, and provide a gentle, thermal cleaning of the chamber. With the remote plasma system, only chemical reactions are utilized and the problem of physical sputtering effects are eliminated. In contrast, with the use of an in situ plasma system, sputtering effects attack aluminum chamber walls, which may then lead to metal contamination in the processed wafer. In the thermal cleaning process using the remote plasma system, the radicals directed into the chamber can effectively clean unwanted deposits and residues from the surfaces in the chamber while the plasma remains remote or exterior to the chamber. Another advantage of the remote plasma system is that native oxides can be efficiently removed from the wafer to effectively ensure effective and uniform dopant diffusion from the doped dielectric layer without causing significant surface damage to the silicon wafer. A further advantage of the remote plasma system is that the system may also be configured for use to deposit films by using different input gases as needed.

In a preferred embodiment, the remote plasma cleaning system is a microwave plasma system configured to produce and deliver a select species (such as fluorine, chlorine or other radicals) to the processing chamber. The remote plasma system energizes gases by microwave radiation to create a plasma with etching radicals. Specifically, microwaves are created by a magnetron or other suitable energy source and directed through a waveguide system to an applicator tube, where a plasma is created. Reactive gases are then fed into the applicator tube and energized by the microwave energy, which sustains the ionization of the ignited plasma to produce a flow of radicals into the processing chamber. For cleaning, the radicals interact with residue formed on the chamber walls to form reactant gases that are suitably discharged form the chamber by an exhaust system. The microwave plasma system may also be adapted to deposit plasma enhanced CVD films by delivering deposition reactive gases into the processing chamber.

In another aspect of the invention, the remote plasma system includes an endpoint detection system for indicating when the chamber cleaning has concluded. The lack of plasma in the chamber can make it difficult, using conventional endpoint detection systems, to pinpoint the time at which the cleaning has been completed (i.e., when the last process gas residue in the chamber has reacted with the cleaning etchant so that it can be discharged from the chamber). This is because conventional endpoint detection systems typically rely on the use of a plasma within the chamber to check emissions from the in situ plasma to determine the end of the cleaning process. In the present invention, an endpoint detection assembly is coupled to the gas outlet of the processing chamber to determine the endpoint of the cleaning process by detecting changes in light intensity that occur due to absorbance of light by the exhausted clean gas reactants, such as $SiF_4$.

In yet another aspect of the present invention, a method provides gettering of any adsorbed clean gases, such as fluorine, from the surface of chamber walls. According to the present invention, a first cleaning gas containing fluorine is introduced into the processing chamber to clean the processing chamber of deposition residue. A second cleaning gas is then introduced into the processing chamber after the residue has been removed with the first cleaning gas. The second cleaning gas removes cleaning residue formed by the reaction between the first cleaning gas and the interior surfaces of the processing chamber. Removing or gettering the cleaning residue from the chamber provides a number of advantages. For example, in a preferred embodiment of the present invention, fluorine radicals are delivered into the processing chamber to remove residue, such as silicon oxide, by forming a silicon-fluoride gas product which is pumped away from chamber. After the fluorine-based chamber cleaning procedure, any adsorbed fluorine on the surface of the chamber walls which might otherwise interact with, or be incorporated into, the deposited film on the next wafer to be processed is gettered. In an alternative embodiment, the gettering may be performed by seasoning the chamber using microwave-generated atomic oxygen and a silicon source to deposit a thin film of oxide onto the chamber to trap any adsorbed fluorine and prevent contamination of the subsequently deposited films.

The present invention also provides various heat-resistant and process-compatible components for high temperature processing. The system of the present invention includes a vapor deposition apparatus having an enclosure assembly housing a processing chamber. The apparatus includes a heating assembly having a pedestal/heater for heating the wafer to temperatures up to about 500–800° C. The pedestal preferably comprises a material that is substantially resistant to reactions with the process gases and to deposition by the process gases at temperatures of at least about 400° C., and preferably at temperatures up to about 500–800° C. In addition, the pedestal preferably comprises a material that is substantially resistant to etching at high temperatures (i.e., 500–800° C.) by the fluorine radicals introduced into the chamber during cleaning. In an exemplary embodiment, the pedestal/heater comprises a resistive heating element imbedded in a ceramic material, such as aluminum oxide or preferably aluminum nitride.

The heating assembly of the present invention further includes a support shaft for supporting the pedestal/heater within the chamber and for housing the necessary electrical connections thereto. The support shaft preferably comprises a ceramic material that is diffusion-bonded to the pedestal/heater to provide a vacuum seal within the shaft. This vacuum seal allows the hollow interior of the shaft to be maintained at ambient temperature and pressure during high temperature processing, which protects the electrodes and other electrical connections from corrosion from the process and clean gases within the chamber. In addition, providing ambient pressure within the shaft minimizes arcing from the power source through the hollow core of the shaft to power leads or the outer walls of the shaft.

In still another aspect of the invention, a chamber liner is provided around the pedestal/heater to insulate the chamber walls from the heater. Preferably, the chamber liner includes an inner portion comprised of a material such as ceramic that is resistant to high temperatures and to deposition/clean reactions, and an outer portion comprised of a material resistant to cracking. The inner portion of the liner insulates the chamber walls to reduce the wafer edge cooling effects which might otherwise adversely affect deposited film uniformity. The outer portion of the chamber liner is substantially thicker than the inner portion to bridge the gap between the wafer and the walls, while minimizing cracking which might otherwise occur with a single, relatively thick ceramic liner. In an exemplary embodiment, the outer portion of the liner includes air gaps to increase the insulation provided by the liner.

In still a further aspect of the invention, a lid assembly is provided for the enclosure assembly. The lid assembly includes a gas mixing block (or box) coupled to one or more clean gas passages and one or more process gas passages for receiving process and clean gases and for delivering these gases into the chamber. One or more valves are provided on either the clean gas passages or the process gas passages to selectively allow gas to flow through to the gas mixing block. This embodiment facilitates the in situ cleaning method of the present invention by allowing the apparatus to quickly and efficiently switch between processing and cleaning, which increases the throughput of the system.

In an exemplary embodiment, the lid assembly further includes a base plate having a gas inlet for receiving one or more gases and a gas distribution plate including a plurality of holes for dispersing the gases into the processing chamber. The lid assembly includes one or more bypass passages in the base plate that offer less resistance to fluid flow than the gas distribution holes. During cleaning, for example, at least a portion of the cleaning gases will pass through the bypass passages directly into the chamber to increase the speed of the cleaning process, thereby decreasing the down time of the chamber. The apparatus preferably includes a control system, such as a valve and a controller, for partially or completely closing the bypass passages to control the gas flow through the gas distribution holes.

These and other embodiments of the present invention, as well as its advantages and features, are described in more detail in conjunction with the text below and attached figures.

DETAILED DESCRIPTION OF THE SPECIFIC EMBODIMENTS

I. CVD Reactor System

A. Overview of CVD Reactor

Figure 1A:
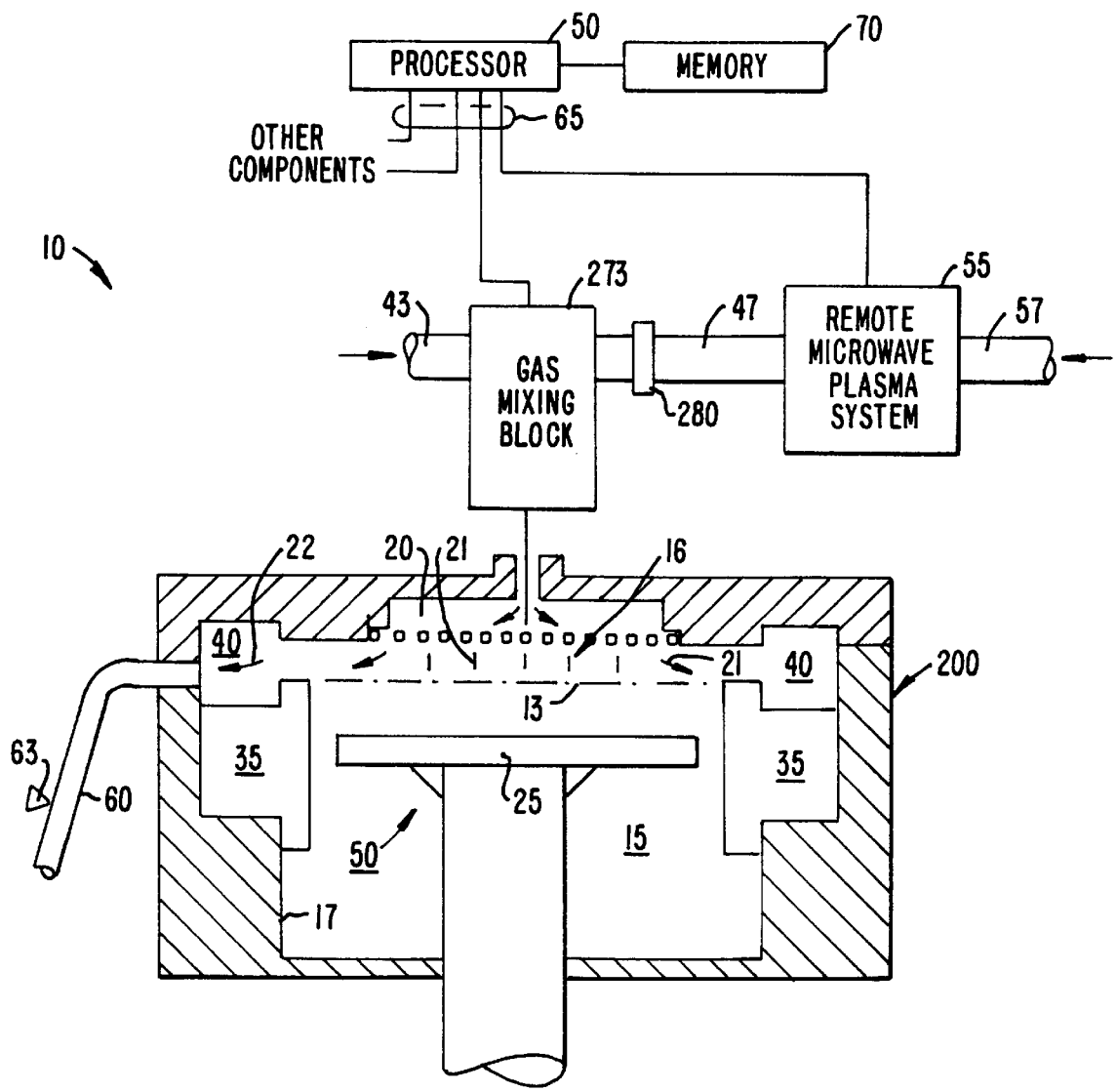
FIG. 1A is a vertical, cross-sectional view of a CVD apparatus according to the present invention.

Embodiments of the present invention are systems, methods and apparatus used for depositing dielectric films at temperatures greater than about 500° C. In particular, such systems, methods and apparatus may be used to deposit undoped dielectric films and doped dielectric films. Such films may be used to form ultra-shallow doped regions, premetal dielectric layers, intermetal dielectric layers, capping layers, oxide filling layers, or other layers. FIG. 1A is a vertical, cross-sectional view of one embodiment of a CVD apparatus 10 according to a specific embodiment. In addition to being capable of depositing dielectric layers, the apparatus according to the present invention has high temperature heating capabilities useful for performing reflow of deposited dielectric layers for planarization, or for driving in dopants from a deposited doped dielectric layer when forming ultra-shallow doped regions. Further, the apparatus can provide efficient cleaning of various CVD chamber components and cleaning of wafer surfaces. CVD apparatus 10 provides these multiple capabilities in situ in a single vacuum chamber 15. Accordingly, multiple process steps may be performed in a single chamber without having the wafer transferred out of that chamber into other external chambers. This results in a lower moisture content on the wafers by eliminating opportunities to absorb moisture from the ambient air and, advantageously increases the dopant retention in the deposited dielectric layer. In addition, performing multiple process steps in a single chamber saves time, which increases the overall throughput of the process.

Referring to FIG. 1A, CVD apparatus 10 includes an enclosure assembly 200 housing a vacuum chamber 15 with a gas reaction area 16. A gas distribution plate 20 is provided above the gas reaction area 16 for dispersing reactive gases through perforated holes in plate 20 to a wafer (not shown) that rests on a vertically movable heater 25 (also referred to as a wafer support pedestal or susceptor). CVD apparatus 10 further includes a heater/lift assembly 30 for heating the wafer supported on heater 25. Heater/lift assembly 30 also can be controllably moved between a lower loading/off-loading position and an upper processing position indicated by dotted line 13 which is closely adjacent to plate 20, as shown in FIG. 1A. A center board (not shown) includes sensors for providing information on the position of the wafer. As discussed in detail below, heater 25 includes resistively-heated components enclosed in a ceramic, preferably aluminum nitride. In an exemplary embodiment, all surfaces of heater 25 exposed to vacuum chamber 15 are made of a ceramic material, such as aluminum oxide ($Al_2O_3$ or alumina) or aluminum nitride. When heater 25 and the wafer are in processing position 13, they are surrounded by a chamber liner 35 along the inside walls 17 of apparatus 10 and by an annular pumping channel 40, formed by chamber liner 35 and a top portion of chamber 15. As discussed in detail below, the surface of chamber liner 35 preferably comprises a ceramic material, such as alumina or aluminum nitride, which serves to lower the temperature gradient between resistively-heated heater 25 (high temperature) and chamber walls 17, which are at a much lower temperature relative to heater 25.

Reactive and carrier gases are supplied through supply line 43 into a gas mixing box (or gas mixing block) 273 (FIG. 5), where they are preferably mixed together and delivered to plate 20. Gas mixing box 273 is preferably a dual input mixing block coupled to a process gas supply line 43 and to a cleaning gas conduit 47. As will be discussed in detail below, a processor 50 preferably controllably operates a gate valve 280 (FIG. 5) to choose which of these two alternate sources of gases are sent to plate 20 for dispersing into chamber 15. Conduit 47 receives gases from an integral remote microwave plasma system 55, which has an inlet 57 for receiving input gases. During deposition processing, gas supplied to plate 20 is vented toward the wafer surface (as indicated by arrows 21), where it may be uniformly distributed radially across the wafer surface, typically in a laminar flow. Purging gas may be delivered into chamber 15 from an inlet port or tube (not shown) through the bottom wall of enclosure assembly 200. The purging gas flows upward past heater 25 and to an annular pumping channel 40. An exhaust system then exhausts the gas (as indicated by arrows 22) into the annular pumping channel 40 and through an exhaust line 60 by a vacuum pump system (not shown). Exhaust gases and residues are preferably released from annular pumping channel 40 through exhaust line 60 at a rate controlled by a throttle valve system 63.

In the representative embodiment, the chemical vapor deposition process performed in CVD apparatus 10 is a thermal, sub-atmospheric pressure process, often referred to as sub-atmospheric CVD (SACVD). As discussed earlier, thermal CVD processes supply reactive gases to the substrate surface where heat-induced chemical reactions (homogeneous or heterogeneous) take place to produce a desired film. In CVD apparatus 10, heat is distributed by resistively-heated heater 25, as discussed in detail below, that is capable of reaching temperatures as high as about 400–800° C. Such heat distribution provides uniform, rapid thermal heating of the wafer for effecting deposition, reflow and/or drive-in, cleaning, and/or seasoning/gettering steps in a multiple-step process in situ in chamber 15. Alternatively, a controlled plasma may be formed adjacent to the wafer by RF energy applied to gas distribution plate 20 from an RF power supply (not shown). In embodiments additionally having a lower RF electrode, the RF power supply can supply either single frequency RF power to plate 20 or mixed frequency RF power to plate 20 and the lower RF electrode to enhance the decomposition of reactive species introduced into process chamber 15. In a plasma process, some of the components of vapor deposition apparatus 10 would have to be modified to accommodate the RF energy, as discussed below.

Remote microwave plasma system 55 integrally provided in CVD apparatus 10 is preferably adapted for performing periodic cleaning of undesired deposition residue from various components of chamber 15, including walls 17 as well as other components. Further, remote microwave plasma system 55 can also perform cleaning or etching of native oxides or residues from the surface of the wafer, depending on the desired application. Although gases input via line 57 into plasma system 55 are reactive cleaning gases for creating a plasma to provide fluorine, chlorine, or other radicals, remote microwave plasma system 55 also may be adapted to deposit plasma enhanced CVD films by inputting deposition reactive gases into system 55 via input line 57. Generally, remote microwave plasma system 55 receives gases via input line 57, which are energized by microwave radiation to create a plasma with etching radicals which are then sent via conduit 47 for dispersion through plate 20 to chamber 15. Specific details of plasma system 55 will be discussed further below. Some embodiments of apparatus 10 may also include a radio frequency (RF) plasma system to provide in situ plasma capability.

Motors and optical sensors (not shown) are used to move and determine the position of movable mechanical assemblies such as throttle valve system 63 and heater 25. The heater/lift assembly 30, motors, gate valve 280, throttle valve system 63, remote microwave plasma system 55, and other system components are controlled by processor 50 over control lines 65, of which only some are shown.

Processor 50 controls all of the activities of the CVD machine. Acting as the system controller, processor 50 executes system control software, which is a computer program stored in a memory 70 coupled to processor 50. Preferably, memory 70 may be a hard disk drive, but of course memory 70 may be other kinds of memory. In addition to a hard disk drive (e.g., memory 70), CVD apparatus 10 in a preferred embodiment includes a floppy disk drive and a card rack. Processor 50 operates under the control of the system control software, which includes sets of instructions that dictate the timing, mixture of gases, chamber pressure, chamber temperature, microwave power levels, susceptor position, and other parameters of a particular process. Other computer programs such as those stored on other memory including, for example, a floppy disk or other computer program product inserted in a disk drive or other appropriate drive, may also be used to operate processor 50. System control software will be discussed in detail below. The card rack contains a single-board computer, analog and digital input/output boards, interface boards and stepper motor controller boards. Various parts of CVD apparatus 10 conform to the Versa Modular European (VME) standard which defines board, card cage, and connector dimensions and types. The VME standard also defines the bus structure having a 16-bit data bus and 24-bit address bus.

Figure 1B:
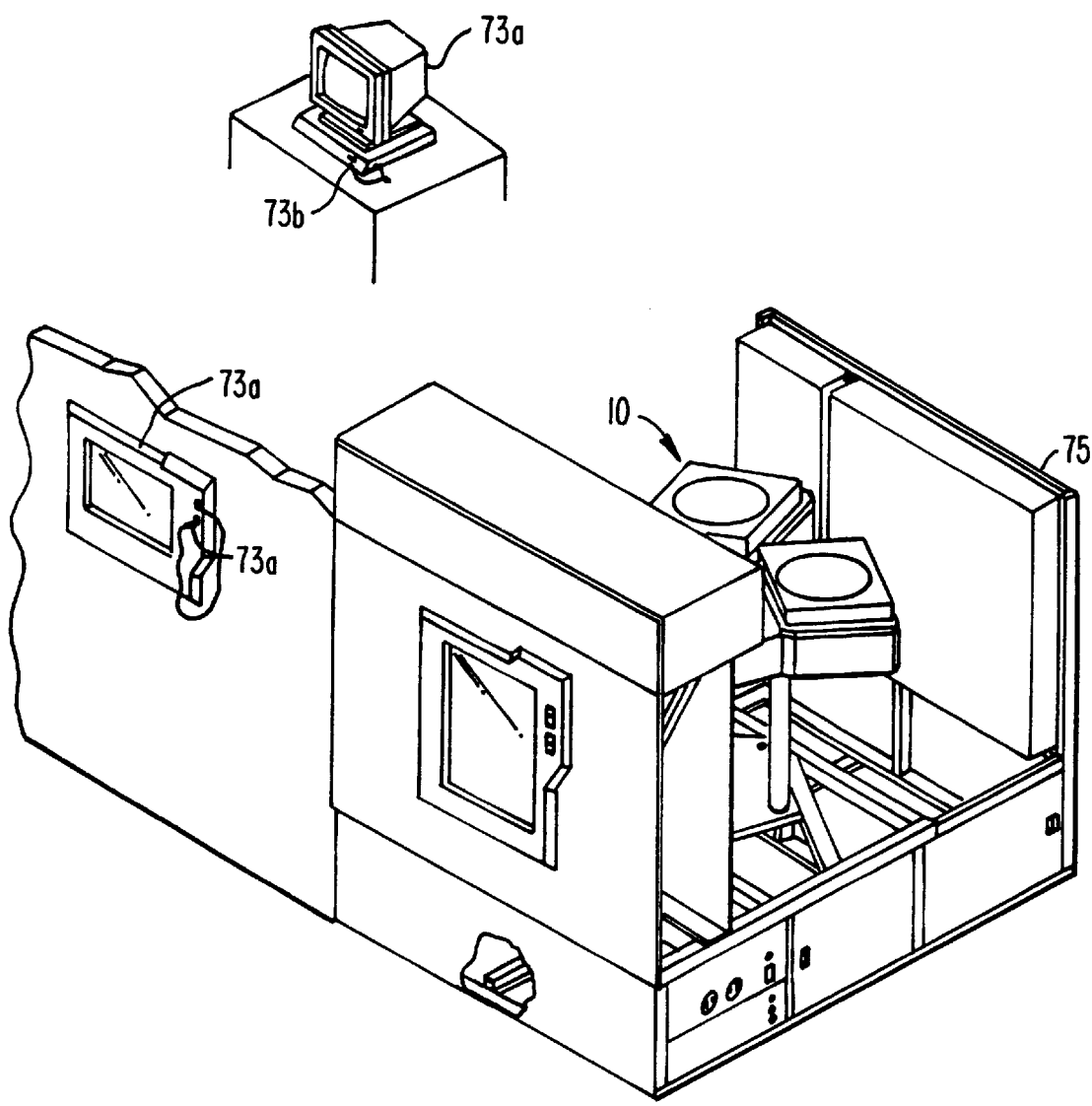
FIG. 1B is a simplified diagram of the system monitor and CVD apparatus 10 in a multichamber system.

The interface between a user and processor 50 is via a CRT monitor 73a and light pen 73b, shown in FIG. 1B which is a simplified diagram of the system monitor and CVD apparatus 10, illustrated as one of the chambers in a multichamber system. CVD apparatus 10 is preferably attached to a mainframe unit 75 which contains and provides electrical, plumbing and other support functions for the apparatus 10. Exemplary mainframe units compatible with the illustrative embodiment of CVD apparatus 10 are currently commercially available as the Precision 5000™ and the Centura 5200™ systems from Applied Materials, Inc. of Santa Clara, Calif. The multichamber system has the capability to transfer a wafer between its chambers without breaking the vacuum and without having to expose the wafer to moisture or other contaminants outside the multichamber system. An advantage of the multichamber system is that different chambers in the multichamber system may be used for different purposes in the entire process. For example, one chamber may be used for deposition of oxides, another may be used for rapid thermal processing, and yet another may be used for oxide cleaning. The process may proceed uninterrupted within the multichamber system, thereby preventing contamination of wafers that often occurs when transferring wafers between various separate individual chambers (not in a multichamber system) for different parts of a process.

In the preferred embodiment two monitors 73a are used, one mounted in the clean room wall for the operators and the other behind the wall for the service technicians. Both monitors 73a simultaneously display the same information, but only one light pen 73b is enabled. The light pen 73b detects light emitted by CRT display with a light sensor in the tip of the pen. To select a particular screen or function, the operator touches a designated area of the display screen and pushes the button on the pen 73b. The touched area changes its highlighted color, or a new menu or screen is displayed, confirming communication between the light pen and the display screen. Of course, other devices, such as a keyboard, mouse, or other pointing or communication device, may be used instead of or in addition to light pen 73b to allow the user to communicate with processor 50.

Figure 1C:
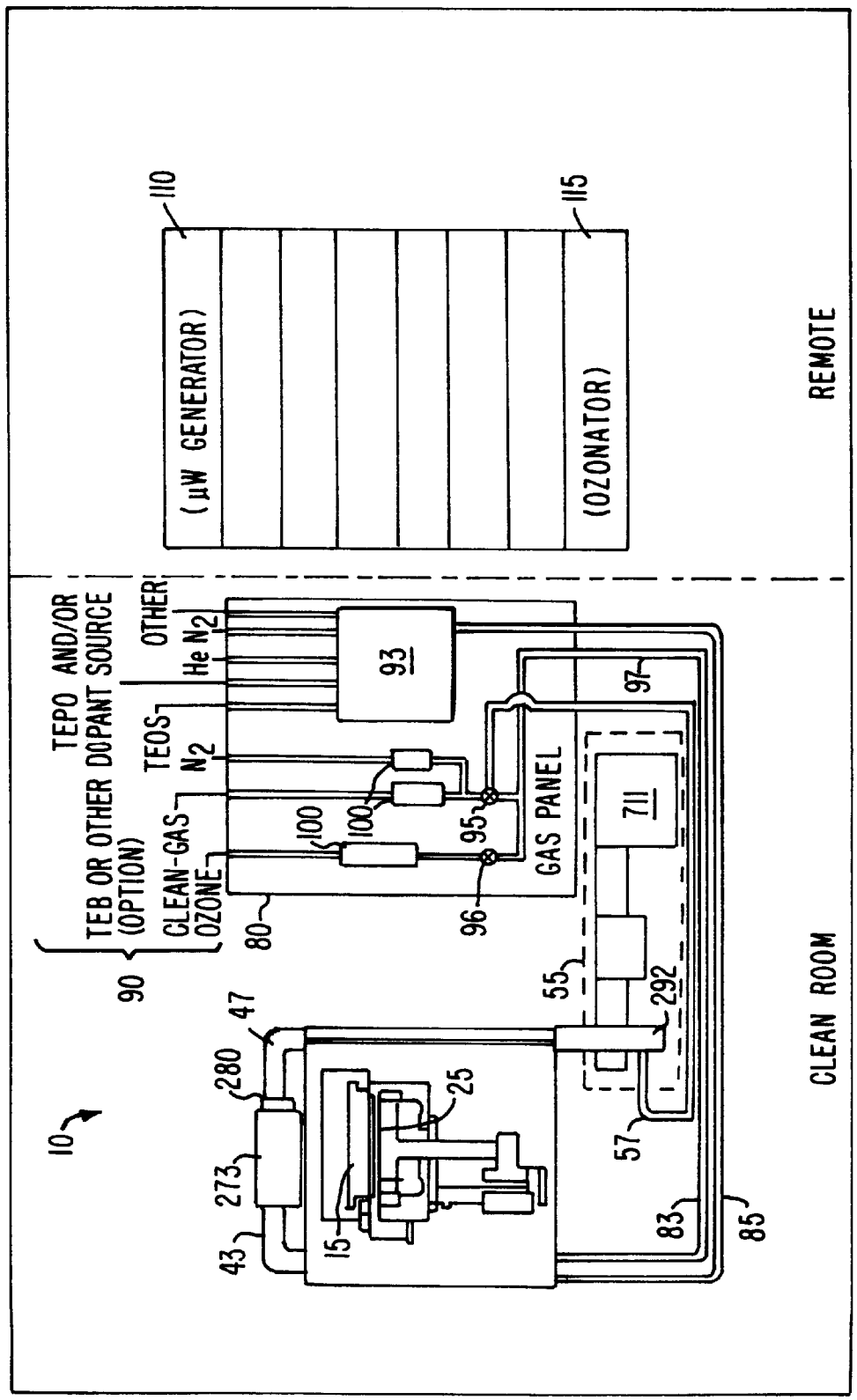
FIG. 1C illustrates a general overview of CVD apparatus 10 in relation to a gas supply panel 80 located in a clean room.

FIG. 1C illustrates a general overview of CVD apparatus 10 in relation to a gas supply panel 80 located in a clean room. As discussed above, CVD apparatus 10 includes chamber 15 with heater 25, gas mixing box 273 with inputs from supply line 43 and conduit 47, and remote microwave plasma system 55 with input line 57. As mentioned above, gas mixing box 273 is for mixing and injecting deposition gas(es) and clean gas(es) or other gas(es) through inlet tube 43 to the processing chamber 15. As seen in FIG. 1C, remote microwave plasma system 55 is integrally located and mounted below chamber 15 with conduit 47 coming up alongside chamber 15 to gate valve 280 and gas mixing box 273, located above chamber 15. Similarly, gas supply line 43, which comes up alongside chamber 15 to gas mixing box 273, is provided with reactive gases via lines 83 and 85 from gas supply panel 80. Gas supply panel 80 includes lines to gas or liquid supply sources 90, containing gases or liquids that may vary depending on the desired processes used for a particular application. Gas supply panel 80 has a mixing system 93 which receives the deposition process and carrier gases (or vaporized liquids) from sources 90 for mixing and sending to gas mixing box 273 via line 85 to supply line 43. Generally, supply lines for each of the process gases include (i) shut-off valves 95 that can be used to automatically or manually shut off the flow of process gas into line 85 or line 57, and (ii) mass flow controllers 100 that measure the flow of gas or liquid through the supply lines. When toxic gases (for example, ozone and the clean gas) are used in the process, the several shut-off valves 95 may be positioned on each gas supply line in conventional configurations. The rate at which the deposition and carrier gases including, for example, tetraethylorthosilane (TEOS), helium (He), and nitrogen ($N_2$), and optionally triethylphosphate (TEPO), triethylborate (TEB), and/or other dopant sources, are supplied to gas mixing system 93 is also controlled by liquid or gas mass flow controllers (MFCs) (not shown) and/or by valves (not shown). In some embodiments, gas mixing system 93 includes a liquid injection system for vaporizing reactant liquids such as TEOS and TEPO. According to these embodiments, a mixture including TEPO as the phosphorus source, TEOS as the silicon source, and one or more gaseous oxygen sources, such as oxygen ($O_2$) or ozone ($O_3$), may be formed with gas mixing system 93. The TEPO and TEOS are all liquid sources that also may be vaporized by conventional boiler-type or bubbler-type hot boxes in other embodiments. A liquid injection system is preferred as it provides greater control of the volume of reactant liquid introduced into the gas mixing system. The vaporized gases are then mixed in the gas mixing system with a carrier gas, such as helium, before being delivered to heated line 85. Of course, it is recognized that other sources of dopants, silicon, and oxygen also may be used.

Additionally, gas supply panel 80 includes switching valve 95, which under the control of processor 50, can selectively send the clean gas with $N_2$ along process gas line 83 to gas supply line 43 or along clean gas line 57 to remote microwave plasma system 55. When processor 50 causes switching valve 95 to send the clean gas with $N_2$ via input line 57 to plasma system 55, a plasma remote from chamber 15 is formed due to application of microwave energy and cleaning radicals are produced for transfer to gas conduit 47. Processor 50 can also cause another valve 96 to send ozone through line 83 to gas supply line 43 and to send the deposition and carrier gases from gas mixing system 93 through heated line 85 to gas supply line 43. In alternative embodiments, valve 95 is connected at its output only to line 97 and selectively allows clean gas and $N_2$ to pass through line 97 to a switching valve 105 (not shown). Located at a point close to inlet 57 and remote system 55, switching valve 105 in these embodiments would be connected to inlet 57 to remote microwave system 55 and also to line 83 leading to inlet 43. In specific embodiments, gate valve 280 may be controlled by processor 50, with instructions from the system software computer program, to select either the clean gases or the deposition gases to flow into chamber 15.

Located remote from the clean room where chamber 15 of apparatus 10 is located are a microwave power supply 110 and ozonator 115. Power supply 110 provides power to the magnetron in remote plasma system 55. Ozonator 115, applies power to oxygen ($O_2$) which is used as input to provide ozone ($O_3$) as output for use as at least one of the sources 90. In other embodiments, power supply 110 and ozonator 115 may be located in the clean room rather than being remotely located. Further, in multichamber systems requiring multiple ozone sources and/or multiple remote microwave plasma systems 55, multiple ozonators 115 and multiple power supplies 110 may be provided.

The processes for depositing the film, performing a clean, and performing reflow or drive-in steps can be implemented using a computer program product that is executed by processor 50. The computer program code can be written in any conventional computer readable programming language such as, for example, 68000 assembly language, C, C++, Pascal, Fortran, or other language. Suitable program code is entered into a single file, or multiple files, using a conventional text editor and is stored or embodied in a computerusable medium, such as a memory system of the computer. If the entered code text is in a high-level language, the code is compiled, and the resultant compiler code is then linked with an object code of precompiled Windows library routines. To execute the linked compiled object code, the system user invokes the object code, causing the computer system to load the code in memory, from which the CPU reads and executes the code to perform the tasks identified in the program.

Figure 1D:
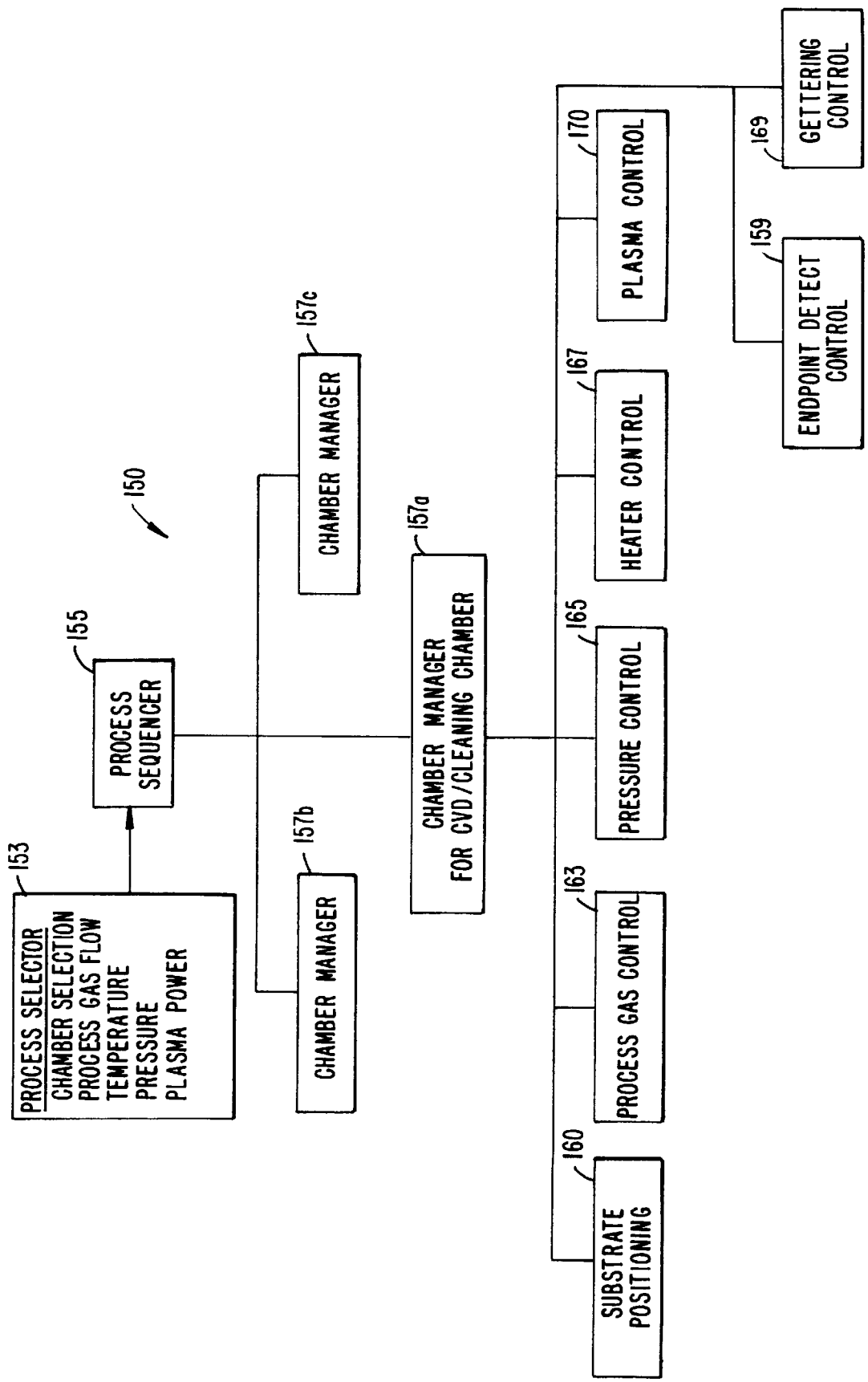
FIG. 1D is an illustrative block diagram of the hierarchical control structure of the system control software, computer program 150, according to a specific embodiment.

FIG. 1D is an illustrative block diagram of the hierarchical control structure of the system control software, computer program 150, according to a specific embodiment. Using a light pen interface, a user enters a process set number and process chamber number into a process selector subroutine 153 in response to menus or screens displayed on the CRT monitor. The process sets, which are predetermined sets of process parameters necessary to carry out specified processes, are identified by predefined set numbers. Process selector subroutine 153 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as magnetron power levels (and alternatively to or in addition to high- and low-frequency RF power levels and the low-frequency RF frequency, for embodiments equipped with RF plasma systems), cooling gas pressure, and chamber wall temperature. Process selector subroutine 153 controls what type of process (deposition, wafer cleaning, chamber cleaning, chamber gettering, reflowing) is performed at a certain time in chamber 15. In some embodiments, there may be more than one process selector subroutine. The process parameters are provided to the user in the form of a recipe and may be entered utilizing the light pen/CRT monitor interface.

The signals for monitoring the process are provided by the analog input board and digital input board of the system controller, and the signals for controlling the process are output on the analog output board and digital output board of CVD system 10.

A process sequencer subroutine 155 comprises program code for accepting the identified process chamber and set of process parameters from process selector subroutine 153, and for controlling operation of the various process chambers. Multiple users can enter process set numbers and process chamber numbers, or a single user can enter multiple process set numbers and process chamber numbers, so sequencer subroutine 155 operates to schedule the selected processes in the desired sequence. Preferably, sequencer subroutine 155 includes program code to perform the steps of (i) monitoring the operation of the process chambers to determine if the chambers are being used, (ii) determining what processes are being carried out in the chambers being used, and (iii) executing the desired process based on availability of a process chamber and the type of process to be carried out. Conventional methods of monitoring the process chambers can be used, such as polling. When scheduling which process is to be executed, sequencer subroutine 155 can be designed to take into consideration the present condition of the process chamber being used in comparison with the desired process conditions for a selected process, or the "age" of each particular user-entered request, or any other relevant factor a system programmer desires to include for determining scheduling priorities.

Once sequencer subroutine 155 determines which process chamber and process set combination is going to be executed next, the sequencer subroutine 155 initiates execution of the process set by passing the particular process set parameters to a chamber manager subroutine 157a–c which controls multiple processing tasks in a process chamber 15 according to the process set determined by sequencer subroutine 155. For example, the chamber manager subroutine 157 a comprises program code for controlling CVD and cleaning process operations in process chamber 15. Chamber manager subroutine 157 also controls execution of various chamber component subroutines which control operation of the chamber components necessary to carry out the selected process set. Examples of chamber component subroutines are substrate positioning subroutine 160, process gas control subroutine 163, pressure control subroutine 165, heater control subroutine 167, plasma control subroutine 170, endpoint detect control subroutine 159, and gettering control subroutine 169. Depending on the specific configuration of the CVD chamber, some embodiments include all of the above subroutines, while other embodiments may include only some of the subroutines. Those having ordinary skill in the art would readily recognize that other chamber control subroutines can be included depending on what processes are to be performed in process chamber 15. In operation, chamber manager subroutine 157a selectively schedules or calls the process component subroutines in accordance with the particular process set being executed. Chamber manager subroutine 157a schedules the process component subroutines much like sequencer subroutine 155 schedules which process chamber 15 and process set are to be executed next. Typically, chamber manager subroutine 157a includes steps of monitoring the various chamber components, determining which components need to be operated based on the process parameters for the process set to be executed, and initiating execution of a chamber component subroutine responsive to the monitoring and determining steps.

Operation of particular chamber component subroutines will now be described with reference to FIG. 1D. Substrate positioning subroutine 160 comprises program code for controlling chamber components that are used to load the substrate onto heater 25 and, optionally, to lift the substrate to a desired height in chamber 15 to control the spacing between the substrate and gas distribution manifold 20. When a substrate is loaded into process chamber 15, heater 25 is lowered to receive the substrate and then heater 25 is raised to the desired height. In operation, substrate positioning subroutine 160 controls movement of heater 25 in response to process set parameters related to the support height that are transferred from chamber manager subroutine 157a.

Process gas control subroutine 163 has program code for controlling process gas composition and flow rates. Process gas control subroutine 163 controls the open/close position of the safety shut-off valves, and also ramps up/down the mass flow controllers to obtain the desired gas flow rate. Process gas control subroutine 163 is invoked by the chamber manager subroutine 157a, as are all chamber component subroutines, and receives subroutine process parameters related to the desired gas flow rates from the chamber manager. Typically, process gas control subroutine 163 operates by opening the gas supply lines and repeatedly (i) reading the necessary mass flow controllers, (ii) comparing the readings to the desired flow rates received from chamber manager subroutine 157a, and (iii) adjusting the flow rates of the gas supply lines as necessary. Furthermore, process gas control subroutine 163 includes steps for monitoring the gas flow rates for unsafe rates, and activating the safety shut-off valves when an unsafe condition is detected. Process gas control subroutine 163 also controls the gas composition and flow rates for clean gases as well as for deposition gases, depending on the desired process (clean or deposition or other) that is selected. Alternative embodiments could have more than one process gas control subroutine 613, each subroutine 613 controlling a specific type of process or specific sets of gas lines.

In some processes, an inert gas such as nitrogen or argon is flowed into chamber 15 to stabilize the pressure in the chamber before reactive process gases are introduced. For these processes, process gas control subroutine 163 is programmed to include steps for flowing the inert gas into chamber 15 for an amount of time necessary to stabilize the pressure in the chamber, and then the steps described above would be carried out. Additionally, when a process gas is to be vaporized from a liquid precursor, for example TEOS, process gas control subroutine 163 would be written to include steps for bubbling a delivery gas such as helium through the liquid precursor in a bubbler assembly, or introducing a carrier gas such as helium to a liquid injection system. When a bubbler is used for this type of process, process gas control subroutine 163 regulates the flow of the delivery gas, the pressure in the bubbler, and the bubbler temperature in order to obtain the desired process gas flow rates. As discussed above, the desired process gas flow rates are transferred to process gas control subroutine 163 as process parameters. Furthermore, process gas control subroutine 163 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 165 comprises program code for controlling the pressure in the chamber 15 by regulating the aperture size of the throttle valve in the exhaust system of the chamber. The aperture size of the throttle valve is set to control the chamber pressure at a desired level in relation to the total process gas flow, the size of the process chamber, and the pumping set-point pressure for the exhaust system. When pressure control subroutine 165 is invoked, the desired or target pressure level is received as a parameter from chamber manager subroutine 157a. The pressure control subroutine 165 measures the pressure in chamber 15 by reading one or more conventional pressure nanometers connected to the chamber, compares the measure value(s) to the target pressure, obtains PID (proportional, integral, and differential) values corresponding to the target pressure from a stored pressure table, and adjusts the throttle valve according to the PID values obtained from the pressure table. Alternatively, pressure control subroutine 165 can be written to open or close the throttle valve to a particular aperture size to regulate the pressure in chamber 15 to the desired level.

Figure 1E:
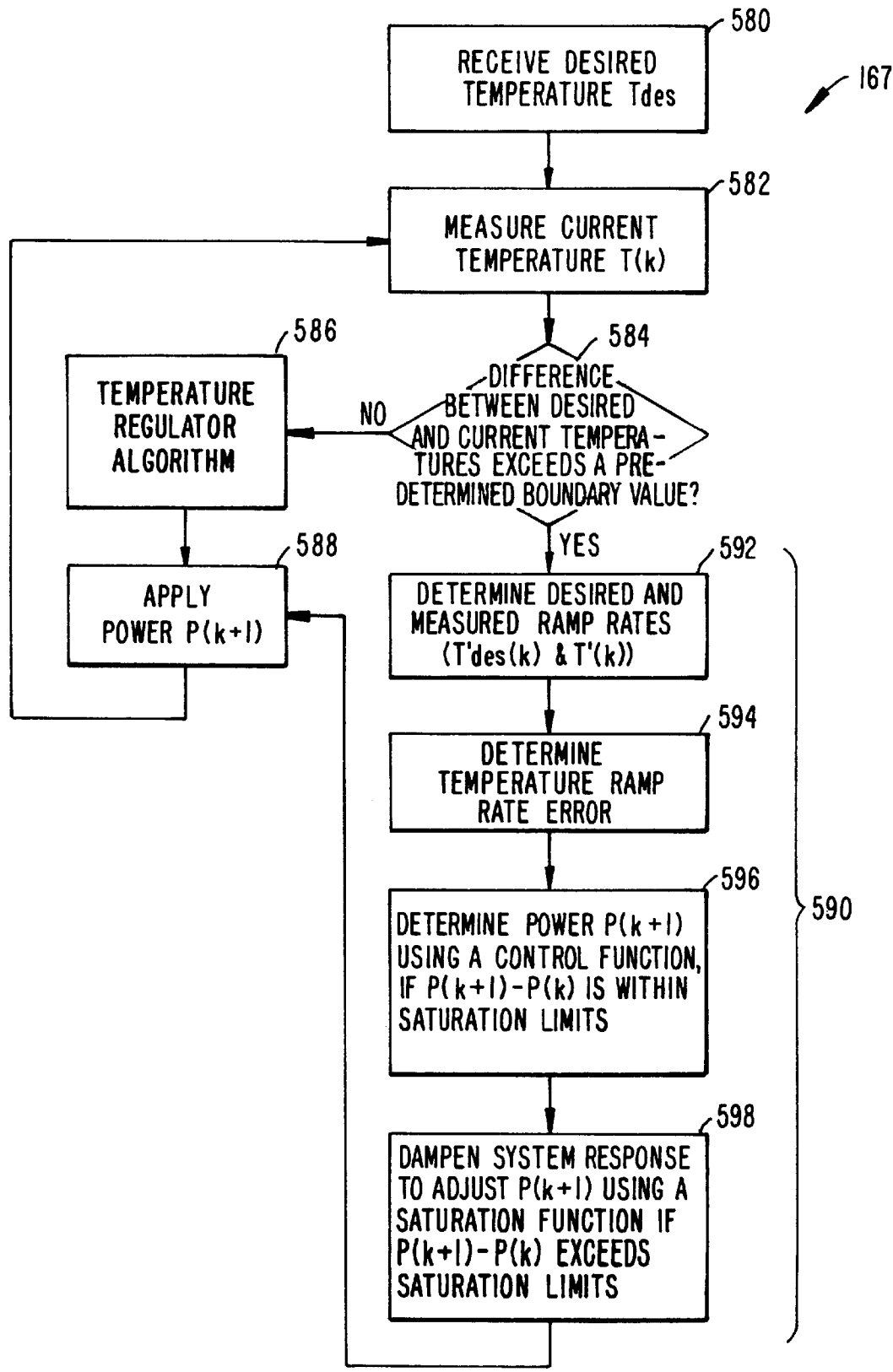
FIG. 1E is a block diagram of an exemplary heater control subroutine.

Heater control subroutine 167 comprises program code for controlling the temperature of a heater element 473 used to resistively heat heater 25 (and any substrate thereon). Referring to FIG. 1E, heater control subroutine 167, which is also invoked by chamber manager subroutine 157a, receives a desired target/set-point temperature parameter, $T_{des}$, as an input (step 580). In step 582, heater control subroutine 167 measures the current temperature of heater 25 by measuring voltage output of a thermocouple located in heater 25. The current temperature is denoted T(k), where k is the current time step of heater control subroutine 167. The controller obtains the temperature T(k) from the thermocouple voltage by looking up the corresponding temperature in a stored conversion table or by calculating the temperature using a fourth-order polynomial. In an exemplary embodiment, heater control subroutine 167 in step 584 calculates the temperature error. The temperature error, denoted $Err_{temp}$, is determined by the equation $Err_{temp}(k)= T_{des}-T(k)$.

In step 584, heater control subroutine 167 will select one of two control algorithms based on the absolute value of $Err_{temp}(k)$. If the absolute value of the temperature error is smaller than a predetermined boundary error, the heater control subroutine will select a temperature regulator algorithm (steps 586 and 588). This algorithm precisely controls the temperature at the desired temperature, $T_{des}$. If the absolute value of the temperature error is greater than the boundary error, heater control subroutine 167 will select a temperature ramp control algorithm (step 590). This algorithm controls the rate at which the heater temperature will approach the desired temperature, $T_{des}$, i.e., it controls the rate at which the temperature changes.

The temperature regulator algorithm (steps 586 and 588) uses feedback and feedforward control to update the power delivered to the heating element embedded in heater 25 so as to maintain the current temperature, T(k), as close to $T_{des}$ as possible. The feedforward control in this algorithm estimates the amount of power necessary to maintain the desired temperature given the amount and type of gas flow and RF power supplied to the chamber. The feedback control uses standard Proportional-Integral-Derivative (PID) control terms to adjust the estimated feedforward power based on the dynamic behavior of the temperature error, $Err_{temp}(k)$. PID control is the type of algorithm used in conventional heater control systems without regard to the value of the temperature error. If these routines seek to control the temperature ramp rate, they will define a time-varying $T_{des}(k)$ and then employ the PID controller described above to track this desired temperature trajectory.

In the present invention, heater control subroutine 167 preferably employs the temperature ramp control algorithm (steps 590) to control power to heater 25 when the absolute value of temperature error is greater than the boundary error. This algorithm controls T'(k), which is the rate of change of the temperature, T(k), at time step k. The rate of change of temperature should be controlled because the heater 25 can be made of a ceramic material, which may fracture from thermal shock if the temperature changes too quickly. The ramp control algorithm uses feedforward and Proportional feedback control to control T'(k) to a predetermined desired ramp rate function, $T'_{des}(T)$. The desired ramp rate is mainly a function of the temperature of the heater and is based on the thermal shock resistance of the heater 25 at various temperatures. Thus, the desired ramp rate may continuously change based on the current measured temperature of the heater, or it may be set at a constant based on a minimum rate that is low enough to avoid thermal shock within the range of temperatures of a particular process. The control algorithm also employs a saturation function on the rate of change of power supplied to the heater to damp the system response, which reduces oscillations in ramp rate.

Controllers that attempt to regulate ramp rate by tracking a timed temperature trajectory at best can only guarantee that a desired temperature, $T_{des}(K)$, will be achieved at some time K in the future. The average ramp rate over the time interval of length K will be $T'_{des}$. However, the instantaneous rate of change of temperature T'(k) may vary widely during that interval. Consider the case in which a disturbance causes the temperature to remain stable for some interval of time less than K. The controller will then attempt to as quickly as possible "catch up" to the desired trajectory $T_{des}(k)$. The ramp rate for the time interval during which the controller is catching up will be greater than $T'_{des}$. That scenario could result in thermal shock fracture. By controlling the ramp rate directly, the current invention avoids this potential scenario.

Referring to FIG. 1E, an exemplary ramp control algorithm will now be described. After the desired temperature, $T_{des}$ is input (step 580), the current temperature $T(k)$ is measured (step 582), and the temperature error is determined (step 584), the ramp control algorithm calculates the actual ramp rate $T'(k)$ using a numerical differentiation technique. It also determines the desired ramp rate, $T'_{des}(T(k))$, based on the current value of $T(k)$, and the error in ramp rate, $Err_{rrate}=T'_{des}(T(k))-T'(k)$ (steps 592 and 594). The actual ramp rate $T'(k)$ is calculated from measured temperature $T(k)$ over a range of temperature measurement samples. In general, $T'_{des}(T(k))$ may be any continuous function of temperature in various embodiments. In the specific embodiment, $T'_{des}(T(k))$ is set to be a predetermined constant value. The calculated ramp rate $T'(k)$ is determined by sampling (i.e., measuring) the temperature at a predetermined sample rate (e.g., 10 times in a power update period, 1 second, in the specific embodiment). Then, an average of the 10 samples is calculated and compared to the average of the previous 10 samples. The difference between the averages of the first 10 measured temperatures and the previous 10 measured temperatures is then divided by the power update period to obtain an average measured temperature. The derivative of the average measured temperature is then calculated to arrive at the calculated ramp rate $T'(k)$. The ramp rate error $Err_{RRate}$ may then determined by taking the difference between the constant-valued $T'_{des}(T(k))$ and the calculated ramp rate $T'(k)$ in the specific embodiment (step 594). The above embodiment is an example of one numerical differentiation technique that may be used, but other techniques that may be more sophisticated also can be used in other embodiments. In other embodiments, other sample rates also may be used.

To elaborate on step 596, an exemplary control function used in the specific embodiment is given by the following equation:

$$P(k+1)=P_{model}[T(k),T'_{des}(T(k))]+K_p*[T'_{des}(T(k))-T'(k)]$$

where k is the current time step and k+1 is the next time step. $P(k+1)$ is the power that will be supplied to the heater at the next time step. $P_{model}[T(k), T'_{des}(T(k))]$, which is a function of the desired ramp rate and measured temperature, is some modeled approximation of the necessary power to give a ramp rate of $T'_{des}(T(k))$ at a temperature $T(k)$. $K_p$ is a control gain constant (in Watts/(° C./second)) that is user-defined and multiplied with the ramp rate error $Err_{RRate}$. In the specific embodiment, $P_{model}[T(k),T'_{des}(T(k))]$ can be approximated as $P(k)$. This approximation is particularly true for slow systems such as the resistive heater with large thermal mass of the present invention. The control function is then approximated by the following equations:

$$P(k+1)=P(k)+K_p*[T'_{des}(T(k))-T'(k)]$$

$$P(k+1)-P(k)=K_p*[T'_{des}(T(k))-T'(k)].$$

Because the response of the heater is slow, there is a lag between the time power is adjusted and the time when the adjustment produces the desired result. For example, if the temperature of the heater is stable and the desired ramp rate is positive, the control will increase power to the heater. The temperature will not, however, immediately rise according to the desired ramp rate. The control will then at the next time step further increase power. It will continue to increase power until the desired ramp rate is met. By that time, however, the supplied power could be much greater than that needed to maintain the desired ramp rate. The ramp rate will continue to increase beyond its desired value. This is called overshoot. The controller will react by reducing power, and slowly the ramp rate will decrease. Once again, the controller can act faster than the heater, so it will reduce power too much and the ramp rate will decrease beyond its desired value. This is oscillation. Over time, the magnitude of the oscillations will decrease and the ramp rate will reach a constant, steady-state value. Because all real systems undergo small disturbances, there will also be a small steady-state error.

The value of $K_p$ determines the size of the overshoot and the steady-state error. If $K_p$ is large, the system will be more oscillatory, but steady-state error will be small. If $K_p$ is small, the opposite is true. Typically, $K_p$ can be large because Derivative control can be used to damp the system's response, i.e. reduce overshoot and oscillation. Steady-state error can be reduced by using Integral control, but this tends to increase overshoot and oscillation and is preferably avoided in this control algorithm. In this case, derivative control is not available. It would require numerically calculating the second derivative of the temperature. Because the signal-to-noise ratio of the thermocouple signal is low, its second derivative can not be calculated reliably. Therefore, the present invention uses a large $K_p$ to reduce steady-state error and a saturation function (step 598) instead of derivative control to dampen the system response. The saturation function effectively schedules the gain $K_p$ such that $K_p$ is inversely proportional to the ramp rate error, $Err_{RRate}$. During the transient portion of the system response, when errors are larger and overshoot can occur, the effective gain is small. In steady-state, errors are small, so the effective $K_p$ is large.

The exemplary saturation function used to dampen system response is given by the following equations (step 598). For these equations, $P(k+1)$ refers to the power defined by the control equation given above. $P_1(k+1)$ is the actual power supplied to the heater. $P'_{max}$ is the predetermined maximum allowable change in supplied power from one time step to the next. The exemplary saturation function is as follows:

if $|P(k+1)-P(k)| > P'_{max}$,
    then $P_1(k+1)=P(k)+P'_{max}$ for $P(k+1)>P(k)$
    and $P_1(k+1)=P(k)-P'_{max}$ for $P(k+1)<P(k)$
else $P_1(k+1)=P(k+1)$ A new term $K_{peff}(k)$ can now be defined as the effective gain of the controller at time step k. Clearly, if $P_1(k+1)=P(k+1)$ the effective gain at time k equals the gain $K_p$. But if the saturation function is applied, $K_{peff}(k)$ is defined by substituting $P(k+1)$ for $P_1(k+1)$ in the equations above and combining them with the equation: $P(k+1)=P_{model}[T(k),T'_{des}(T(k))]+K_p*[T'_{des}(T(k))-T'(k)]$. The term $K_{peff}(k)$ is as follows:

$$P'_{max}=K_{peff}(k)*Err_{RRate}(k);$$

$$P'K_{peff}(k)=P'_{max}/Err_{RRate}(k).$$

By making the effective gain small when the ramp rate error is large, overshoot and oscillation in the response are minimized by this saturation function. This reduces the likelihood of damage to the heater from poor ramp rate control. Accordingly, the ramp control algorithm of heater control subroutine 167 dampens the system's response when large ramp rate errors occur, thereby resulting in more efficient temperature control.

A plasma control subroutine 170 comprises program code for setting the magnetron power levels and mode (CW or pulsed). In alternative embodiments having RF plasma systems, plasma control subroutine 170 also could include program code for setting low- and high-frequency RF power levels applied to the process electrodes in chamber 15, and for setting the low-frequency RF frequency employed. Of course, some embodiments may have one plasma control subroutine 170 used for microwave power levels and another plasma control subroutine 170 used for RF power levels. Like the previously described chamber component subroutines, plasma control subroutine 170 is invoked by chamber manager subroutine 157a.

A plasma control subroutine 170 comprises program code for setting and adjusting the magnetron power levels and mode (CW or pulsed). In alternative embodiments having RF plasma systems, plasma control subroutine 170 also could include program code for setting low- and high-frequency RF power levels applied to the process electrodes in chamber 15, and for setting the low-frequency RF frequency employed. Of course, some embodiments may have one plasma control subroutine 170 used for microwave power levels and another plasma control subroutine 170 used for RF power levels. Like the previously described chamber component subroutines, plasma control subroutine 170 is invoked by chamber manager subroutine 157a. In embodiments having gate valve 280, plasma control subroutine 170 also includes program code for opening and closing of gate valve 280 to coordinate with the setting/adjusting of microwave power levels. Alternatively, the system software may have a separate gate valve control subroutine in embodiments having gate valve 280.

An endpoint detect control subroutine 159 includes program code for managing endpoint detection by controlling a light source and a light detector, receiving data from the light detector for use in comparing light intensity changes from absorbance, and optionally stopping the cleaning process upon detecting a predetermined light intensity level or raising a flag indicating the endpoint of the cleaning process. Endpoint detect control subroutine 159 also may be invoked by chamber manager subroutine 157a. Endpoint detect control subroutine 159 is included for those embodiments using the endpoint detection system described below. It is recognized that embodiments not having an endpoint detection system would not need to use or have endpoint detect control subroutine 159.

Optionally, a gettering control subroutine 169 may be included that can be invoked by chamber manager subroutine 157a. Gettering control subroutine 169 includes program code for controlling gettering processes that may be used for chamber seasoning, post-clean fluorine gettering, etc. In some embodiments, gettering control subroutine 169 can invoke specified software built into the clean recipe to facilitate gettering control in combination with the clean recipe used.

The CVD system description presented above is mainly for general illustrative purposes and should not be considered as limiting the scope of the present invention. The exemplary CVD system 10 is a single-wafer vacuum chamber system. However, other CVD systems that are multiple-wafer chamber systems may be used in other embodiments of the invention. It should be understood, however, that although certain features of the invention are shown and described as part of a CVD chamber in a multichamber processing system, the invention is not necessarily intended to be limited in this manner. That is, the invention can be used in a variety of processing chambers, such as etch chambers, diffusion chambers or the like. Variations of the above described system such as variations in design, heater design, location of RF power connections, software operation and structure, specific algorithms used in some software subroutines, configuration of gas inlet lines and valves, and other modifications are possible. Additionally, other plasma CVD equipment such as electron cyclotron resonance (ECR) plasma CVD devices, induction coupled RF high density plasma CVD devices, or the like may be employed. The dielectric layers and methods for forming such layers for use in the present invention should not necessarily be limited to any specific apparatus or to any specific plasma excitation method.

Figure 2:
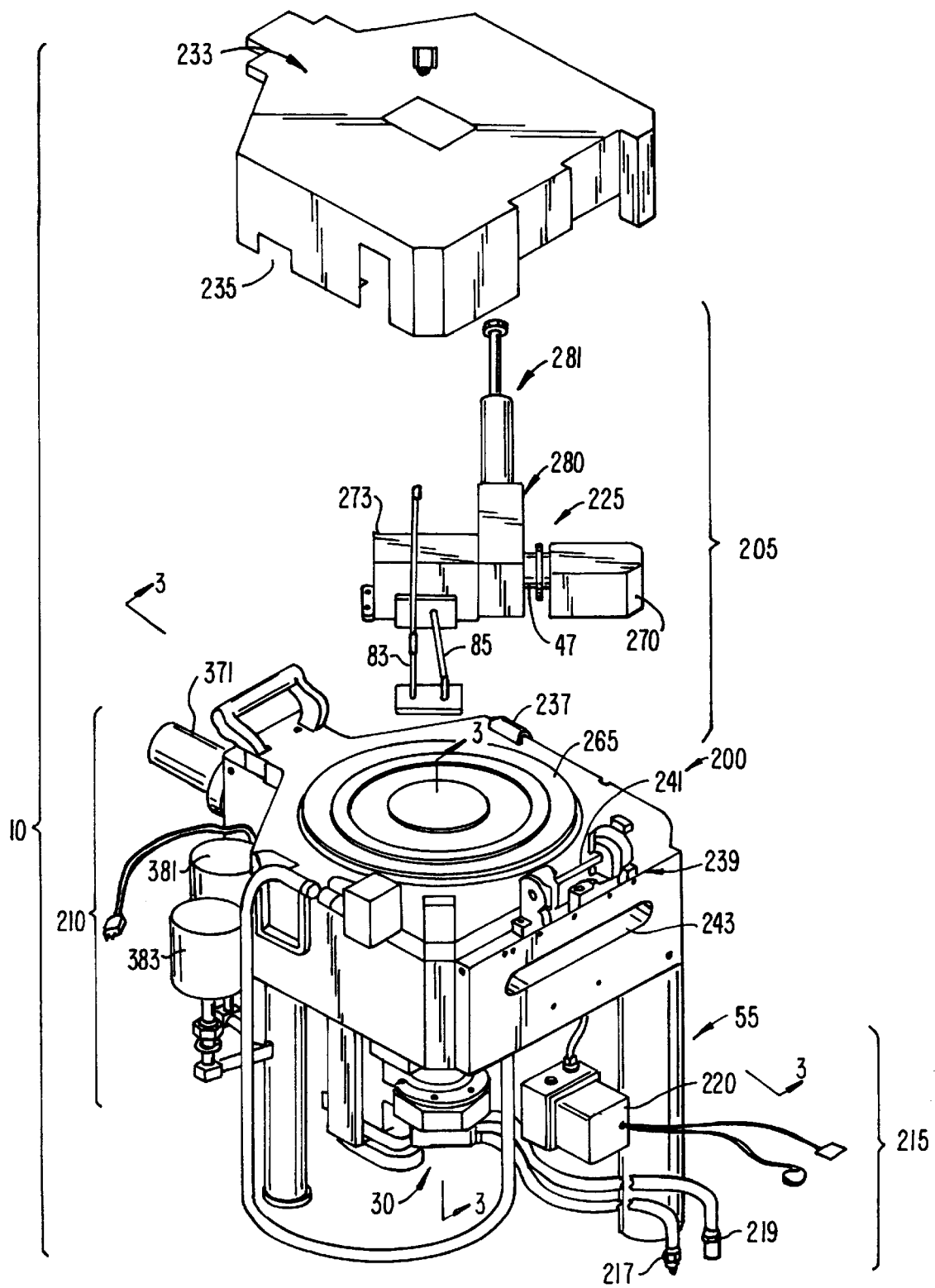
FIG. 2 is an exploded view of a preferred embodiment of CVD apparatus 10 according to the present invention.
Figure 3:
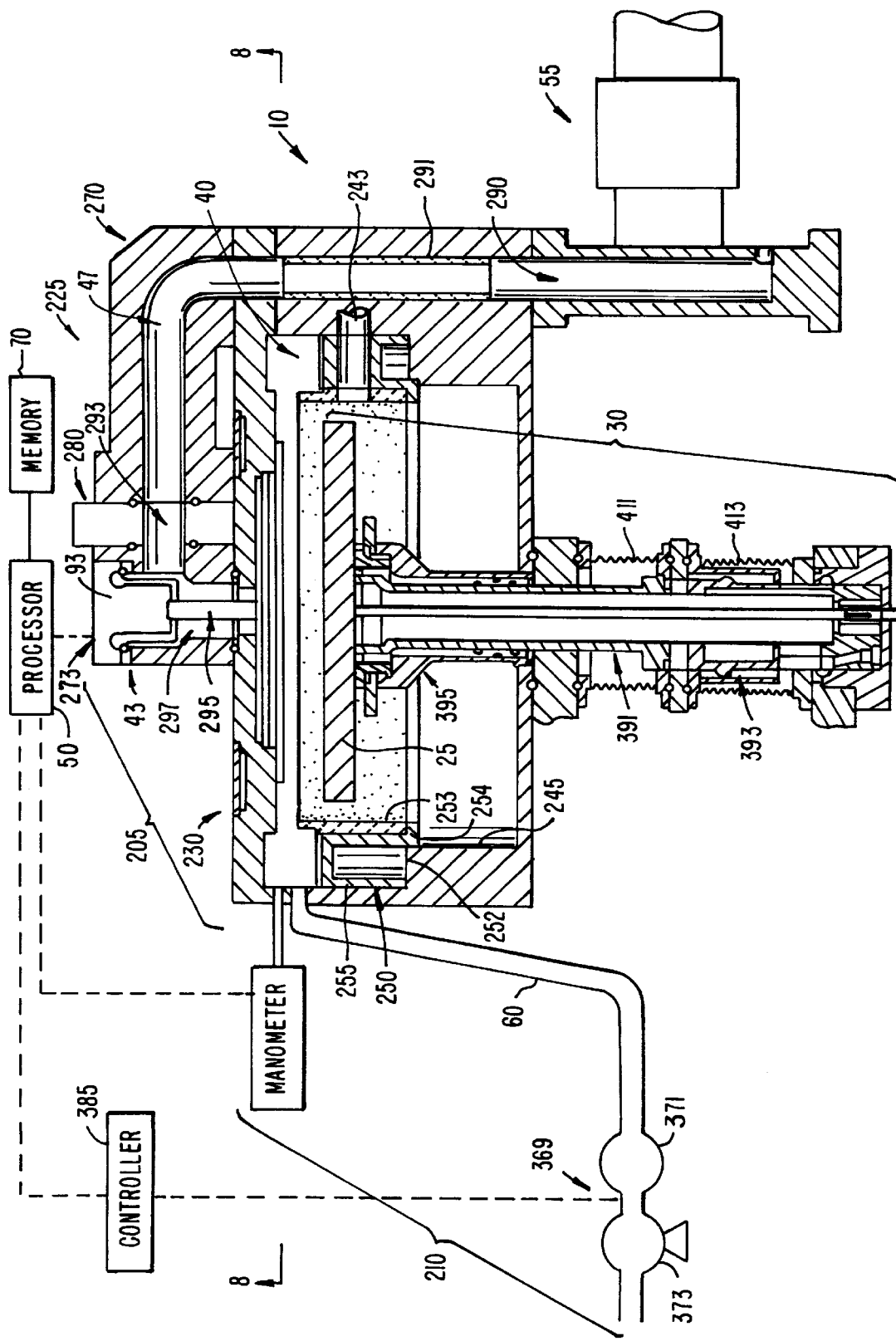
FIG. 3 is a vertical cross-section, partly in schematic, taken along line 3—3 in FIG. 2.

As shown in FIGS. 2 and 3, CVD apparatus 10 generally includes an enclosure assembly 200 having vertically movable heater (wafer support pedestal or susceptor) 25 for supporting a semiconductor wafer within a vacuum chamber 15. Process gas(es) are delivered into chamber 15 to perform various deposition and etching steps on the wafer. A gas distribution system 205 (FIGS. 2–6C) distributes process gases from gas sources 90 (FIG. 1C) onto the wafer, and an exhaust system 210 (FIGS. 2–4) discharges the process gases and other residue from chamber 15. CVD apparatus 10 further includes a heater/lift assembly 30 (FIGS. 1A, 9–15) that includes heater 25 for heating the wafer and for lifting the wafer upwards into a processing position within chamber 15. An integral remote microwave plasma system 55 (FIGS. 1A and 16) is also provided in CVD apparatus 10 for periodic chamber cleaning, wafer cleaning, or depositing steps.

As shown in FIG. 2, CVD apparatus 10 further includes a liquid cooling system 215 for delivering coolant to various components of the chamber 15 to cool these components during the high temperature processing. Liquid cooling system 215 acts to decrease the temperature of these chamber components to minimize undesired deposition onto these components due to the high temperature processes. Liquid cooling system 215 includes a pair of water connections 217, 219 that supply cooling water through the heater/lift assembly 30 and a coolant manifold (not shown) for delivering coolant to the gas distribution system 205 (discussed below). A waterflow detector 220 detects the waterflow from a heat exchanger (not shown) to enclosure assembly 200. Preferred embodiments of the individual systems of apparatus 10 will be described in further detail below.

A. Enclosure Assembly

Referring to FIGS. 2 and 6A–6C, enclosure assembly 200 is preferably an integral housing made from a process-compatible material, such as aluminum or anodized aluminum. Enclosure assembly 200 includes an outer lid assembly 225 for delivering process and clean gases through an inlet tube 43 to an inner lid assembly 230 within assembly 200. Inner lid assembly 230 functions to disperse the gases throughout chamber 15 onto a wafer (not shown) supported on heater 25. As shown in FIG. 2, a lid cover 233 provides access to the components on the top of enclosure assembly 200 (i.e., outer lid assembly 32), and shields the operator from exposure to high temperatures during system operation. For SACVD processes, lid cover 233 preferably includes a cutout 235 to allow clearance for lid clamps 237 that ensure gas integrity of the chamber 15. Lid cover 233 generally remains closed during most process steps unless the chamber is opened, for example, to perform a preventive maintenance chamber cleaning, thereby breaking the vacuum and bringing the chamber to atmospheric pressure. A lid hinge 239 includes a locking ratchet mechanism 241 to prevent the lid cover 233 from falling closed.

As shown in FIG. 2, enclosure assembly 200 defines a vacuum lock door (not shown) and a slit valve opening 243 through which a wafer loading assembly (not shown) transports a wafer W into process chamber 16 and loads wafer W onto heater 25. The wafer loading assembly is preferably a conventional robotic mechanism disposed within a transfer chamber (not shown) of the multichamber processing system. A suitable robotic transfer assembly is described in commonly assigned U.S. Pat. No. 4,951,601 to Maydan, the complete disclosure of which is incorporated herein by reference.

Referring to FIGS. 3, 4, 7A and 7B, the inside wall 245 of enclosure assembly 200 around chamber 15 is covered with a chamber liner 250, which rests on a shelf 252 of enclosure assembly 200. Chamber liner 250 serves to inhibit process gases from flowing to the back side of the wafer. In addition, since heater 25 has a smaller diameter than enclosure assembly 200, liner 250 inhibits the flow of process gases below heater 25 to the lower portion of chamber 15. Accordingly, undesired deposition onto the bottom of heater 25 and the lower portion of chamber 15 is minimized. Further, liner 250 provides thermal insulation between the aluminum walls of enclosure assembly 200 and the edge of the wafer on heater 25, in order to prevent wafer edge cooling during high temperature processing. During high temperature processing, liner 250 prevents excessive heat loss from the hotter edges of the wafer on heater 25 (e.g., about 550–600° C.) to the cooler surrounding chamber walls (e.g., about 60° C.). Without liner 250, the heat effects at the edge of the wafer may adversely affect temperature uniformity across the wafer and lead to non-uniform deposition. Liner 250 preferably comprises an inner portion 253 formed of a process-compatible material that is well suited for high temperature processes (e.g., greater than about 500° C.). Preferably, inner portion 253 of liner 250 comprises a ceramic material, such as aluminum nitride, alumina, or the like, with alumina being the preferred material. Inner portion 253 will usually have a thickness of about 0.1 to 1 inch and preferably about 0.2 to 0.3 inch.

Figure 7A:
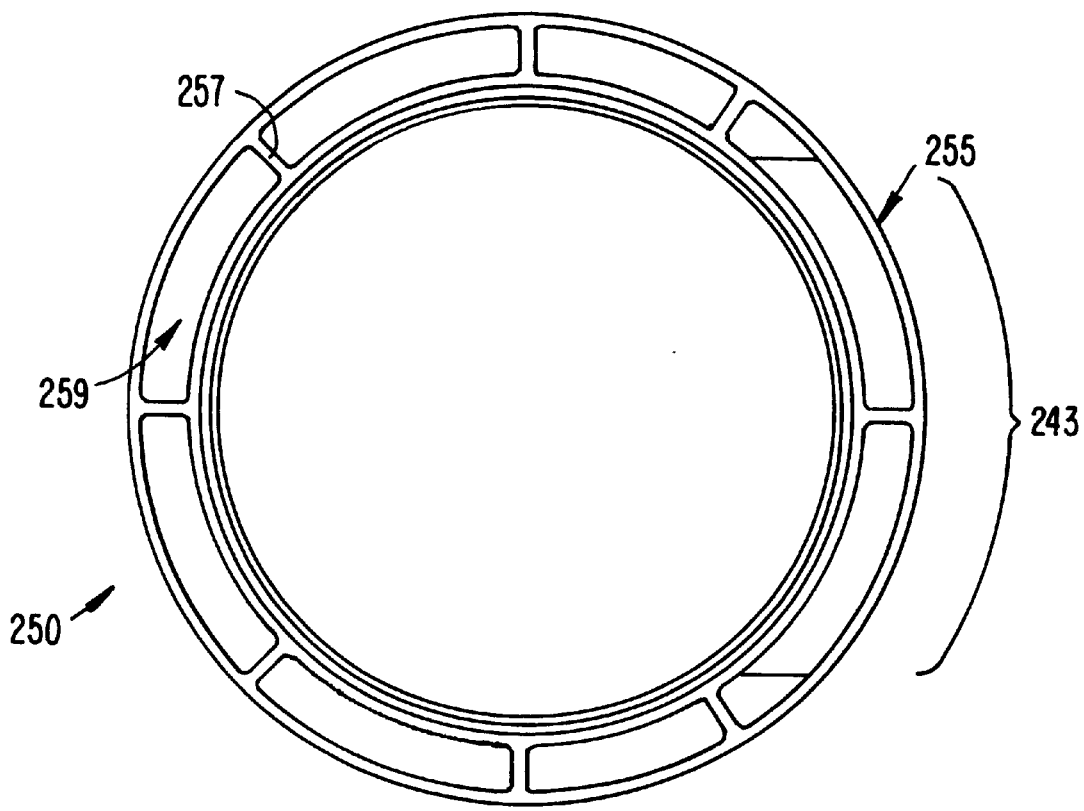
FIGS. 7A and 7B are side cross-sectional views and bottom views, respectively, of a chamber liner, in accordance with an embodiment of the invention.
Figure 7B:
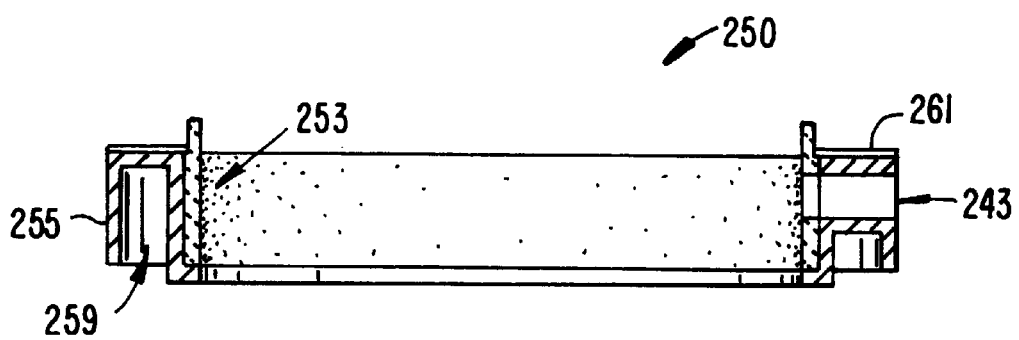

Liner 250 preferably comprises an outer portion 255 that comprises a material that is less susceptible to cracking than ceramic, such as aluminum. Outer portion 255 rests on shelf 252 of enclosure assembly, and includes an annular lip 254 for supporting inner portion 253 of liner 250. In a particularly preferred embodiment, outer portion 255 includes a plurality of circumferentially spaced vertical struts 257 that define inner air gaps 259 therebetween, as shown in FIGS. 7A and 7B. Air gaps 259 facilitate insulation of the inner portion 253 of liner 250 from the outer chamber walls to increase wafer temperature uniformity (otherwise the outer edge of the wafer could cool down due to the surrounding chamber wall temperature, which is cool relative to the heater and wafer temperature). In addition, air gaps 259 provide thickness to liner 250 so that it can bridge the gap between the outer chamber walls and heater 25 while minimizing the cracking or other thermal damage that may occur with a thicker liner 250. Outer portion 255 of liner 250 usually has a thickness of about 0.5 to 2 inches with an air gap 259 thickness of about 0.2 to 1.5 inches, and preferably about 0.9 to 1.1 inch with an air gap 259 thickness of about 0.6 to 0.9 inch. An annular cover 261 is positioned on the upper surface of outer liner 255 to form the lower wall of a pumping channel 40 (discussed below). Annular cover 261 preferably comprises a ceramic material, such as aluminum oxide or aluminum nitride, to shield the aluminum outer portion 255 of liner 250 from process gases and the heat within pumping channel 40.

In an alternative embodiment (not shown), liner 250 only comprises inner ceramic portion 255 resting on shelf 252 of enclosure assembly and annular cover 261 forming the bottom of pumping channel 40. In this embodiment, outer portion 255 is replaced with an air gap (not shown) between ceramic portion 255 and the inside wall of enclosure assembly. The air gap insulates the high temperature wafer from the cooler walls of the enclosure assembly, and it provides thickness to liner 250 to bridge the gap between the chamber walls and heater 25.

B. Gas Distribution System

Figure 4:
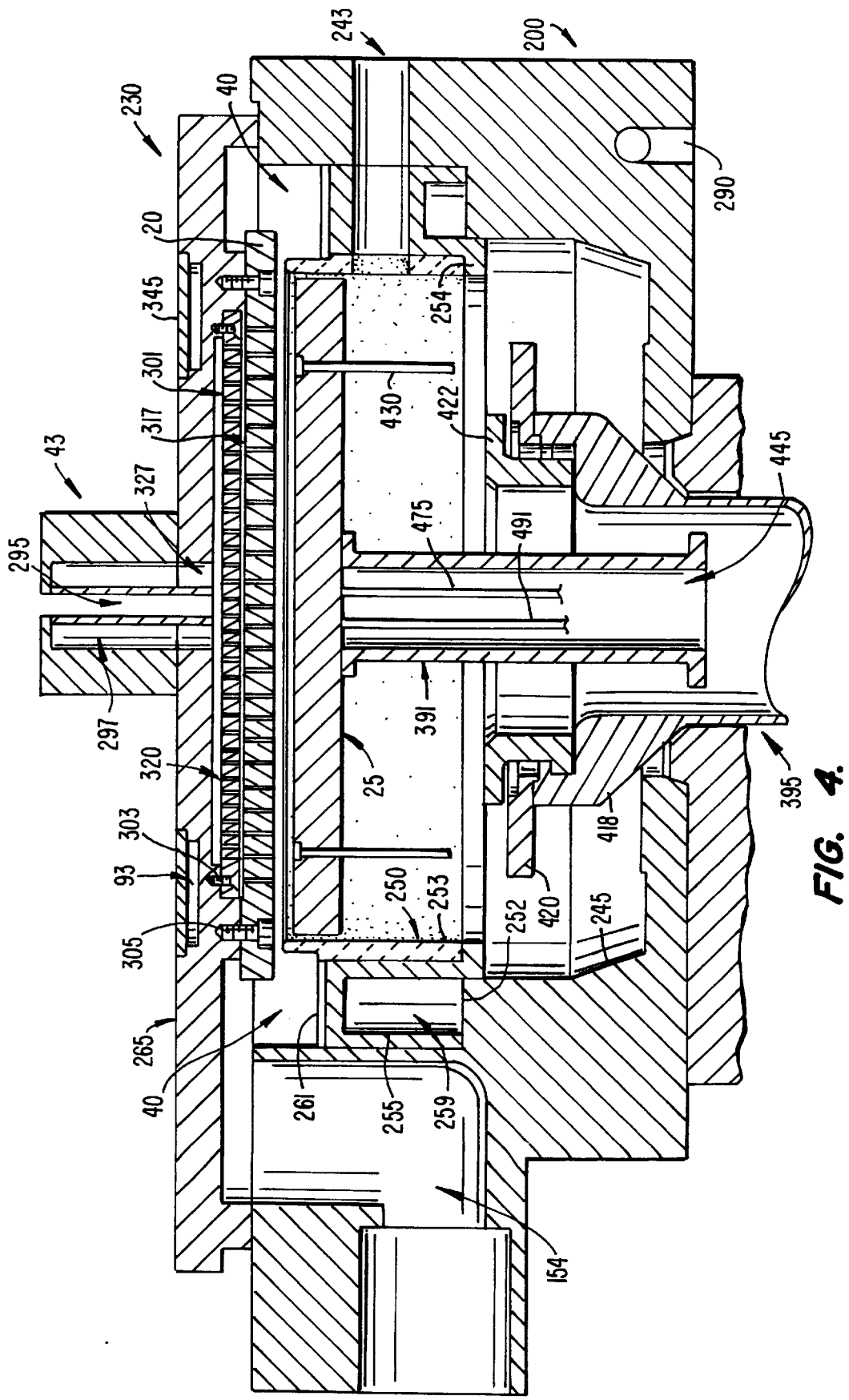
FIG. 4 is an enlarged cross-section of a semiconductor processing chamber of the apparatus of FIG. 2.

Referring to FIGS. 2 and 6A–6C, outer lid assembly 225 generally includes a lid or base plate 265, a coolant manifold (not shown), a clean gas manifold 270 that includes conduit 47, gas mixing box 273 for mixing and injecting process gas(es) and cleaning gas(es) through inlet tube 43 to the processing chamber 15, and a gate valve 280 for selectively distributing cleaning and/or process gases to gas mixing box 273. Of course, it should be clearly understood that gate valve 280 is optional, and that outer lid assembly 225 can be modified to selectively distribute cleaning and/or process gases to box 273 without a gate valve. As shown in FIG. 4, gas mixing box 273, clean gas manifold 277 and gate valve 280 are preferably fastened, e.g., bolted, to the top surface of base plate 265. First and second gas passages 83, 85 are mounted to the exterior of plate 265, and extend into gas mixing box 273. Gas passages 83, 85 each have inlets suitably coupled to sources 90 of gas (see FIG. 1C), such as ozone, TEOS, TEPO, helium, nitrogen, clean gas, or the like, and outlets (not shown) in communication with a mixing area 93 within box 273 for mixing the gases prior to delivering them through inlet tube 43 into the inner lid assembly 230.

It should be noted that for plasma processes, CVD apparatus 10 will further include a gas feed-through box (not shown) housing gas passages 83, 85 to enable the application of high voltage RF power to the gas box without gas breakdown, and without gas deposition in the gas distribution system. A description of an exemplary gas feed-through box can be found in U.S. Pat. No. 4,872,947 to Wang, the complete disclosure of which is incorporated herein by reference.

Figure 6A:
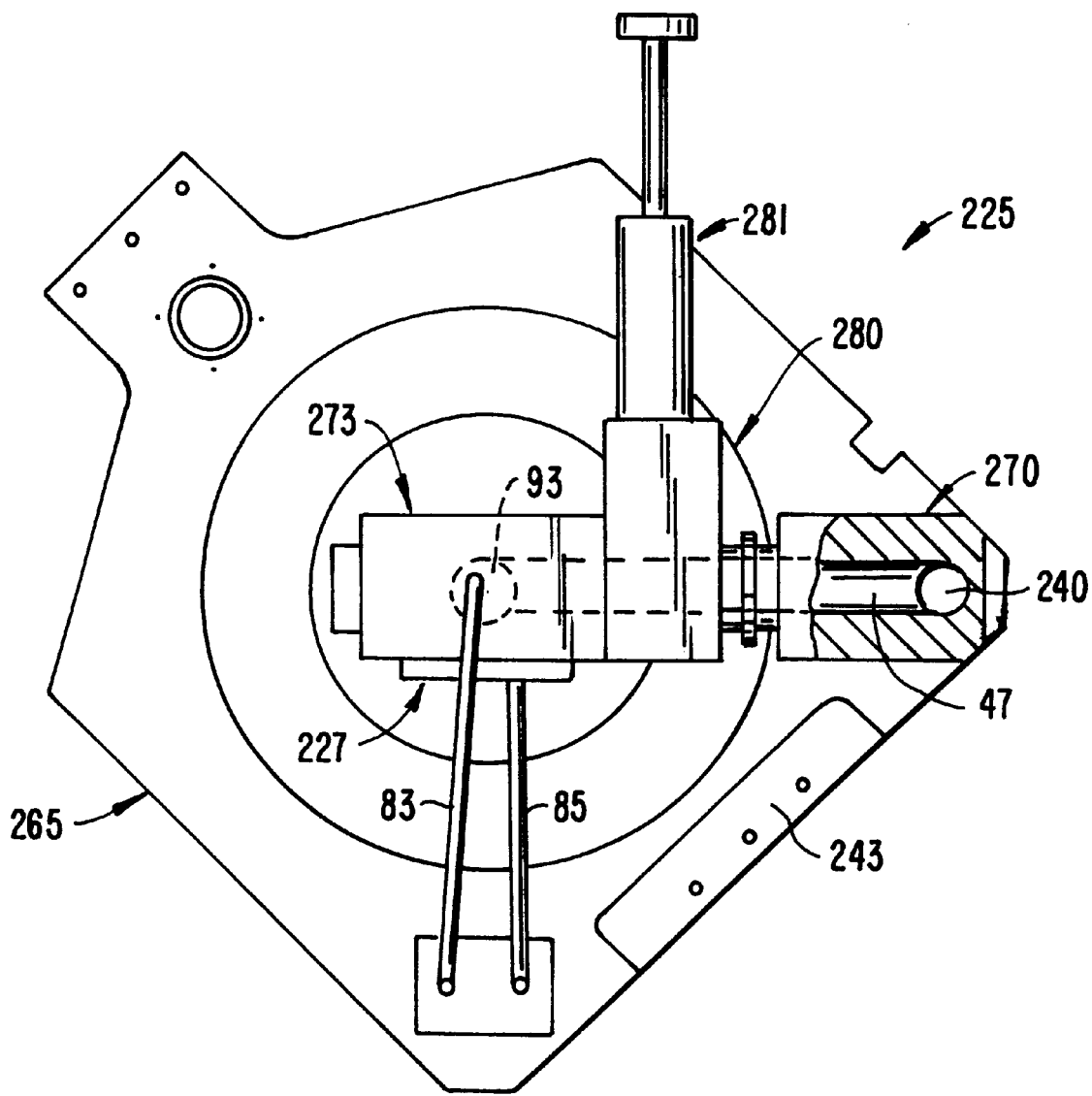
FIG. 6A is a top, partially cut-away view of a lid assembly of CVD apparatus 10, illustrating portions of the gas distribution systems.

As shown in FIG. 6A, clean gas manifold 270 includes conduit 47 for receiving gas(es) from inlet 290, and directing these gas(es) through a fluid passage 293 into gas mixing box 273. Gate valve 280 includes a valve plug (not shown) seated within passage 293 for selectively allowing or preventing the gases from passing through conduit 47 into gas mixing box 273. Gate valve 280 may be manually operated by actuating handle 281, or gate valve 280 may be controlled by processor 50. During cleaning (discussed below), gate valve 280 is configured to allow the clean gases from plasma system 55 to pass into box 273, where they are directed through inlet tube 43 into chamber 15 to etch the wafer or the inner chamber walls and the other components of apparatus 10.

As shown in FIG. 3, clean gas manifold 270 is constructed integral to the top part of enclosure assembly 200 of apparatus 10, with conduit 47 having an appropriate bend or curve from the top toward the side of chamber 15. Conduit 47 of manifold 270 has an opening into a passage integrally formed within a side wall of enclosure assembly 200 of apparatus 10, which may become heated due to the high temperatures at which heater 25 operates. This passage is equipped with an internal liner 291 that serves to protect the inner surfaces of the passage in enclosure assembly 200 from corrosion and etching from the clean gas radicals entering from an applicator tube 292. Liner 291 also prevents recombination of radicals in the clean gas. Clean gases are introduced into applicator tube 292 from an inlet 57. Radicals are created from clean gases in applicator tube 292 by microwave energy radiated from a magnetron in plasma system 55, which is advantageously located toward the bottom of chamber 15 in enclosure assembly 200. The location of system 55 at the bottom of apparatus 10 facilitates servicing of chamber 15 for preventive maintenance cleanings, repairs, etc. In particular, opening the lid of apparatus 10 in order to perform preventive maintenance cleanings is easily done, since the bottom-mounted remote microwave plasma system 55 is not located on top of the lid of apparatus 10. Microwave plasma system 55 is discussed in further detail below. As shown in FIGS. 3 and 4, inlet tube 43 preferably includes an inner passage 295 for delivering process gases into chamber 15, and an outer, annular passage 297 in communication with passage 293 for directing cleaning gases into the chamber.

The coolant manifold, which may be fastened to the top or side surface of base plate 265, receives coolant fluid, such as water or a glycol\water mixture, from the heat exchanger. The coolant is distributed from the coolant manifold through an annular coolant channel 93 (FIGS. 4 and 5) in base plate 265 to convectively and conductively remove heat from plate 265 and the components of inner lid assembly 230 during processing (discussed in further detail below).

Figure 5:
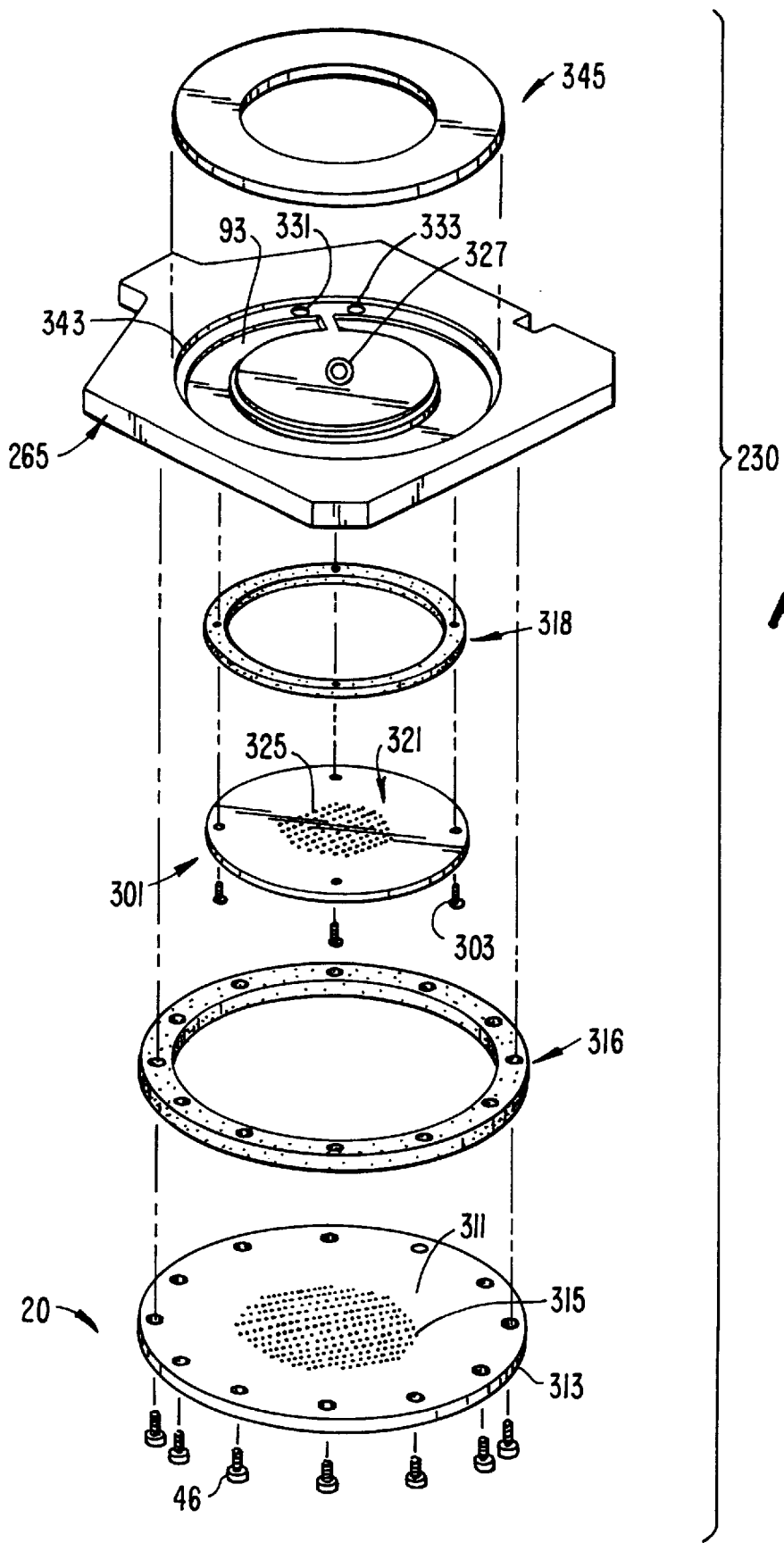
FIG. 5 is an exploded view of a gas distribution system for the apparatus of FIG. 2.

As shown in FIGS. 2 and 5, inner lid assembly 230 generally includes base plate 265, a blocker or gas dispersion plate 301 and a showerhead or gas distribution plate 20 for dispersing process and clean gases into chamber 15. Plates 301, 20 are preferably formed from a process-compatible material that is capable of withstanding high temperature processes. For example, plates 301, 20 may comprise a ceramic material such as aluminum oxide or aluminum nitride (AlN), or a metal, such as aluminum or anodized aluminum. Preferably, the plates 301, 20 comprise a metal, such as aluminum or anodized aluminum, to minimize gas deposition on the surfaces of plates 301, 20. In a particularly preferred embodiment, gas dispersion plate 301 comprises anodized aluminum and gas distribution plate 20 comprises aluminum. Gas distribution and gas dispersion plates 301, 20 are each directly fastened to a lower surface of base plate 265. Preferably, gas distribution and dispersion plates 20, 301 are affixed to lower surface of base plate 265 with a plurality of threaded mounting screws 303, 305, respectively. Mounting screws 303, 305 provide a relatively tight, surface-to-surface contact between contact surfaces of gas distribution and dispersion plates 20, 301, respectively, and lower surface of base plate 265 to facilitate conductive heat exchange therebetween (discussed in greater detail below). The mounting screws 303, 305 comprise a process-compatible material, such an nickel, Hasteloy™, Haynes™ or the like.

Referring to FIGS. 4 and 5, gas distribution plate 20 is a substantially flat plate 311 having an outer flange 313 with a plurality of holes 315 for receiving mounting screws 305 to provide engagement of the contact surface of plate 20 with lower surface of base plate 265. Base plate 265 includes an outer annular stand-off 316 that spaces gas distribution plate 20 from the bottom surface of 265 and forms a chamber 317 (see FIG. 4) between these two plates for dispersing the process gas uniformly through a plurality of gas distribution holes 315 onto a semiconductor wafer. Alternatively, gas distribution plate 20 may comprise a dish-shaped device (not shown) having a centrally disposed cavity defined by a side wall and a base wall.

The size and arrangement of gas distribution holes 315 will vary depending on the process characteristics. For example, the holes 315 may be uniformly spaced to provide a uniform distribution of gases onto the wafer. On the other hand, holes 315 may be non-uniformly spaced and arranged, if desired. Holes 315 will usually have a diameter in the range of about 5–100 mil and preferably in the range of about 10–50 mil. Preferably, gas distribution holes 315 are designed to promote uniformity of deposition on the semiconductor wafer. The holes (as well as the manifold temperature, discussed above) are also designed to avoid the formation of deposits on the manifold outer (bottom) surface and, in particular, to prevent the deposition of soft deposits on that surface which could flake off and drop onto the wafer during and after processing. In an exemplary embodiment, the hole array is one of generally concentric rings of holes 315. The distances between adjacent rings (ring-to-ring spacings) are approximately equal, and the hole-to-hole spacing within each ring is approximately equal. A more complete description of a suitable arrangement for the gas distribution holes is described in commonly assigned U.S. Pat. No. 4,872,947 to Wang, the complete disclosure of which has previously been incorporated by reference.

Gas dispersion plate 301 is a generally circular disk 321 including a plurality of gas dispersion holes 325 for dispersing the gas therethrough into the chamber 317 formed between outer stand-off 316 and gas distribution plate 20. Base plate 265 preferably includes a second, inner stand-off 318 for spacing dispersion plate 301 from base plate 265 and for allowing gas passing through base plate 265 to disperse into a chamber 320 (see FIG. 4) formed between stand-off 318 and plate 301. Alternatively, gas dispersion plate 301 may define a recess (not shown) for forming chamber 320 rather than stand-off 318. Dispersion holes 325 will usually have a diameter of about 0.02–0.04 mm. Of course, it will be recognized by those skilled in the art that dispersion plate 301 may be included in preferred embodiments of the invention. However, the process gases may be passed directly from base plate 265 into chamber 317 of gas distribution plate 20, in other embodiments.

As shown in FIGS. 4 and 5, base plate 265 is an integral, single-piece element that functions to deliver process gas(es) to gas dispersion plate 301 and to mount the entire inner lid assembly 230 to the mainframe unit of the processing chamber. In RF plasma processes, inner lid assembly 230 will also include an isolator (not shown) that electrically insulates the chamber lid from ground and isolates the chamber body from the RF gas box (not shown). An exemplary lid assembly for use with RF plasma processes is described in U.S. Pat. No. 4,872,947 to Wang, the disclosure of which has previously been incorporated by reference.

Figure 8:
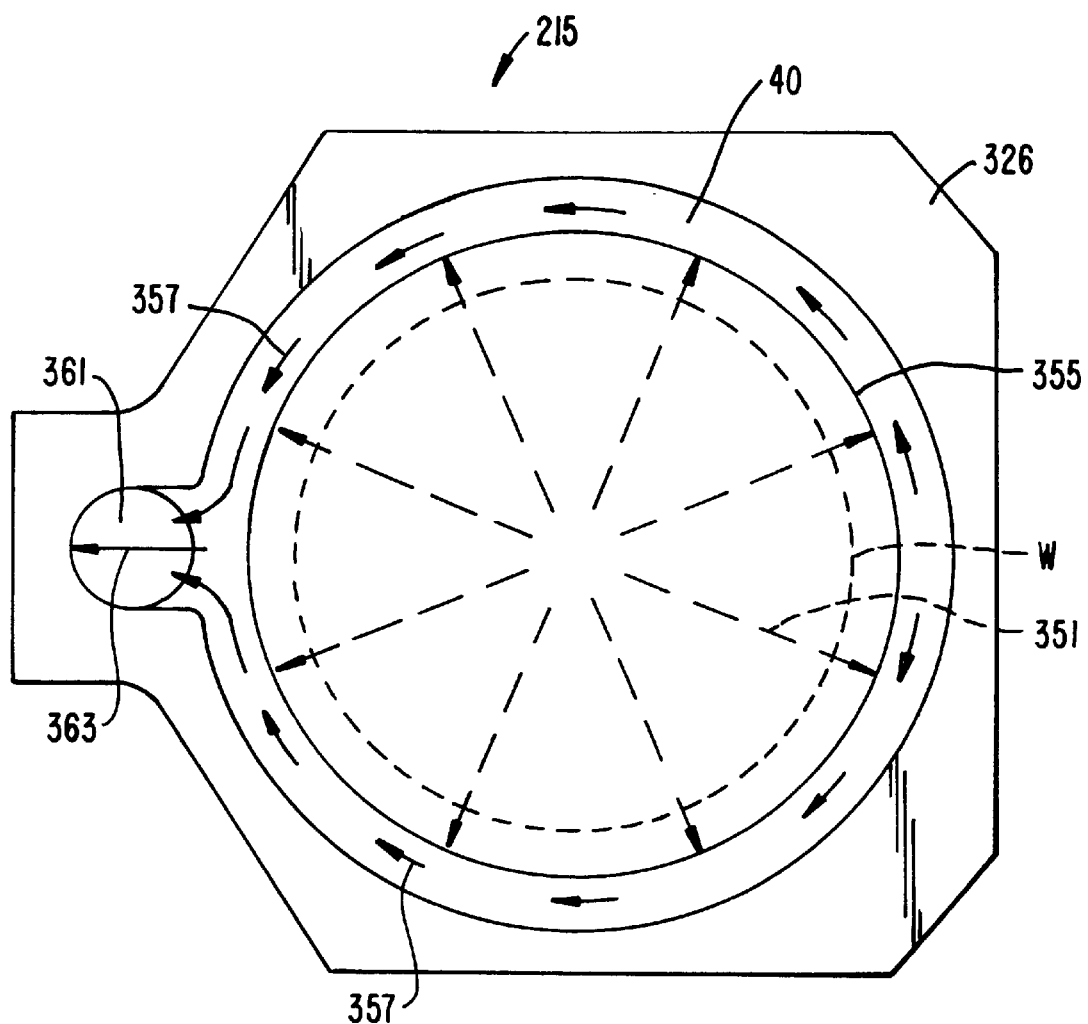
FIG. 8 is a partially schematic, cross-sectional view of FIG. 3 taken along lines 8—8, illustrating the pumping channel and the gas flow pattern in the exhaust system of the CVD apparatus 10 of FIG. 2.

As shown in FIG. 8, base plate 265 has a lower surface 321 that defines an annular pumping channel 40 for exhausting the deposition gases (discussed in detail below). As shown in FIGS. 4 and 5, base plate 265 defines a central hole 327 in communication with inlet tube 43 for receiving the mixed process gases from gas mixing box 273. Hole 327 is also in communication with recess 311 of gas dispersion plate 301 for dispersing the gas across plate 301 to holes 315. Base plate 265 further defines a coolant passage 93 having an inlet 331 and an outlet 333 coupled to the cooling system 215 for directing coolant fluid through portions of plate 215 to convectively cool these portions of plate 265. Preferably, coolant passage 93 is formed within portions of base plate 265 that are relatively close to mounting screws 303, 305. This facilitates conductive cooling through contact surfaces of dispersion and distribution plates 301, 20 and lower surface 326 of base plate 265. A more complete description of exemplary designs for coolant passage 93 can be found in commonly assigned, co-pending application Ser. No. 08/631,902, filed Apr. 16, 1996 (Attorney Docket No. 1034), the complete disclosure of which is incorporated herein by reference, and in commonly assigned U.S. Pat. No. 4,872,947 to Wang, the complete disclosure of which has previously been incorporated by reference.

Referring to FIG. 5, base plate 265 further defines an annular recess 343 surrounding central hole 327 and an annular cap 345 disposed within recess 343 fastened to base plate 265 above coolant passage 93. Preferably, annular cap 345 is welded to upper surface of base plate 265 to provide a tight seal over passage 93, thereby effectively preventing coolant leakage from passage 93. With this configuration, passage 93 is formed relatively close to gas distribution and dispersion plates 20, 301. In addition, passage 93 is fabricated by forming a groove in the upper surface of base plate 265, thereby decreasing the cost and complexity of manufacturing plate.

Figure 6B:
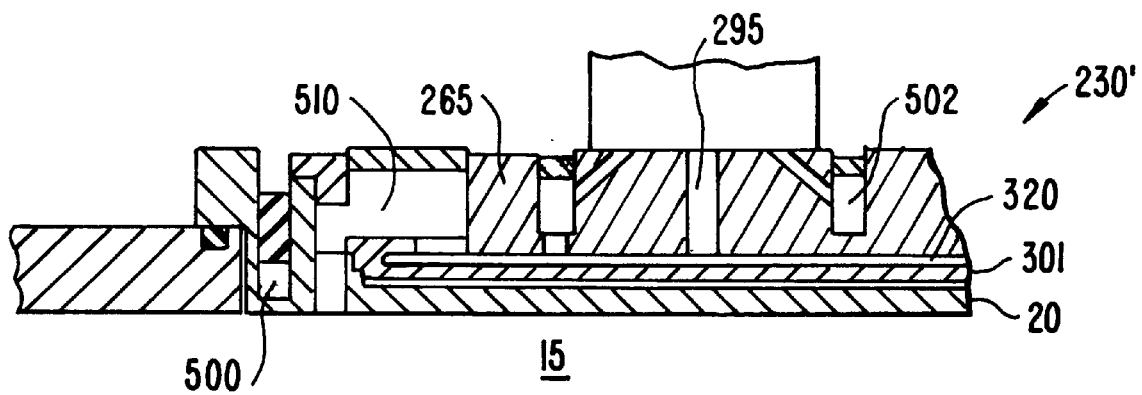
FIGS. 6B and 6C illustrate a front cross-section and a top view, respectively, of an alternative lid assembly for CVD apparatus 10, incorporating a bypass conduit for cleaning gases.
Figure 6C:
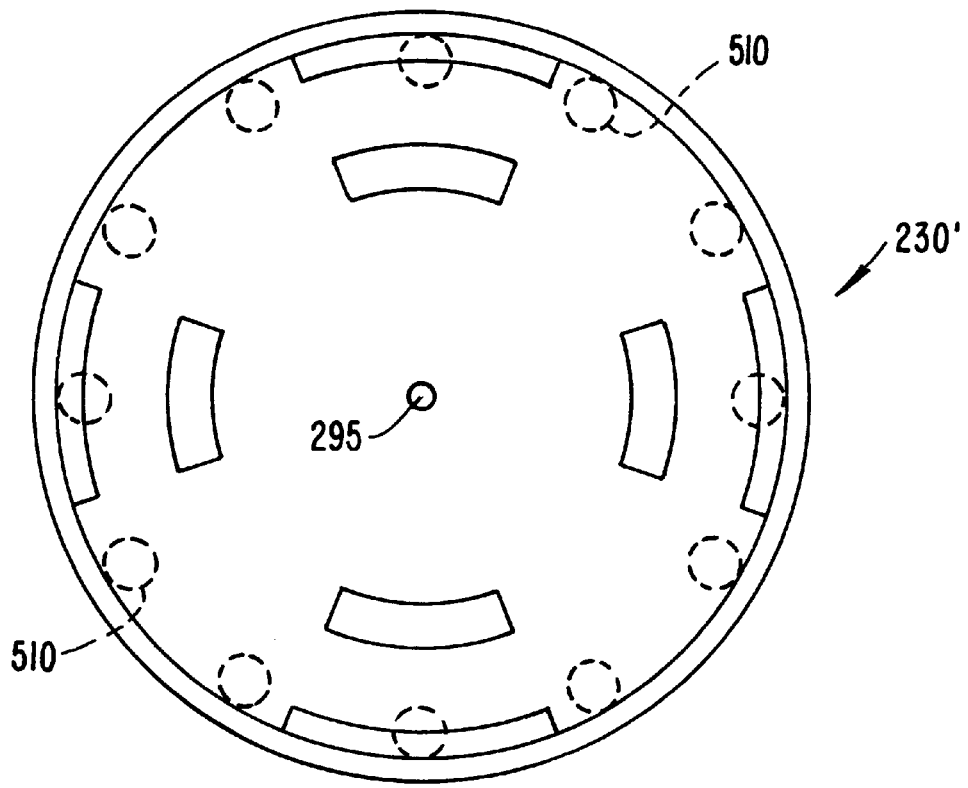

Referring now to FIGS. 6B and 6C, an alternative embodiment of inner lid assembly 230' will now be described. Similar to the previous embodiment, lid assembly 230' includes a base plate 265, a gas dispersion plate 301 and a gas distribution plate 20 for dispersing process and clean gases into chamber 15. In addition, base plate 265 includes an annular coolant channel 500 for receiving a coolant liquid, such as water, to cool base plate 265 and the other components of lid assembly 230'. In this embodiment, base plate 265 further includes an additional annular fluid channel 502 extending around central hole 295 above gas dispersion plate 301 for exchanging heat with the portion of base plate 265 immediately above gas dispersion and gas distribution holes 325, 315.

Inner lid assembly 230' includes a plurality of bypass passages 510 extending from chamber 320 between base plate 265 and gas dispersion plate 301 to vacuum chamber 15. Bypass passages 510 offer a lower resistance to fluid flow than gas dispersion and gas distribution holes 325, 315. Accordingly, a large portion of the gas flowing into chamber 320 will pass through bypass passages 520 directly into the vacuum chamber 15. In an exemplary embodiment, bypass passages 510 are preferably spaced circumferentially around base plate 265 to uniformly deliver gases into the chamber 15 (see FIG. 6C). In a preferred use of this embodiment, cleaning gases, such as $NF_3$, pass into chamber 320 and through gas dispersion and gas distribution holes 325, 315, respectively. In addition, a portion of the cleaning gases pass through bypass passages 510 directly into chamber 15 to facilitate the delivery of the cleaning gases into chamber 15.

In this embodiment, vapor deposition apparatus 10 will preferably include a control system, such as a valve coupled to a controller (not shown) for preventing (or at least inhibiting) gases from passing through bypass passages 510. For example, during processing, it is typically desired that the process gases pass through gas distribution and dispersion holes 325, 315 to uniformly disperse onto the wafer. Thus, the valve will be closed to prevent the process gases from passing through bypass passages 510. When the chamber is cleaned, the valve will be opened to quickly deliver at least a portion of the cleaning gases into the chamber. This increases the speed and efficiency of the cleaning process, which reduces the down time of apparatus 10. Of course, it will be recognized that process gases may also be delivered through bypass passages 510, if desired.

C. The Exhaust System

Referring to FIGS. 2–4, a pump (not shown) disposed exterior to CVD apparatus 10 provides vacuum pressure to draw both the process and purge gases, as well as residues, out of chamber 15 and through annular pumping channel 40, where they are discharged from apparatus 10 along a discharge conduit 60. As shown in FIG. 8, the deposition and clean gases are exhausted radially outward over the wafer W (shown by arrows 351) through an annular slot-shaped orifice 355 surrounding the chamber 15 and into pumping channel 40. The annular slot-shaped orifice 355 and channel 40 are preferably defined by the gap between the top of the chamber's cylindrical side wall 17 (including inner portion 253 of the chamber liner 250, see FIGS. 3 and 4) and the bottom of base plate 265. From the pumping channel 40, the gases flow circumferentially around channel 40 (shown by arrows 357) and through a downwardly extending gas passage 361, past a vacuum shut off valve 363 (whose body is preferably integrated with the lower chamber body), and into discharge conduit 60 which connects to an external vacuum pump (not shown).

Alternatively, CVD apparatus 10 may include a separate pumping plate (not shown) having a plurality of gas holes that directly communicate process chamber 15 with pumping channel 40. In this embodiment, the gas holes are circumferentially spaced around the central opening of the chamber to facilitate the uniform discharge of process gas through the holes. To accommodate the relative positions of inlets and outlets, gas holes may extend in a radially outward direction from inlets to outlets relative to central opening. This radial orientation of holes also contributes to a substantially uniform discharge of the process and purge gases and exhausted residues from the processing chamber 15. A more complete description of this type of pumping plate can be found in commonly assigned co-pending application Ser. No. 08/606,880, filed Feb. 26, 1996 (Attorney Docket No. 978), the complete disclosure of which is incorporated herein by reference.

Referring to FIGS. 2 and 3, a valve assembly (throttle valve system) 369 includes an isolation valve 371 and a throttle valve 373 disposed along discharge line 60 for controlling the flow rate of the gases through pumping channel 40. The pressure within processing chamber 15 is monitored with capacitance manometers 381, 383 (see FIG. 2) and controlled by varying the flow cross-sectional area of conduit 60 with throttle valve 373. Preferably, processor 50 receives from manometers 381, 383 signals that indicate the chamber pressure. Processor 50 compares the measured pressure value with set-point pressure values entered by operators (not shown), and determines the necessary adjustment of throttle valve 333 that is required to maintain the desired pressure within chamber 15. Processor 50 relays an adjustment signal through a controller 385 to a drive motor (not shown), which adjusts throttle valve 373 to a proper setting corresponding to the set-point pressure value. Suitable throttle valves for use with the present invention are described in commonly assigned, co-pending application Ser. No. 08/672,891 entitled "Improved Apparatus and Methods for Controlling Process Chamber Pressure" (Attorney Docket Nos. 891/DCVD-II/MBE), filed Jun. 28, 1996, the complete disclosure of which is incorporated herein by reference.

Isolation valve 371 may be used to isolate process chamber 15 from the vacuum pump to minimize the reduction of chamber pressure due to the pumping action of the pump. Isolation valve 371, together with throttle valve 373, may also be used to calibrate the mass flow controllers (not shown) of CVD apparatus 10. In some processes, liquid dopants are vaporized, and then delivered into process chamber 15 along with a carrier gas. The mass flow controllers are used to monitor the flow rate of the gas or liquid dopants into the chamber 15. During calibration of the MFCs, isolation valve 371 restricts or limits the gas flow to throttle valve 373 to maximize the pressure increase in chamber 15, which facilitates MFC calibration.

D. Heater/Lift Assembly

Referring to FIGS. 9–15B, heater/lift assembly 30 will now be described in detail. The heater/lift assembly 30 functions to lift the wafer into the processing position within vacuum chamber 15 and to heat the wafer during processing. At the outset, it should be noted that heater/lift assembly 30 may be modified for use, or directly placed into, a variety of processing chambers other than the exemplary SACVD chamber described and shown herein. For example, heater/lift assembly 40 may be used in a similar CVD chamber that generates plasma with RF or microwave power, a metal CVD (MCVD) chamber, or other conventional or non-conventional semiconductor processing chambers.

Figure 9:
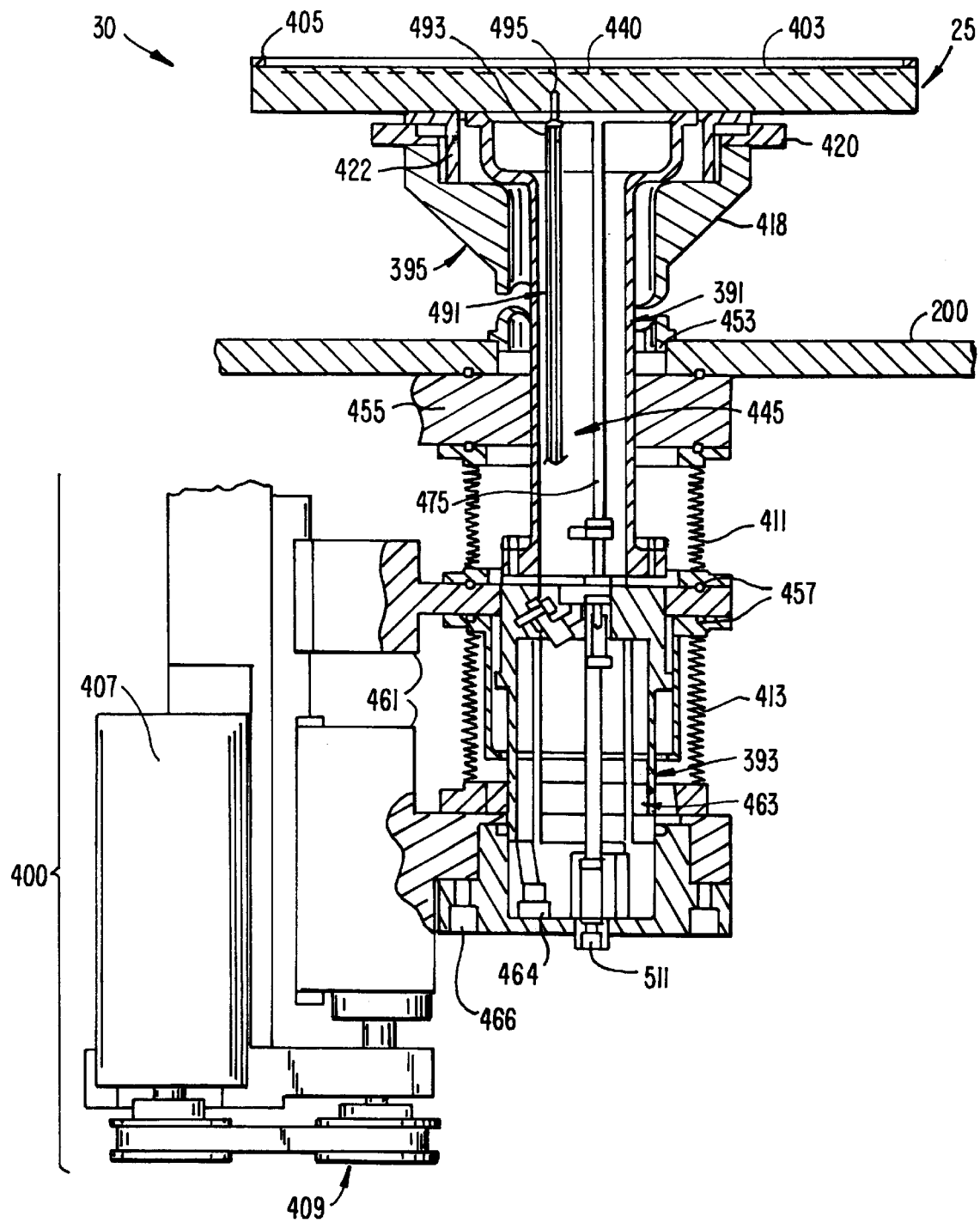
FIG. 9 is a vertical cross-sectional view, partially schematic, of a heater/lift assembly, according to an embodiment of the invention.
Figure 13:
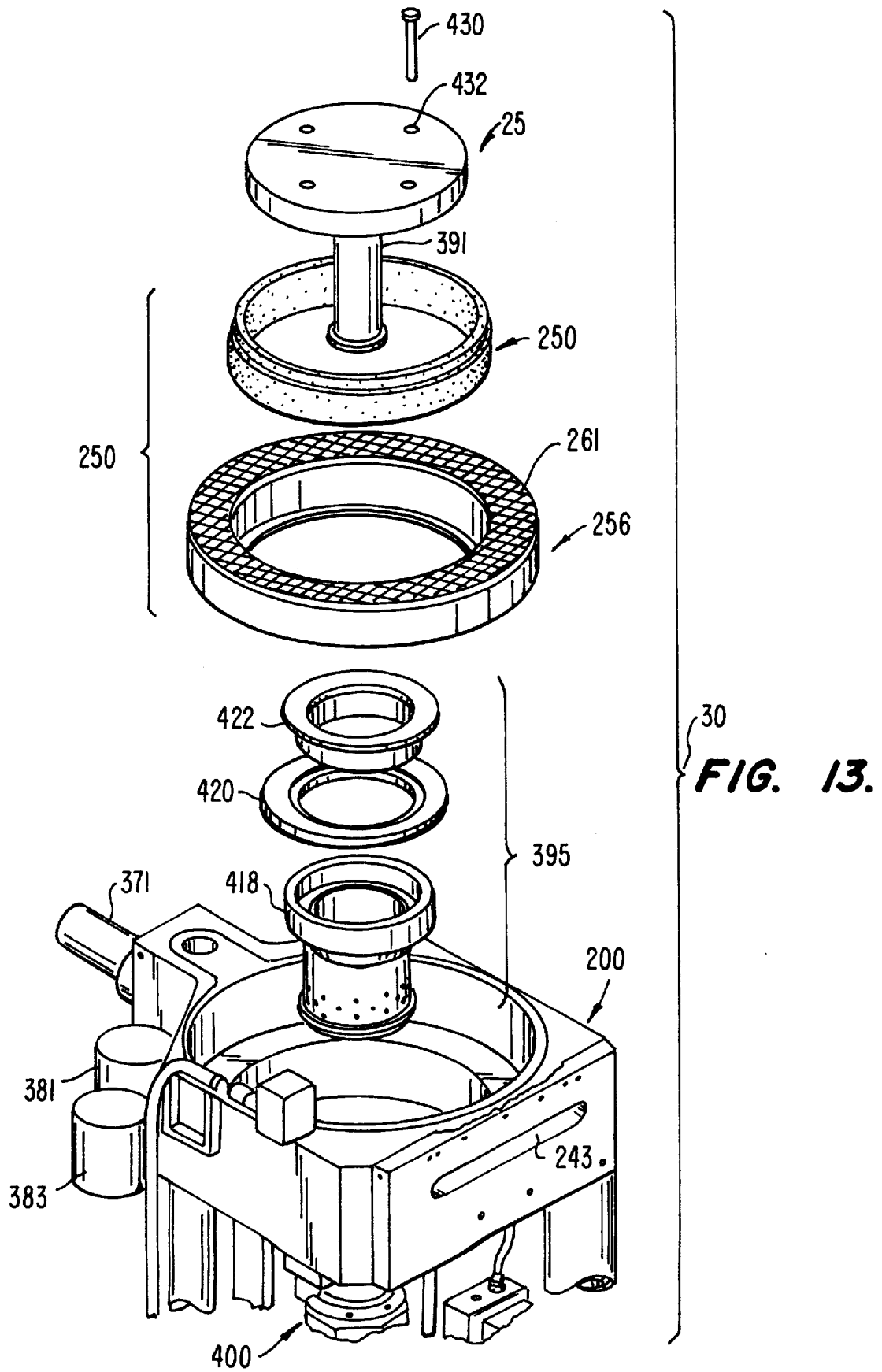
FIG. 13 is an exploded view of the heater/lift assembly of FIG. 9.

Referring to FIGS. 9 and 13, heater/lift assembly 30 generally includes a resistively-heated wafer support pedestal or heater 25 attached to upper and lower support shafts 391, 393, a lift tube 395 circumscribing support shafts 391, 393 underneath heater 25 and a drive assembly 400 for vertically moving the heater 25, shafts 200, 201 and lift tube 202 within chamber 15. As discussed in detail below, heater 25 (and the wafer supported thereon) can be controllably moved between a lower loading/unloading position where they are substantially aligned with slot 243 in enclosure assembly 200 and an upper processing position beneath gas distribution plate 20 (FIGS. 3 and 4). As shown in FIG. 7, heater 25 includes an upper wafer support surface 403 surrounded by an annular raised perimeter flange 405 so that the wafer is accurately located during processing. Wafer support surface 403 has a diameter approximately equal to the diameter of wafer W at the deposition temperature, e.g., at a temperature ranging from about 200–800° C. This diameter will typically be about 6–8 inches (about 150–200 mm) for large size wafers and about 3–5 inches (about 75–130 mm) for small size wafers. Of course, other wafer sizes such as those with about 12 inch (about 300 mm) diameters would be within the scope of the invention with appropriate modification of the chamber, the chamber lining 250, and support heater 25.

Support heater 25 preferably comprises a disk made from a process-compatible material that is capable of withstanding relatively high processing temperatures, i.e., up to 600–800° C. or higher. The material should also be resistant to deposition from the reactive chemistries associated with the high temperature deposition, as well as resistant to etching by the radicals in the clean gas. Suitable materials for heater 25 are ceramics, such as aluminum nitride, aluminum oxide or the like. Aluminum nitride ceramic is the preferred material for the heater 25 because it has high thermal conductivity, excellent corrosion resistance, and excellent tolerance of thermal shock. Thus, in a particularly preferred embodiment, the entire outer surface of heater 25 comprises aluminum nitride. Aluminum nitride has high temperature capabilities and high resistance to fluorine and ozone chemistries used in chamber 15. Use of aluminum nitride, as compared to stainless steel or aluminum materials, for heater 25 also has less backside metal contamination in the processed wafer, resulting in more reliable devices. In addition, aluminum tends to react with the fluorine containing compounds typically used in cleaning gases to form a layer of an aluminum fluoride compound that may eventually build-up and flake off into the chamber or onto the wafer, resulting in contamination (discussed in further detail below). Constructing the heater 25 of aluminum nitride effectively eliminates this problematic reaction during cleaning.

Referring again to FIG. 7, drive assembly 400 may include a variety of driving mechanisms, including a pneumatic cylinder, controllable motor or the like. Preferably, a stepper motor 407 coupled to the heater via a suitable gear drive 409 operates to vertically drive heater 25, shafts 391, 393 and lift tube 395 in controlled increments between the loading/unloading and processing positions. Drive assembly 400 also includes upper and lower bellows 411, 413 attached between the end of shaft 391 and the bottom of the processing chamber to allow for substantially free vertical movement of heater 25. In addition, bellows 411, 413 allow some angular movement to ensure that the gas distribution faceplate 20 and the heater 25 are substantially parallel during processing.

Referring to FIGS. 4, 9 and 13, lift tube 395 surrounds the lower portion of upper shaft 391 and assists in insulating upper bellows 411 from thermal energy radiating from shaft 391, heater 25 and the inside of processing chamber 15. Lift tube 395 usually comprises an aluminum shaft 418, an annular strike plate 420 resting on the upper surface of shaft 418 and an annular flange 422 that mounts plate 420 to shaft 418. Flange 422 and strike plate 420 are preferably formed from a material capable of withstanding high temperatures, such as aluminum nitride or aluminum oxide ($Al_2O_3$ in its ceramic or alumina form). Flange 422 and strike plate 420 insulate the aluminum shaft 418 from the heater to minimize warping or fusing of shaft 418 to heater shaft 391 or to the process chamber. In an exemplary embodiment, lift tube 395 includes a spring (not shown), such as a wave spring, loaded between flange 422 and strike plate 420 to prevent or at least inhibit rattling of the strike plate 420.

As shown in FIGS. 4 and 13, a plurality of wafer-support/lift fingers 430, usually at least two and preferably four, are slidably mounted within guide studs 432 spaced about the periphery of heater 25. Fingers 430 extend downward below heater 25 so that strike plate 420 may engage fingers 430 and lift them above the upper surface of heater 25 for loading and unloading wafers. Lift fingers 430 are preferably made of a ceramic material, such as aluminum oxide, and generally have a double truncated cone shaped head (not shown) The four lift finger guide studs 432 are preferably not uniformly distributed about the heater 25, but instead form a rectangle having at least one side that is wider than the width of the robot blade, which is typically a thin, flat bar (not shown), around which the lift fingers 430 must lift the wafer. The bottom end of the lift fingers 430 are rounded. The fingers 430 have a relatively thick diameter of about 100–200 mil, preferably about 150 mil, and a relatively short length of about 1–3 inches, preferably 2 inches, to minimize finger binding to the heater during processing.

In use, the robot blade (not shown) transfers the wafer to the chamber 15 when the heater 25 is in position opposite slit 243 (or actually just below slit 243). The wafer is supported initially by lift fingers 430, which are lifted above heater 25 with strike plate 420. As lift fingers 430 rise along with heater 25, they encounter a stop (not shown). As heater 25 continues to rise to the processing position opposite gas distribution faceplate 20, lift fingers 430 sink into guide studs 432 within heater 25 and the wafer is deposited onto wafer support surface 403 within annular flange 405. To remove the wafer from chamber 15, the above steps are performed in reverse.

Referring again to FIG. 9, a resistive heater coil assembly 440 is housed within heater 25 for transferring heat to the wafer during processing. Upper and lower support shafts 391, 393 support the heater 25 and house the necessary electrical connections to the heater coil assembly 440 within a hollow core 445 (discussed below). Upper support shaft 391 is made of a ceramic material capable of withstanding relatively high processing temperatures. Preferably, shaft 391 will be fabricated from diffusion-bonded aluminum nitride, which prevents deposition onto, as well as attack by chemistries used in chamber 15 of, the electrodes and electrical connections within shaft 391 that might otherwise occur if the aluminum nitride were not present. Shaft 391 is preferably diffusion-bonded to heater 25 to provide a gas-tight seal between heater 25 and shaft 391 such that the hollow core 445 of shaft 391 is at ambient temperature and pressure (preferably atmospheric pressure, i.e., 760 torr or 1 atm). In other embodiments, hollow core 445 may be at a pressure of about 0.8–1.2 atm and a temperature of about 10–200° C., while chamber 15 may be at temperatures of at least about 400° C. and pressures of about 20 mtorr to about 600 torr. This configuration helps to protect the electrodes and other electrical connections from corrosion from the process and clean gases within chamber 15. In addition, maintaining the hollow core 445 of shaft 391 at ambient pressure minimizes arcing from the RF power source through hollow core 445 to power leads or the aluminum shaft. This arcing that might otherwise occur in a vacuum is thus avoided.

Figure 10:
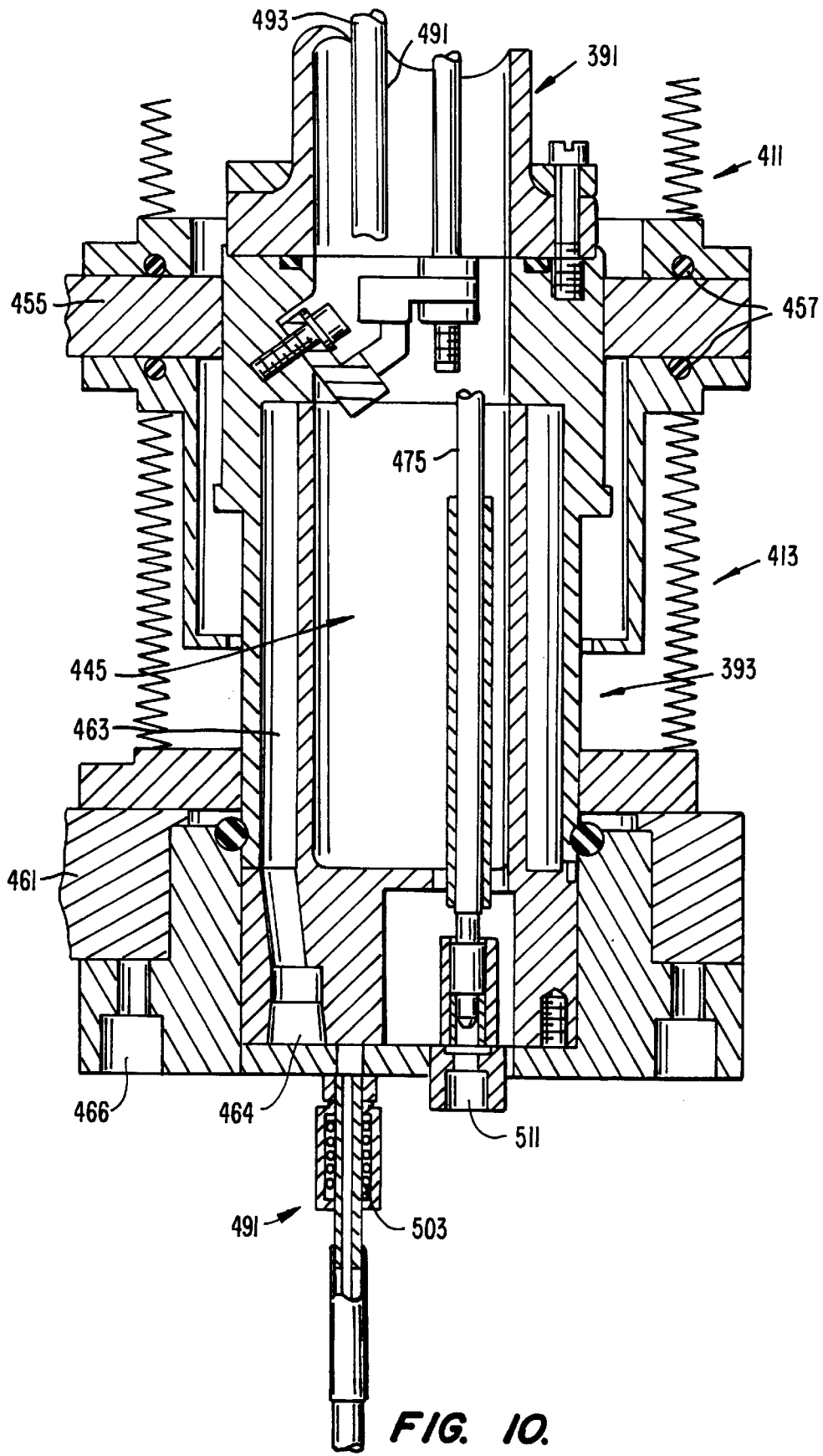
FIG. 10 is an enlarged cross-sectional view of a bottom portion of the heater/lift assembly of FIG. 9.

Referring to FIGS. 9 and 10, upper support shaft 391 extends through an opening 453 in the lower surface of enclosure assembly 200, and is coupled to a base 455 that provides a gas seal between shaft 391 and chamber 15. Upper support shaft 391 is fastened, e.g., bolted, to lower support shaft 393, which comprises a suitable process-compatible material, such as aluminum or an aluminum alloy. Lower support shaft 393 is preferably a water-cooled aluminum shaft. However, lower support shaft 393 may also comprise a ceramic material, such as aluminum oxide or aluminum nitride. One or more sealing members 457, e.g., O-rings, are positioned between shafts 391, 393 to maintain the gas seal between core 445 and chamber 15. As shown in FIG. 9, lower support shaft 393 is mounted to a vertically movable support 461 on drive assembly 400 for moving the shafts 391, 393 and heater 25 between the loading and processing positions. Shaft 393 defines an inner coolant channel 463 passing around the electrical connections to further insulate these connections from the high temperature of the shaft. Coolant channel 463 has an inlet 464 and an outlet 466 coupled to water connections 217, 219, respectively, of liquid cooling system 215. Coolant channel 463 serves to maintain a relatively low temperature in the lower chamber area to protect sealing member(s) 457. In an alternative embodiment, heater assembly 30 comprises a single shaft (not shown) that supports heater 25 and extends through the lower opening 453 in enclosure assembly 200. In this alternative embodiment, sealing members 457 would not be used.

Figure 11:
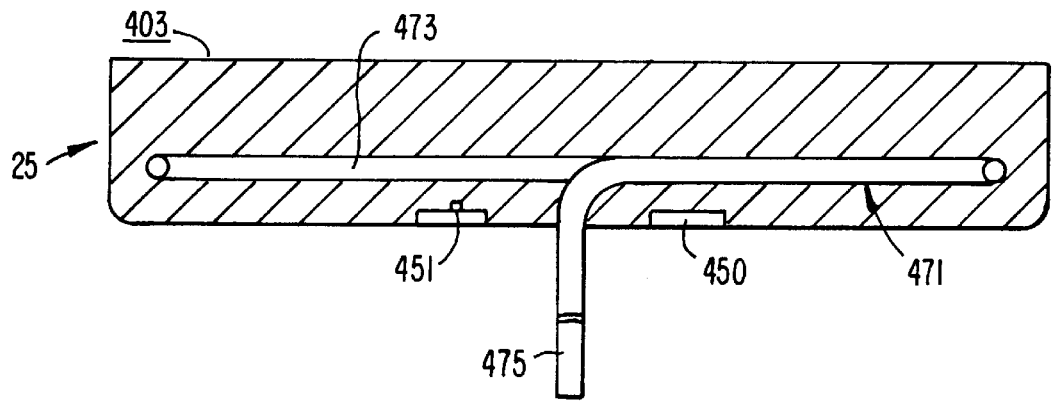
FIG. 11 is a side cross-sectional view of a pedestal/heater of the assembly of FIG. 9, according to an embodiment of the invention.
Figure 12:
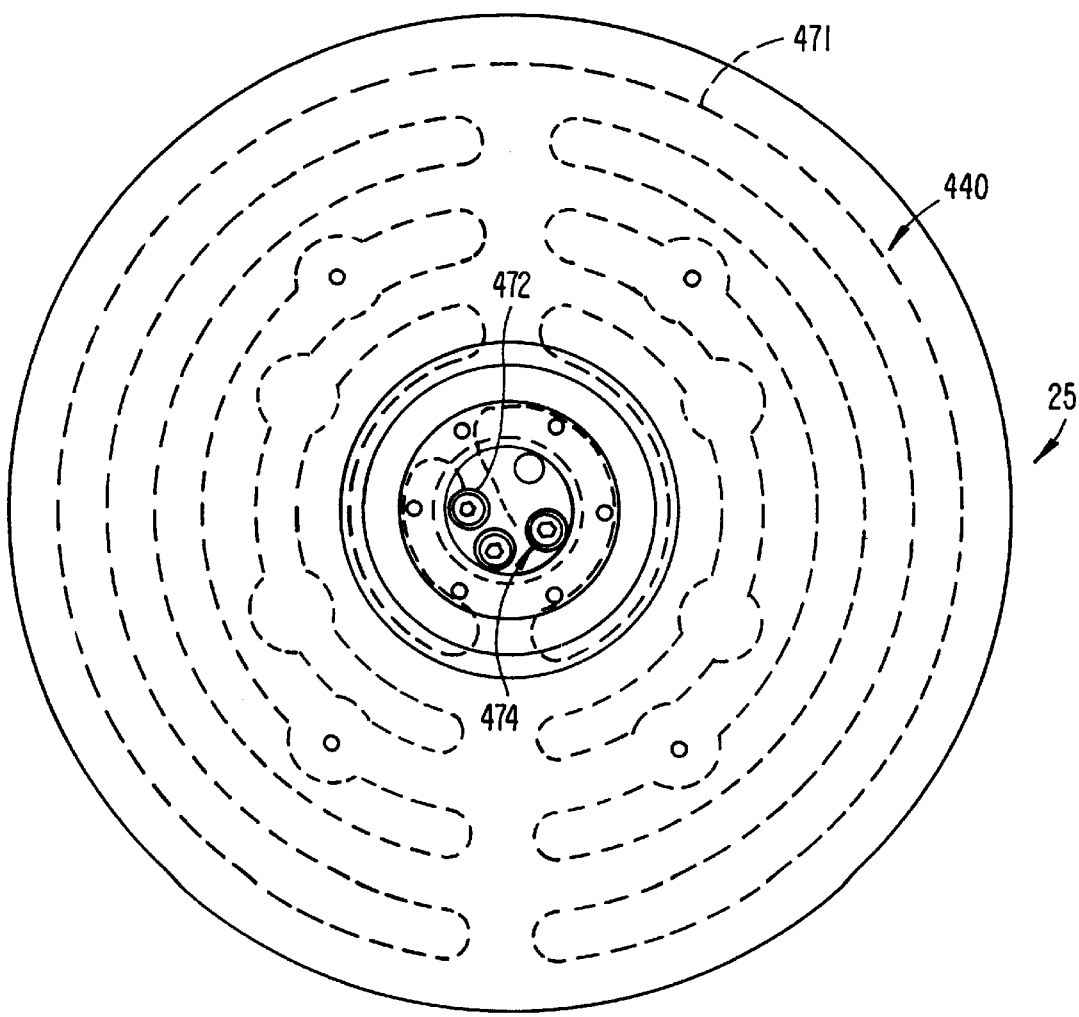
FIG. 12 is a bottom view of the pedestal/heater, illustrating a heater coil.

Heater coil assembly 440 is configured to provide a temperature of at least about 200–800° C. in chamber 15 at a rate of about 20° C./min. Referring to FIGS. 11 and 12, heater coil assembly 440 includes a heater coil 471 embedded into the ceramic heater 25. The routing of the heater coil 471 embedded in the heater base 25 preferably provides a single coil 471 that begins at one electrical contact 472 near the center of heater 25, runs back and forth along one side of heater 25 towards its perimeter, extends to the other side of heater 25, and then runs back and forth toward the center of heater 25 to a second electrical contact 474. This loop pattern provides heating to maintain a generally uniform temperature across the width of the plate while allowing for heat losses. Preferably, heater coil 471 will provide a uniform temperature distribution of at least about +/−2° C. at 400° C. and at least about +/−8° C. at 600° C. across wafer support surface 403 of heater 25. In an exemplary embodiment, heater coil 471 will have a greater power density near the center of heater 25 to reduce the thermal gradient from heater shaft 391.

Figure 14:
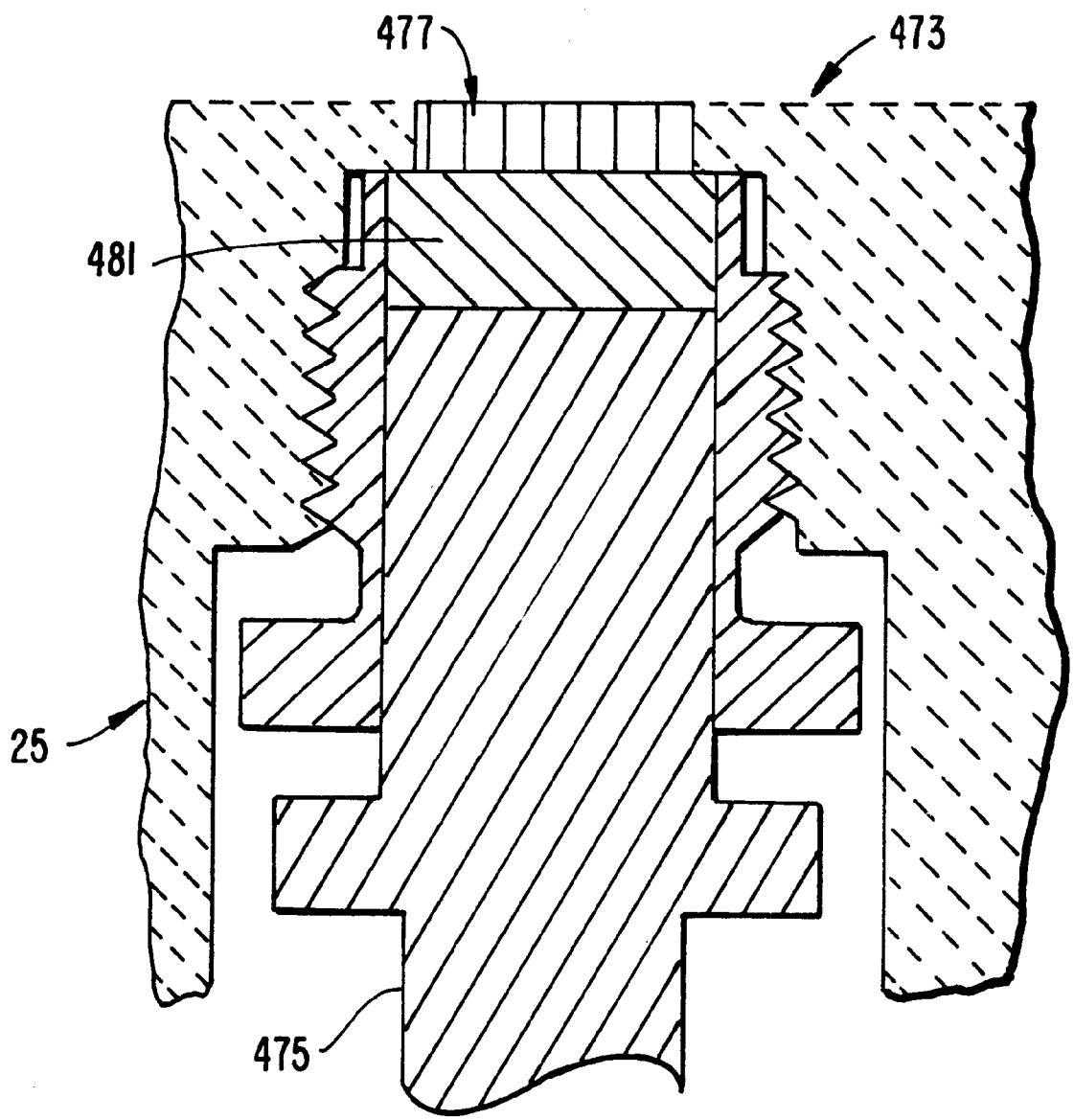
FIG. 14 is an enlarged view of one of the electrical connections within the pedestal/heater of FIG. 10.

As shown in FIG. 14, heater coil assembly 440 preferably includes an embedded RF mesh ground plane electrode 473 connected to a plurality of conductor lead wires 475 which extend through shaft 341 to a suitable electrical energy source. Mesh ground plane element 473 is a molybdenum mesh electrode which provides the ground path and plasma resistance in embodiments where plasma processes are used. Lead wires 475 preferably comprise a conductive material that can withstand relatively high process temperatures, such as nickel, copper or the like. In an exemplary configuration, lead wires 475 are each nickel wires coupled to electrode 473 by a metal insert 477 that is co-sintered into electrode 473 to avoid brazing between ceramic and metal. Inserts 477 preferably comprise a material with a relatively close thermal expansion match to aluminum nitride, such as molybdenum. As shown, the molybdenum inserts 477 are each fastened, e.g., brazed, to a molybdenum plug 481, which is then brazed to lead wire 475. All of the wires of the heater coil, whether primarily resistive or primarily conductive, are sheathed in the continuous insulating coating (such as described above) which tolerate high temperatures so as to withstand casting of the aluminum nitride heater body.

Figure 15A:
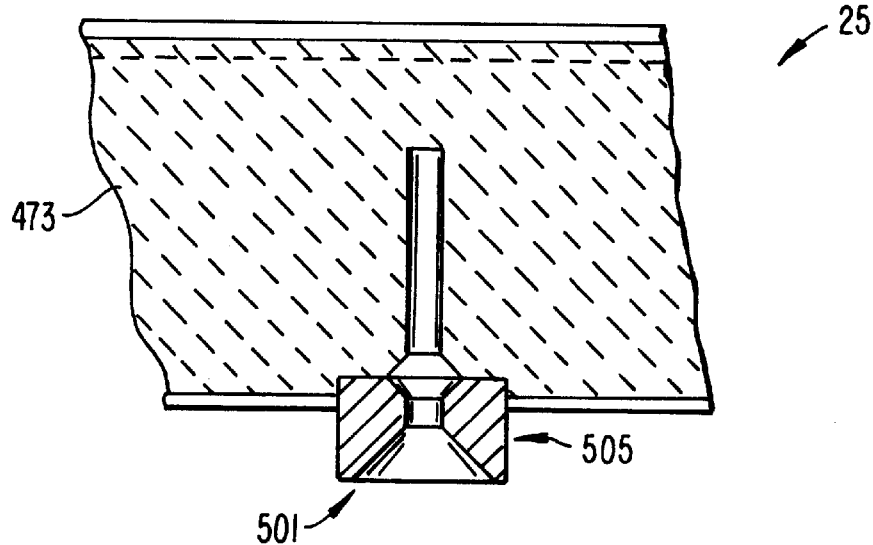
FIGS. 15A and 15B illustrate a hole within the pedestal/heater for receiving a thermocouple and the thermocouple, respectively.
Figure 15B:
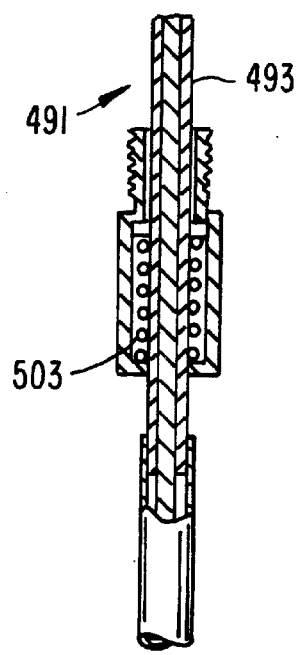

Referring to FIGS. 9, 15A and 15B, heater/lift assembly 30 includes at least one thermocouple 491 for determining the temperature of heating coil 471. Thermocouple 491 includes an elongate tube 493 having a sensor 495 (FIG. 9) inserted and held in contact with the underside of heater 25 at a distance of about 0.25 inch from the bottom of the wafer. To that end, heater 25 includes a thermocouple guide 501 (FIG. 15A) brazed to heater element 473 for connecting sensor 495 of thermocouple 491 to element 473. The thermocouple 491 is held in place by a slight spring force from a compression spring 503 (FIG. 15B), and provides a control signal for the temperature controller (not shown). Sensor 495 is preferably disposed in a well 505 which is at atmospheric pressure, which enhances the heat transfer between the heating element 473 and the thermocouple 491 to provide a more accurate reading. The temperature controller is a recipe-driven proportional integral differential (PID) controller which anticipates the recipe steps which are about to occur and alters the response characteristic of the heater to maintain a uniform temperature profile. A vacuum seal and ground connection for the lower support shaft 393 is made along the side surface of shaft 393 (not shown) and connections to heater wire ends 511 and the thermocouple tube end 513 are made at atmospheric conditions.

When the present invention is in use, a robot blade (not shown) transfers the wafer to the chamber 15 when the heater 25 is in position opposite slit 243 (or actually just below slit 243). The heater 25 and wafer are lifted into the processing position by drive assembly 400 and lift fingers 430 sink into guide studs 432 within heater 25 so that the wafer is deposited onto wafer support surface 430 within annular flange 405 of heater 25 (FIGS. 4, 9 and 10). Process gases, such as TEOS and 03, are directed through gas passages 83, 85 and mixed together in mixing area 93 of gas mixing box 273 (see FIGS. 3 and 6A–6C). The mixed gas is then delivered through inner passage 295 of inlet tube 43 and through central hole 327 of base plate 265 into chamber 320 above gas dispersion plate 301, where it disperses outward and flows through holes 325 into chamber 317 above gas distribution plate 20 (see FIGS. 4 and 5). Preferably, the gas is uniformly distributed through gas distribution holes 315 onto the semiconductor wafer (not shown).

The temperature of the wafer on heater 25 is typically held above a minimum deposition temperature by heater coil assembly 440 so that the process gases will react together at the wafer surface and deposit a layer thereon. Specifically, an electric current is directed through conductor wires 457 to resistive coil 473 to heat the wafer to a temperature of about 200–800° C., according to specific embodiments. In the preferred embodiment, the temperature is controlled by a feedback control system (described above for heater control subroutine 167) that maintains the ramp rate based on the current temperature in the chamber. During this process, inner lid assembly 230 receives heat from various sources including the gases passing therethrough, the heated semiconductor wafer, and the wafer heating source. To maintain the components of lid assembly 230 below the minimum deposition temperature and thereby avoid gas reactions and deposition on these components, a coolant liquid is introduced into coolant channel 93 to remove heat from base plate 265 and gas distribution and dispersion plates 20, 301.

During the deposition process, the vacuum pump is activated to generate vacuum pressure within pumping channel 40, thereby drawing the process gases and plasma residue out of processing chamber 15 through channel 40 and exhaust port 361 (FIGS. 4 and 8). In addition, purge gas may be directed generally upward into processing chamber 15 through the gap between susceptor 25 and inner portion 253 of liner 250. The purge gas minimizes leakage of process gas into the lower portion of apparatus 10 and facilitates the removal of the process gas through port 361.

E. Integral remote microwave plasma system

Figure 16:
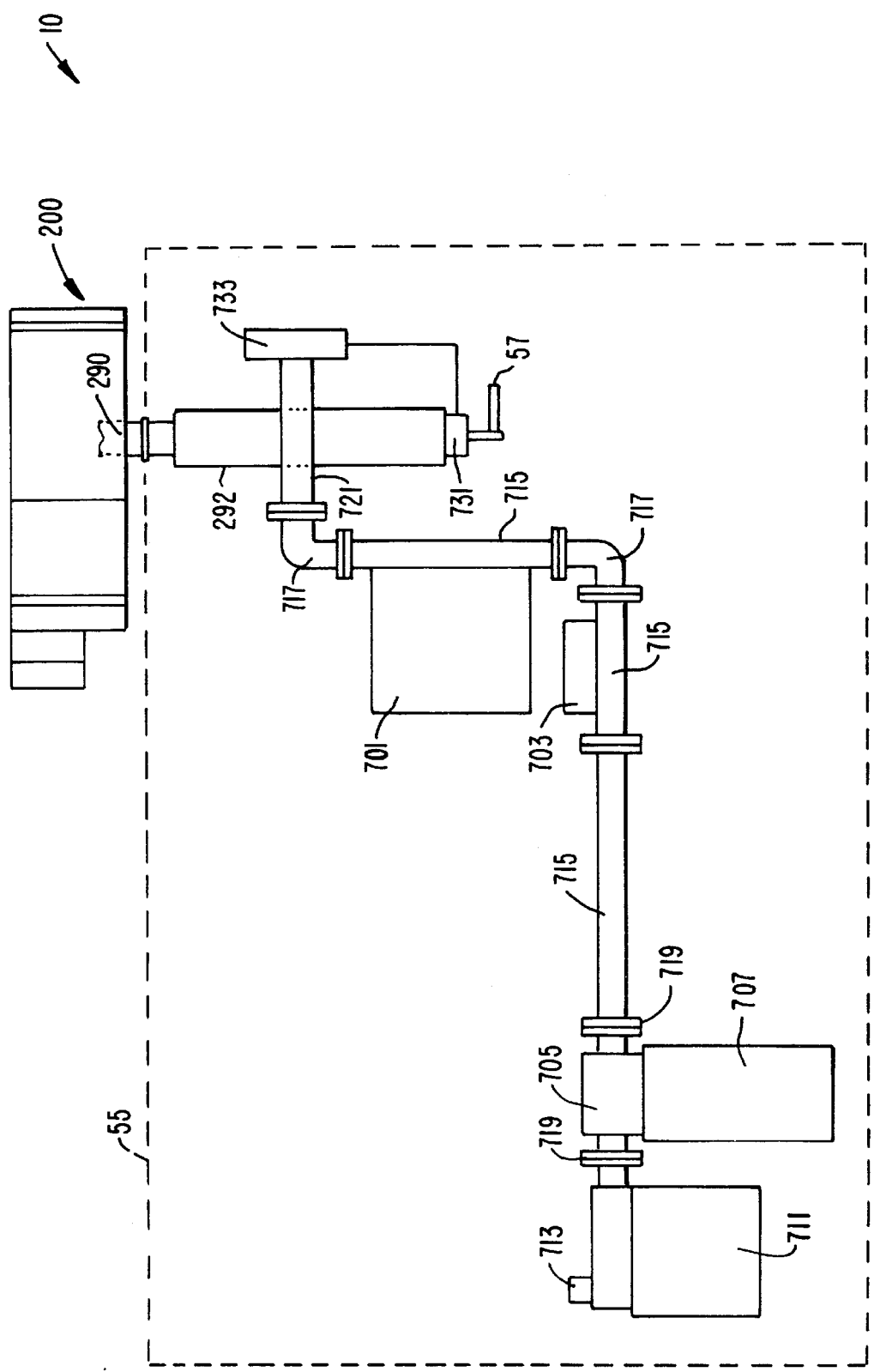
FIG. 16 is a simplified diagram of a remote microwave plasma system for cleaning the wafer and/or the process chamber, in accordance with an embodiment of the present invention.

FIG. 16 is a simplified diagram of a remote microwave plasma system 55 for cleaning the wafer and/or the process chamber, in accordance with an embodiment of the present invention. Microwave plasma system 55 produces a plasma remote from processing chamber 15 for use in efficiently etching or cleaning a wafer in chamber 15 and/or components of chamber 15, and possibly for use in depositions. Microwave plasma system 55 includes applicator tube 292 ; a plasma ignition system (described below); a microwave waveguide system (described below); optimizing elements including an impedance matching system 701 which may include an optional phase detector 703 for embodiments requiring feedback for automatic impedance matching, and a circulator 705 with a load 707 ; and a magnetron 711.

Magnetron 711 is a typical magnetron source capable of operating between about 500–2500 Watts for continuous wave (CW) or pulsed output of microwaves of about 2.45 Gigahertz (GHz) frequency. Magnetron 711 is powered by power supply 110 (shown in FIG. 1C) which may be remotely located from magnetron 711. Of course, other magnetrons may be utilized as well. Microwaves from magnetron 711 are transmitted to the microwave waveguide system, which includes various lengths of straight and curved waveguide sections 715, 717 which may be connected together at joints 719. Interspersed within the waveguide system are optimizing elements that work to provide low loss, maximum microwave transmission with minimized reflection losses and to protect the magnetron from damage due to reflected power. The description below follows the desired direction of microwaves from magnetron 711 toward applicator tube 292.

In a specific embodiment, microwave plasma system 55 has magnetron 711 connected to circulator 705 with load 707, as shown in FIG. 16. Circulator 705 allows only forward microwave transmission from magnetron 711 toward applicator tube 292. Load 707 absorbs any power that might be reflected back from the waveguide system toward magnetron 711. Circulator 705 and load 707 thereby direct microwaves in the forward direction and protect magnetron 711 from damage from reflected power. Circulator 705 connects to waveguide section 715 that is connected to phase detector 703 connected to another waveguide section 715. Phase detector 703, if utilized, is coupled via curved waveguide section 717 to another waveguide section 715 having attached tuning or matching system 701. Tuning system 701, which may use stub tuners or other tuning elements, provides plasma microwave system 55 with the ability to match the load at waveguide section 721 to 50 Ω, the characteristic impedance of the waveguides. Tuning system 701 may provide fixed tuning, manual tuning, or automated tuning, according to specific embodiments. For embodiments using automated tuning, phase detector 703 is a 3-diode array which detects the phase of microwaves transmitted for feedback to matching system 701, which intelligently and dynamically matches the load appropriately. In the specific embodiment, waveguide sections have rectangular cross-sections, but other types of waveguide also may be used.

As seen in FIG. 16, microwaves directed through the optimized waveguide system are transmitted from output waveguide section 721 to applicator tube 292, where a plasma is created. Applicator tube 292 has an input feed line 57 that receives reactive gases that are energized by microwaves from magnetron 711 via the waveguide system and other optimizing elements. Applicator tube 292 is a circular (or other cross-section) tube made of a composite or ceramic material, preferably alumina, or other material resistant to etching by radicals in the plasma, according to a specific embodiment. In the specific embodiment, applicator tube 292 has a length of about 18–24 inches and a cross-sectional diameter of about 3–4 inches. Applicator tube 292 is disposed through waveguide section 721, which is open at one end for transmitting microwaves and is terminated at the other end with a metal wall. Microwaves are then able to be transmitted through the open end of waveguide section 721 to reactive gases inside applicator tube 292, which is transparent to microwaves. Of course, other materials such as sapphire also may be used for the interior of applicator tube 292. In other embodiments, applicator tube 292 may have a metal exterior and an interior made of a composite or ceramic material and microwaves in waveguide section 721 enter a window through the exterior of applicator tube 292 to the exposed interior of tube 292 to energize the reactive gases.

In the specific embodiment, a plasma may be ignited by plasma ignition system which includes an ultraviolet (UV) lamp 731 and a UV power supply 733, which may optionally be mounted on the metal wall of waveguide section 721. Of course, UV power supply 733 may be mounted in various other locations besides on the metal wall. Powered by UV power supply 733, UV lamp 731 provides the initial ionization of the plasma within applicator tube 292. Microwave energy then sustains the ionization of the ignited plasma to produce the flow of radicals that enter inlet 290 leading to chamber 15 via gate valve 280. Due to changes in load within applicator tube 292 from the introduction and ionization of reactive gases within tube 292, use of matching system 701 optimizes the microwave energy coupling for efficiency. In preferred embodiments, matching system 701 includes at least one stub tuner under the control of processor 50 or a controller unit for automated tuning. As mentioned above, other conventional tuning elements also may be used in matching system 701.

As discussed above, applicator tube 292 is mounted from and connected to the bottom of the body of chamber 15 such that applicator tube 292 outputs plasma radicals into inlet 290 of enclosure assembly 200, as seen in FIG. 3. Radicals are input through inlet 290 into the passage in enclosure assembly 200 which is equipped with liner 291, preferably made of polytetraflouroethylene (PTFE). PTFE, which is commercially available, for example, as Teflon™ PTFE is resistant to etching or deposition from the reactive chemistry input at inlet 290. Liner 291 prevents fluorine radical recombination in the passage during clean processes. In addition to PTFE, liner 291 also may be made of any fluorinated material including fluorinated polymers such as PFA (which is a polymer combining the carbon-fluorine backbone of polytetrafluouroethylene resins with a perfluoroalkoxy side chain), fluorinated ethylene-propylene (TFE), or the like. The passage is preferably circular in cross-section or other type of cross-section to match the cross-section of inlet 290 and applicator tube 292. From this lined passage in enclosure assembly 200, plasma radicals flow into conduit 47 in clean gas manifold 270 to gate valve 280. Clean gas manifold 270 is also constructed of PTFE. PTFE is preferred for cleaning applications where fluorine radicals are produced in the plasma, since PTFE is resistant to etching by fluorine radicals. Of course, both clean gas manifold 270 and liner 291 may be made of other materials (such as those mentioned above for liner 291) which are resistant to the particular chemistry depending on the reactive gases used.

In some embodiments, gate valve 280 isolates the clean processes from the deposition processes, as discussed above. Gate valve 280 normally remains closed while chamber 15 is being used for deposition, reflow, or drive-in steps. In the closed position, gate valve 280 prevents particles in conduit 47 used for clean processes from contaminating the wafer during deposition processes, as well as reducing the "dead" volume of conduit 47 and passage during deposition. If deposition at pressures of between about 200–760 torr occurs with gate valve 280 open, deposition may be caused in applicator tube 292, leading to contamination of the cleaning processes. Gate valve 280 is preferably made of PTFE (or similar materials such as those discussed above for liner 291 and manifold 270) to minimize damage to or deposition onto the closed valve 280 due to the reactive chemistries from conduit 47. In a preferred embodiment, gate valve 280 is a particle-grade gate valve. In embodiments using gate valve 280, only when chamber 15 is used for a wafer cleaning step or when a chamber cleaning is performed does gate valve 280 open, allowing plasma radicals to flow into fluid passage 293 of gas mixing box 273, as seen in FIG. 3. As mentioned above, in some embodiments gate valve 280 is not used at all. The plasma radicals then may flow through annular passage 295 and into chamber 15 via gas distribution plate 20. Distribution plate 20 as well as various parts of chamber 15 are thus cleaned. Residues and used cleaning gases are then exhausted from chamber 15 with the exhaust system discussed above. The cleaning process of chamber 15 and the cleaning of wafer surfaces are discussed in detail below.

F. Endpoint Detection System

FIGS. 17A–17D illustrate a cleaning endpoint detection system 800 for microwave plasma system 55 according to another aspect of the present invention. As discussed above, apparatus 10 preferably employs a thermal cleaning technique using remote microwave technology, instead of a conventional in situ plasma process, to lower metal contamination. In the present invention, the gentle cleaning technique using remote microwave plasma system 55 utilizes only chemical reactions, in contrast to using in situ plasma processes where physical sputtering effects may react with the aluminum in the chamber walls and lead to aluminum metal contamination in the processed wafer.

In the cleaning process using remote plasma system 55, the plasma is produced remotely from chamber 15 such that the etchant gas, preferably mostly of fluorine radicals, is directed into the chamber where the gentle thermal clean occurs, but the plasma remains exterior to the chamber (i.e., within applicator tube 292, see FIG. 16). While this process has a number of advantages for cleaning a wafer in chamber 15 and/or components of chamber 15 (discussed above), the lack of plasma in the chamber can make it difficult, using conventional endpoint detection systems, to pinpoint the time at which the cleaning has been completed, i.e., when the last process gas residue in the chamber has reacted with the cleaning etchant so that it can be discharged from the chamber. Conventional endpoint detection systems typically rely on the use of a plasma within the chamber and check emissions from the in situ plasma to determine the end of a cleaning process.

The endpoint detection system of the present invention, however, may be used with either an in situ plasma or a remote plasma, such as provided by microwave plasma system 55. For example, in one exemplary process, fluorine-based gas is used to react with $SiO_2$ powder residue in the chamber to form a $SiF_4$ gas, which is drawn out of chamber 15 with the vacuum pump. When substantially all of the $SiO_2$ in the chamber has been consumed, the fluorine-based gas cannot react with the $SiO_2$ to form $SiF_4$. Instead, the fluorine-based gas may begin to contaminate the chamber 15 or to react with, for example, the aluminum walls of the chamber to form an aluminum fluoride compound. Consequently, it is important to determine the approximate endpoint or the point at which the last $SiO_2$ residue has reacted with the fluorine gas so that gate valve 280 can be closed to prevent further fluorine radicals from entering chamber 15. As discussed further below, endpoint detection system 800 of the present invention determines the endpoint of a cleaning process by detecting changes in light intensity that occur due to absorbance of light by the exhausted clean gas reactants such as $SiF_4$.

Figure 17A:
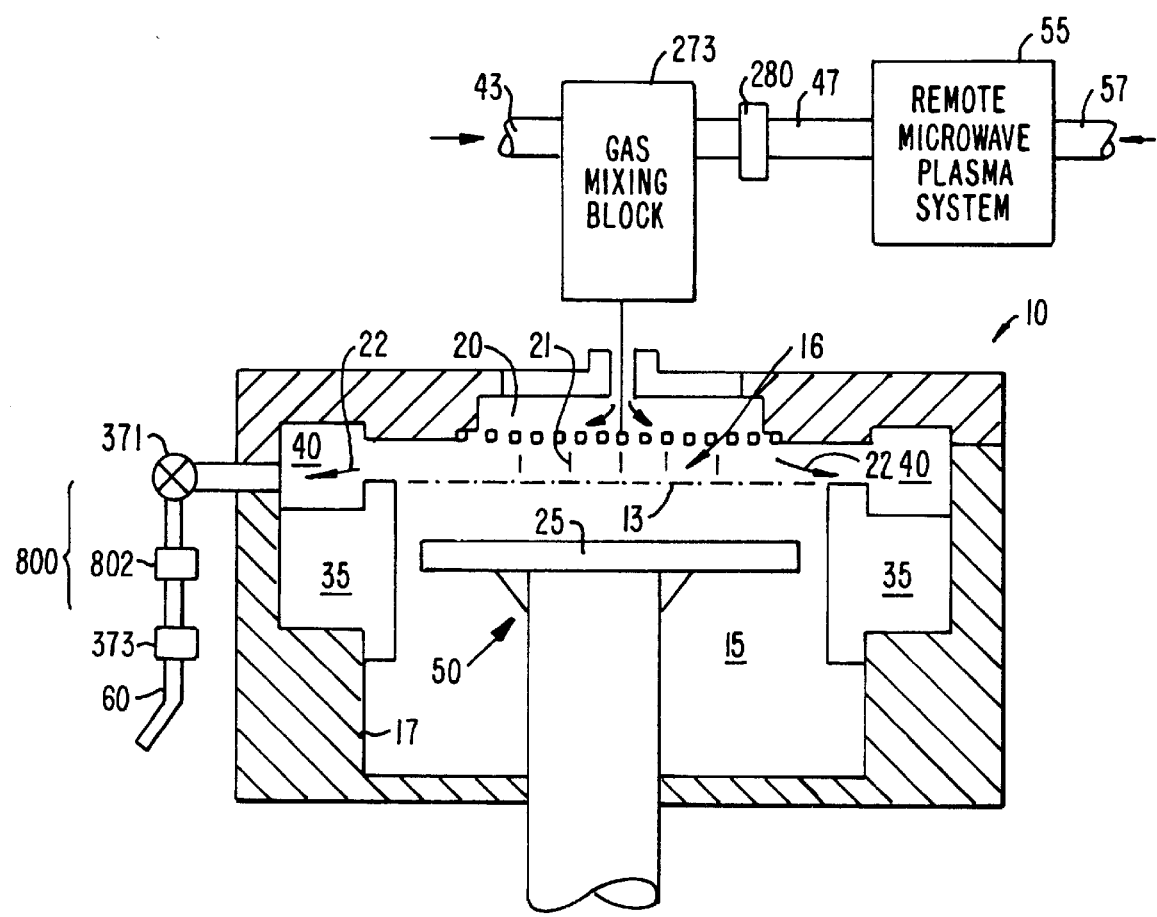
FIGS. 17A–17D are schematic diagrams of a cleaning endpoint detection system in accordance with an embodiment of the present invention.
Figure 17B:
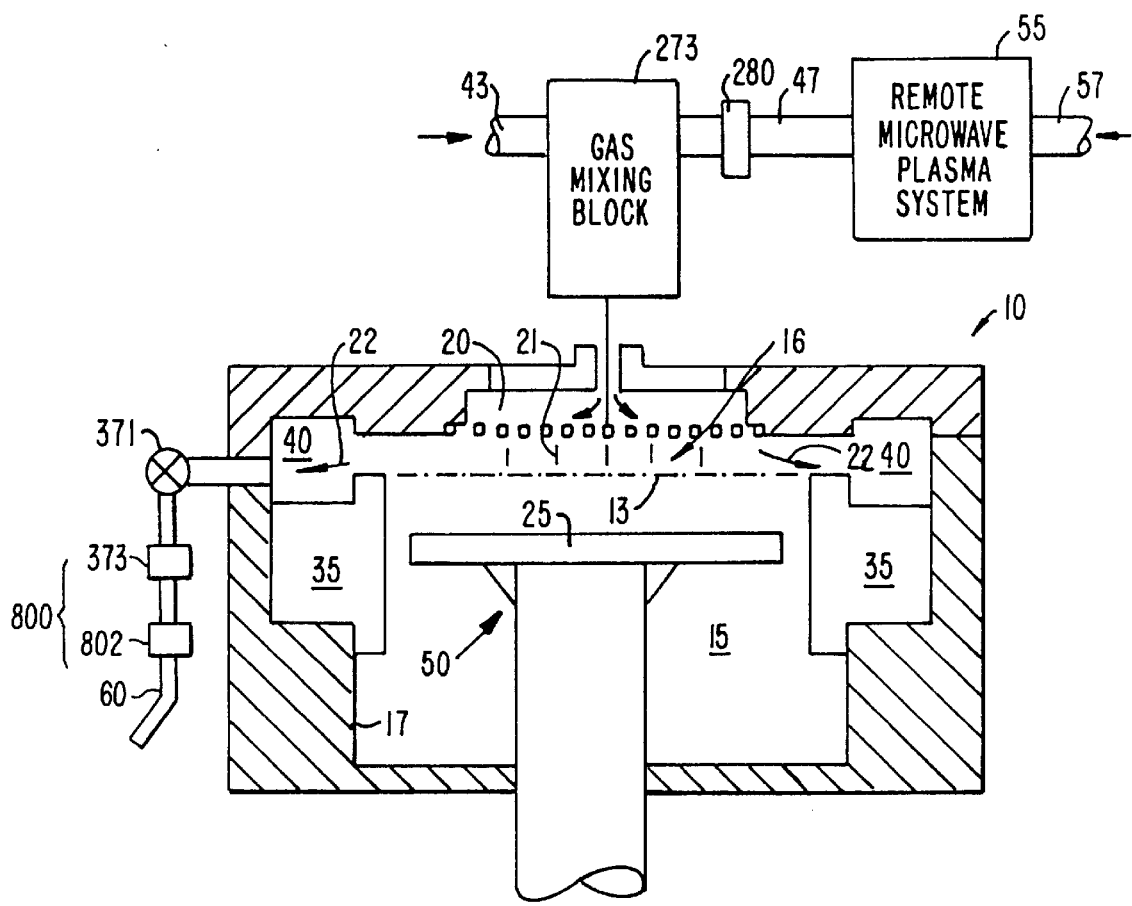
Figure 17C:
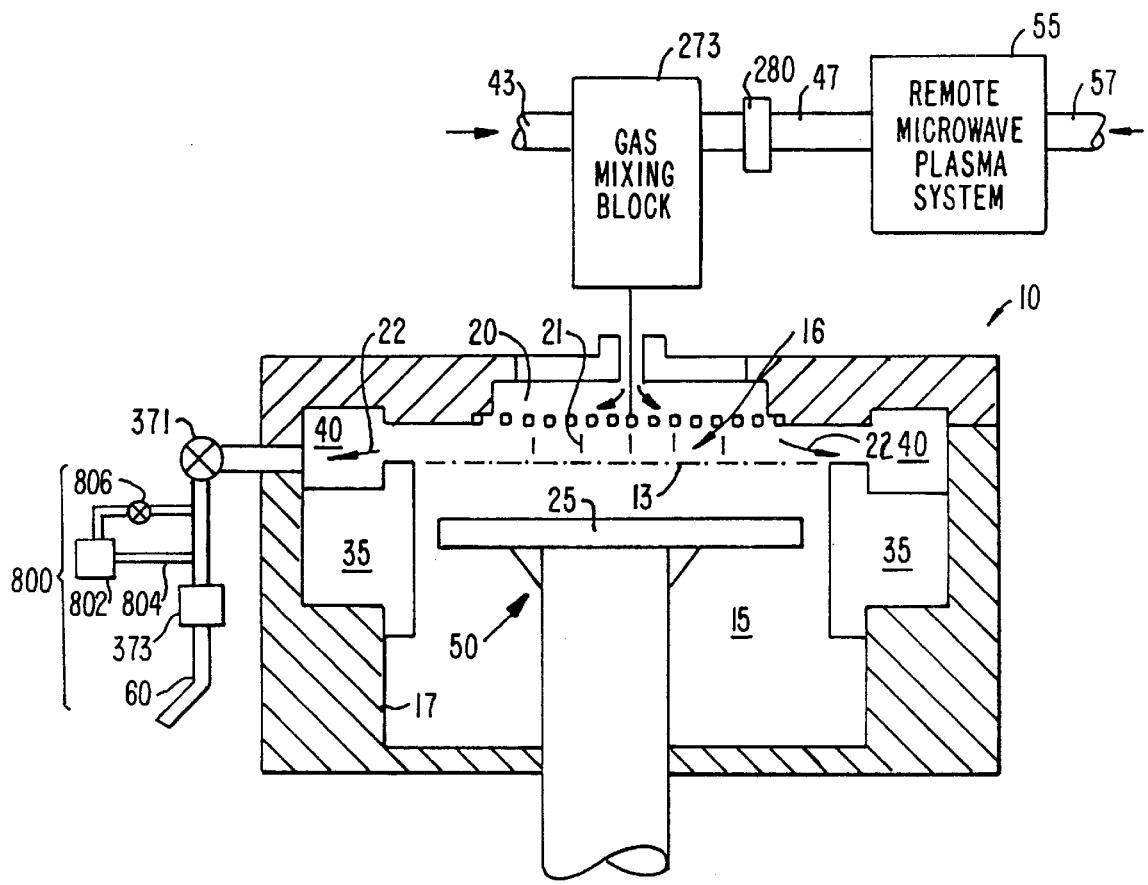

As shown in FIG. 17A, cleaning endpoint detection system 800 includes a gas detector 802 positioned along discharge conduit 60 between isolation valve 371 and throttle valve 373. Of course, gas detector 802 may be positioned in other locations within the exhaust system of apparatus 10. For example, detector 802 may be positioned downstream of throttle valve 373, as shown in FIG. 17B. In another embodiment, detector 802 is positioned along a bypass line 804 that receives a sample stream of gas from conduit 60, as shown in FIG. 17C. In this embodiment, bypass line 804 may include a control valve 806 to vary the amount of flow passing through line 804, or to completely cease gas flow along bypass line 804, for example, during gas processing of a wafer within the chamber.

Figure 17D:
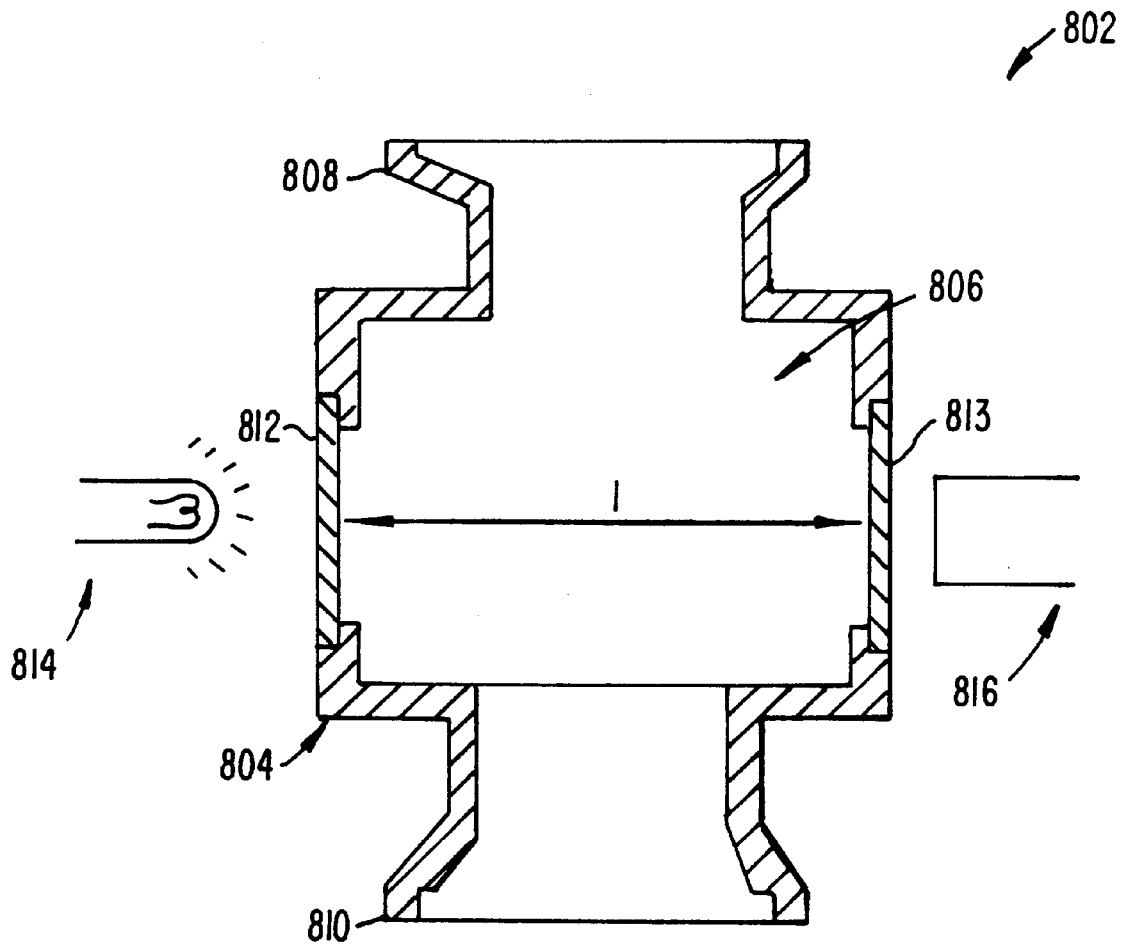

Referring to FIG. 17D, a preferred embodiment of gas detector 802 will now be described. As shown, detector 802 includes a housing 804 defining a through-hole 806 in communication with conduit 60 for allowing the gases and other residue from chamber 15 to pass therethrough. A pair of flanges 808, 810 preferably attach housing 804 to conduit 60. The side walls of housing 804 include a pair of infrared (IR) windows 812, 813 that are configured to allow far-IR light to pass through. Far-IR light has wavelength starting at about 10 μm. IR windows 812, 813 are spaced by a length L and preferably comprise a material substantially transparent to far-IR light such that zero or substantially little of the light is absorbed by windows 812, 813. In addition, the IR window 812, 813 material should be process-compatible, inert with respect to the process and clean gas chemistry, and the material should not contaminate the film. In embodiments where fluorine radicals are used for the cleaning process, windows 812 and 813 are resistant to fluorine. Preferred materials for IR windows 812, 813 include germanium, calcium fluoride, or the like.

As schematically shown in FIG. 17D, detector 802 further includes a far-IR lamp 814 suitably coupled to housing 804 for generating far-IR light and transmitting this light through windows 812, 813 so that the light passes through-hole 806. An IR detector 816 is coupled to housing 804 in position to receive and detect the far-IR light passing through window 813. Preferably, far-IR lamp 814 may be a tungsten lamp source with an optical notch filter.

When the present invention is in use, the clean gas reactants (e.g., $SiF_4$) are directed along conduit 60 and through-hole 806 of detector 802. Far-IR lamp 814 transmits far-IR light through window 812, through-hole 806 and window 813, where it is received by detector 816. As the light passes through the clean gas $SiF_4$ reactants, these reactants (i.e., the silicon) absorb a portion of the far-IR light, which reduces the light intensity received by detector 816. The fluorine does not absorb the far-IR light. Therefore, when the far-IR light intensity detected increases up to a reference value, detector 816 sends a signal to a controller (not shown) indicating that the concentration of $SiF_4$ passing through conduit 60 has substantially diminished or completely stopped, which indicates that the cleaning endpoint has arrived. At this point, the controller sends an appropriate signal to processor 50 to close gate valve 280 and to prevent further etchant gas from entering chamber. In the above exemplary clean process, endpoint detection system 880 utilizes source 814 to provide, and detector 816 to detect, far-IR wavelengths that can be absorbed by clean gas reactants $SiF_4$, which absorb light with a wavelength of about 10 μm, and fluorine, which absorbs light with a wavelength of about 5–6 μm. In other embodiments, source 814 and detector 816 can provide light at different wavelengths, depending on the light absorbance characteristics of the specific clean gas reactants utilized in the clean gas process.

By way of example, $I_o$ is the intensity of the far-IR light when no $SiF_4$ is flowing through conduit 60 and the detector 816 receives the full intensity from lamp 814. As $SiF_4$ flows through through-hole 806 during cleaning, the far-IR light is absorbed and the intensity received by detector 816 (I) is reduced, given by the expression:

$$I/I_o = \exp(-X*L*C)$$

where X is the extinction coefficient of IR windows 812, 813 or a filter (not shown), L is the length between windows 812, 813 (see FIG. 17D) and C is the concentration of $SiF_4$ passing through detector 802. As $I/I_o$ approaches the value 1, the $SiF_4$ concentration is diminishing, which means that the cleaning endpoint is approaching. The controller continuously monitors $I/I_o$ until this value approaches 1, which indicates that the cleaning endpoint has arrived.

While the description above is in terms of a CVD chamber for a multichamber processing system, it would be possible to implement certain features of the present invention with other plasma etching chambers, physical deposition chambers or the like. Therefore, the above description and illustrations should not be taken as limiting the scope of the present invention as defined by the appended claims. It should be noted that the invention is not limited to a single wafer chamber as described above and shown in the enclosed drawings. For example, the throttle valve of the present invention could be installed into a batch chamber that simultaneously processes a plurality of wafers. In addition, the invention would be suitable for use in a multiple wafer chamber that sequentially performs individual processing steps on each of the wafers.

II. High Temperature Multiple-Step Processes Using the CVD Reactor System

A. Exemplary Structures and Applications

Figure 18:
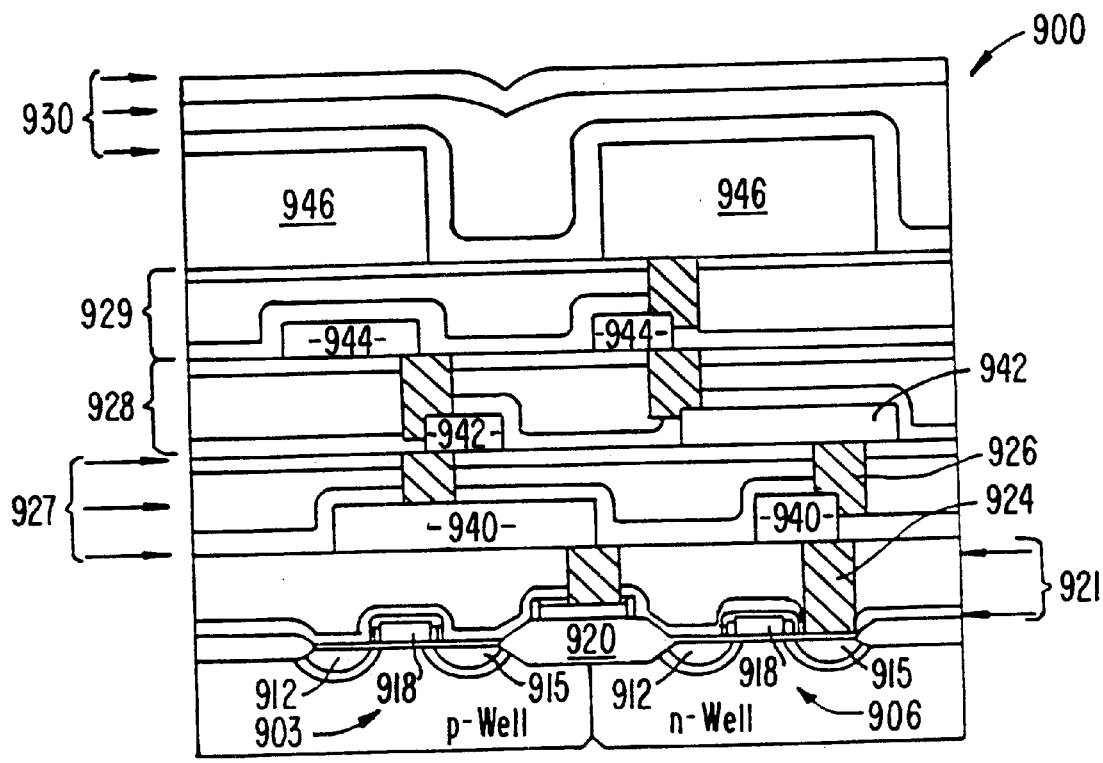
FIG. 18 is a simplified cross-sectional view of a semiconductor device manufactured according to an embodiment of the present invention.

FIG. 18 illustrates a simplified cross-sectional view of an integrated circuit 900 according to the present invention. As shown, integrated circuit 900 includes NMOS and PMOS transistors 903 and 906, which are separated and electrically isolated from each other by a field oxide region 920 formed by local oxidation of silicon (LOCOS), or other technique. Alternatively, transistors 903 and 906 may be separated and electrically isolated from each other by a shallow trench isolation (not shown) when transistors 903 and 906 are both NMOS or both PMOS. Each transistor 903 and 906 comprises a source region 912, a drain region 915 and a gate region 918.

A premetal dielectric (PMD) layer 921 separates transistors 903 and 906 from metal layer 940 with connections between metal layer 940 and the transistors made by contacts 924. Metal layer 940 is one of four metal layers 940, 942, 944, and 946, included in integrated circuit 900. Each metal layer 940, 942, 944, and 946 is separated from adjacent metal layers by respective inter-metal dielectric layers 927, 928, and 929. Adjacent metal layers are connected at selected openings by vias 926. Deposited over metal layer 946 are planarized passivation layers 930. CVD apparatus 10 may be used to deposit films used, for example, as PMD layer 921, IMD layers 927, 928 and 929, or passivation layer 930. CVD apparatus 10 also may be used to deposit oxide filling layers for shallow trench isolation structures used in place of LOCOS field oxide region 920.

Another example of a use of CVD apparatus 10 described above is forming ultra-shallow source and drain regions 912 and 915 shown in exemplary integrated circuit 900 of FIG. 18. Application of the present method for forming ultra-shallow doped junctions in forming the source/drain regions for a MOS transistor is discussed, as an example, with FIGS. 19A–19E.

Figure 19A:
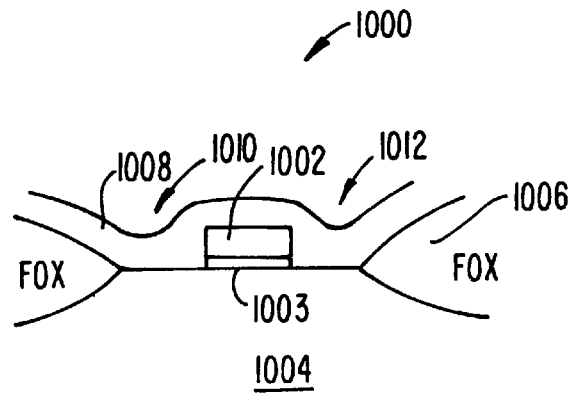
FIGS. 19A–19E are simplified cross-sectional views of an exemplary application of the method and apparatus of the present invention for an ultra-shallow source/drain junction.

FIG. 19A is a simplified cross-sectional view of a partially completed MOS transistor. Merely as an example, the MOS transistor 1000 is a PMOS transistor. Of course, NMOS transistors also may be formed. For PMOS transistor 1000, a doped dielectric layer 1008 used may be a BSG film as the P type dopant source. As seen in FIG. 19A, a gate electrode 1002 overlying gate oxide 1003 has already been formed on material 1004. In the present example, material 1004 may be an N type substrate or an N well formed in a substrate. Field oxide regions 1006 also have been formed by a method such as local oxidation of silicon (LOCOS). The regions where ultra-shallow doped junctions are desired may be defined using a mask. In the present example, the regions are source/drain regions 1010 and 1012, but of course the regions may be defined to form lightly doped drain (LDD) regions. Using the CVD reactor system described above with process recipes discussed in detail below, a doped dielectric layer 1008 is formed over source/drain regions 1010 and 1012 on a wafer resting on resistively-heated heater 25.

Prior to forming doped dielectric layer 1008 over source/drain regions 1010 and 1012, the surface of source/drain regions 1010 and 1012 may be cleaned of any gate oxide or native oxide that may exist either by using a plasma formed by reactive gases such as $NF_3$ from remote microwave plasma system 55 described above or by using a thermal $NF_3$ vapor. During the cleaning procedure, gate valve 280 would be opened to allow fluorine radicals from the $NF_3$ plasma to enter chamber 15 to clean the oxides that may exist on the surface of source/drain regions 1010 and 1012. Cleaning these oxides allows a more consistent drive-in of dopants from doped dielectric layer 1008 that is formed over source/drain regions 1010 and 1012. The fluorine radicals from the remote plasma may be used to clean native oxides from the wafer in chamber 15. In the cleaning procedure, heater 25 may be adjusted to a position where the fluorine radicals are optimally able to clean the oxides without damaging the device on the wafer. Preferably, this native oxide removal/cleaning step and the deposition of doped dielectric layer 1008 are performed in the same chamber in an in situ manner. Use of the above described CVD apparatus 10 avoids moisture absorption by the wafer, since the vacuum of chamber 15 is not broken and the wafer is not exposed to the environment. Alternatively, undesired oxides may be cleaned from the wafer by thermally breaking down $NF_3$ vapor in situ. With this alternative, fluorine radicals are produced in situ in chamber 15 by introducing $NF_3$ between about 200–1500 standard cubic centimeters per minute (sccm), preferably about 500 sccm, and optionally $O_2$ at about 0–1000 sccm into chamber 15. At the same time, chamber 15 is heated to between about 500–650° C., preferably 600° C., and maintained at a pressure of between about 60–760 torr, preferably 400 torr, while heater 25 is spaced between about 150–900 mil, preferably about 600 mil, from plate 20. Thus, the surfaces of source/drain regions 1010 and 1012 can be cleaned of any native oxide barrier.

After the cleaning step, gate valve 280 in some embodiments would be closed to shut out any reactive gases used in the doped dielectric layer deposition process from entering and depositing onto surfaces in conduit 47. Heater 25 also would be moved into the appropriate processing position and heated to the specified temperature in the vacuum of chamber 15, according to the desired process recipe. Doped dielectric layer 1008 is then formed at high temperatures (about 500–600° C.) in the CVD apparatus 10, as described below. Without a native oxide barrier, dopants from the doped dielectric layer 1008 formed on the wafer may more easily and uniformly be driven into the substrate to form ultra-shallow source/drain regions 1010 and 1012.

Figure 19B:
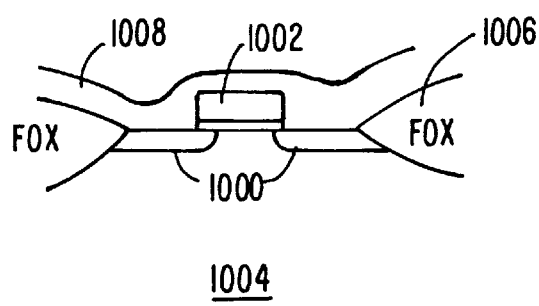

After deposition of doped dielectric layer 1008, the wafer remains in chamber 15. The resistively-heated heater 25 and wafer thereon are then heated to a higher temperature (about 800° C.) for a specified time. The heating step drives dopants from doped dielectric layer into N type material 1004. Doped dielectric layer 1008 is used as a P type dopant diffusion source for the resulting ultra-shallow junctions 1020, as shown in FIG. 19B. Of course, gate valve 280 remains closed during this drive-in step. As an alternative to being heated in situ, the wafer may be transferred to an annealing furnace or a rapid thermal process reactor (preferably within the multichamber system) to drive-in dopants from doped dielectric layer 1008, which acts as a dopant diffusion source. Diffusion is performed by annealing or a rapid thermal process. Preferably, the diffusion is performed using a rapid thermal process (due to better throughput) at a temperature between about 950–1100° C. for between about 1–3 minutes, and preferably about 1000° C. for about 1 minute, in these other embodiments.

Figure 19C:
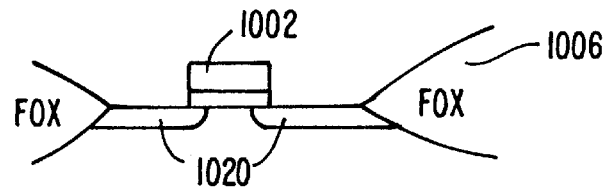

After diffusion, doped dielectric layer 1008 is removed by dry or wet etching techniques or other removal technique from N type material 1004. CVD apparatus 10 may also be used to remove doped dielectric layer 1008 by using remote microwave plasma system 55 with the appropriate etching chemistry. For this dielectric removal step, gate valve 280 would be opened to allow the remote plasma to etch the layer 1008 until removal is completed, whereupon gate valve 280 is closed. The removal step may be performed in situ without transferring the wafer from heater 25 in chamber 15. Alternatively, the removal step may be performed in another chamber, dedicated to dielectric removal, within the same multichamber system as CVD apparatus 10, which also avoids exposure of the wafer to the environment outside the vacuum of the multichamber system. FIG. 19C illustrates the partially completed PMOS transistor 1000 after removal of doped dielectric layer 1008. PMOS transistor 1000 includes gate electrode 1002 and adjacent source/drain regions 1020 which are ultra-shallow P type doped junctions. Thereafter, remaining process steps for the completion of the device may be performed on the wafer.

After every wafer (or several wafers) have been processed in chamber 15 of CVD apparatus 10, a chamber clean may be performed. After processing of the wafer is completed within chamber 15, the wafer is transferred through slot 243 which is then vacuum locked. Gate valve 280 may then be opened to allow the chamber clean process to be performed using remove microwave plasma system 55 until the chamber is cleaned to specifications, as indicated by the endpoint detector system.

Figure 19D:
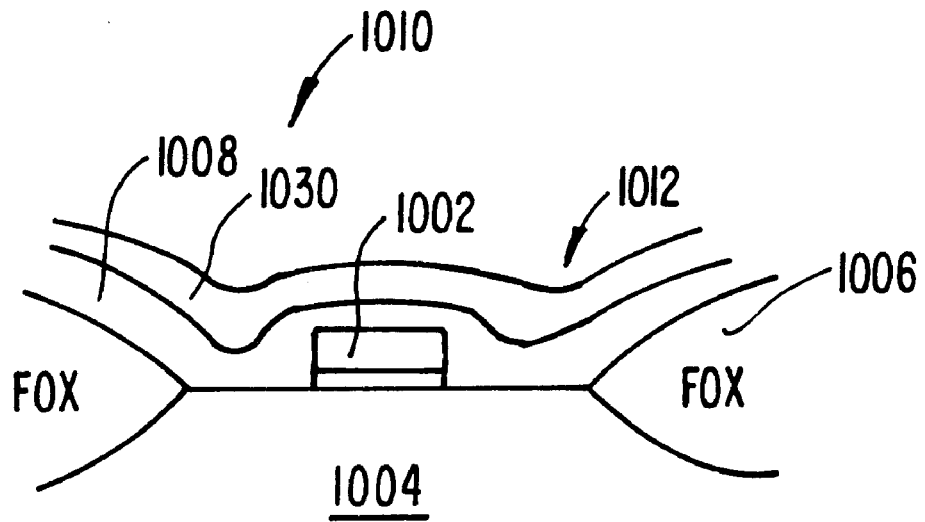
Figure 19E:
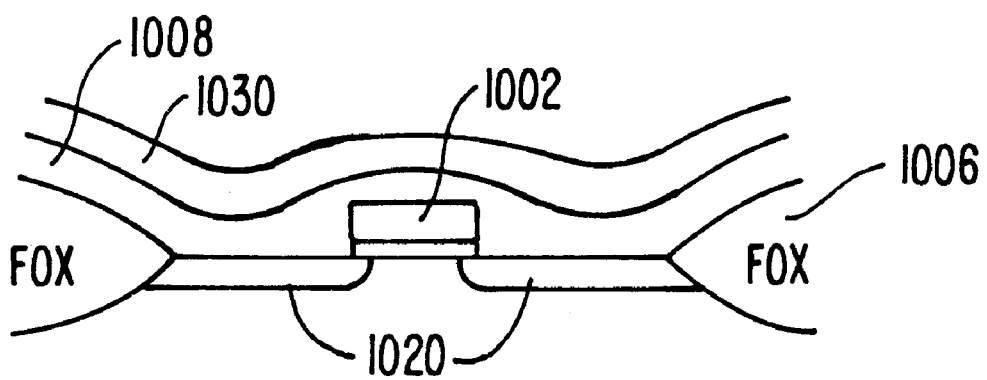

In an alternative embodiment, steps shown in FIGS. 19D–19E are performed after steps described for FIG. 19A. After doped dielectric layer 1008 is formed over source/drain regions 1010 and 1012 and gate electrode 1002 as seen in FIG. 19A, a capping layer 1030 such as USG is formed overlying doped dielectric layer 1008, preferably in an in situ process within chamber 15. During the deposition of layer 1008, gate valve 280 would remain closed. Then the substrate may be heated for diffusion of dopants from doped dielectric layer 1008 into semiconductor material 1004 as discussed above for FIG. 19B. Alternatively, the wafer may be removed from chamber 15 for transfer to an annealing furnace or rapid thermal process reactor for diffusion of dopants from doped dielectric layer 1008 as discussed above for FIG. 19B. Preferably, the substrate undergoes a rapid thermal process in the same multichamber system to which chamber 15 (where doped dielectric layer 1008 and capping layer 1030 were deposited) is a part. As seen in FIG. 19E, dopants from the doped dielectric layer 1008 with overlying cap layer 1030 have diffused into semiconductor material 1004 to form ultra-shallow source and drain junctions 1020. The cap layer 1030 and doped dielectric layer 1008 are then etched away as discussed above to provide partially completed PMOS transistor 1000, as shown in FIG. 19C, ready for remaining processing steps. For about a 0.25 $\mu$m device geometry, diffusion of boron atoms form a BSG film thickness between about 100–200 Å capped with a USG film of between about 100–200 Å and results in a junction depth ranging from between about 0.05 μm to about 0.1 μm, according to preferred embodiments for PMOS transistors.

Of course, an NMOS transistor 1000 includes gate electrode 1002 and source/drain regions 1010 and 1012 where N type, ultra-shallow junctions may be formed in the P type semiconductor material 1004 using a doped dielectric film 1008 such as a PSG film or an arsenic-doped silicate glass film as the dopant source, according to other embodiments of the present invention. P type material 1004 may be a P type substrate or a P well formed in a substrate. For about a 0.25 μm device geometry, a PSG film thickness between about 100–200 Å and a USG film between about 100–200 Å results in a depth of phosphorus driven into the semiconductor material that ranges from between about 0.05 μm to about 0.1 μm, according to preferred embodiments. Of course, it is recognized that other doped silicate glass films may be used to provide the N type or P type ultra-shallow junctions depending on the application.

Another example of a use of the present invention is forming an ultra-shallow doped region as a channel-stop in a shallow trench isolation structure between devices. Application of the present method for forming an ultra-shallow channel-stop region is discussed with reference to FIGS. 20A–20G.

Figure 20A:
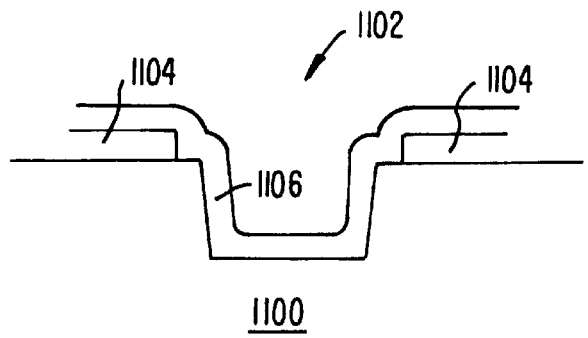
FIGS. 20A–20G are simplified cross-sectional views of another exemplary application of the method and apparatus of the present invention for ultra-shallow trench isolation.

FIG. 20A is a simplified cross-sectional view of a partially completed shallow trench isolation structure formed in semiconductor material 1100. As seen in FIG. 20A, a trench 1102 is formed in semiconductor material 1100 using anisotropic etching techniques including reactive ion etching, plasma etching, or other techniques. In the present example, the semiconductor material 1100 may be a P type substrate or a P well formed in a substrate. A mask 1104 may be used to define the channel stop region in the shallow trench isolation. Using process recipes discussed in detail below, a doped dielectric layer 1106 is formed over trench 1102 using mask 1104. Doped dielectric layer 1106 provides a source of dopant atoms to diffuse and form a channel-stop doping region used to prevent a conducting path from forming between devices in semiconductor material 1100. For P type material 1100, doped dielectric layer 1106 may be a BSG film as the P type dopant source.

Prior to forming doped dielectric layer 1106 over trench 1102, the surface of trench 1102 may be cleaned of any gate oxide or native oxide that may exist by using remote microwave plasma system 55 to provide a fluorine radicals in a remote plasma formed using reactive gases such as NF$_3$, as discussed below. During the cleaning step, gate valve 280 is open to allow fluorine radicals to flow from conduit 47 through outer annular passage 297 and into chamber 15 via distribution plate 20. Heater 25 with the wafer thereon is lowered into a position for the cleaning so that the fluorine radicals can clear the wafer of the unwanted oxides that may exist on the surface of trench 1102 without damaging the substrate. Cleaning these oxides allows a more consistent drive-in of dopants from doped dielectric layer 1106 that is formed over trench 1102. The cleaning step and the deposition of doped dielectric layer 1106 are performed in chamber 15 in an in situ process. In alternative embodiments, the cleaning step may be done by thermally breaking down NF$_3$ in situ, as discussed above. The fluorine radicals from the NF$_3$ plasma or vapor then clear the oxides that may exist on the surface of trench 1102. In further alternative embodiments, a separate chamber of the multichamber system described above may be used for this cleaning step. Since moisture absorption by the wafer is avoided by not breaking the vacuum of chamber 15 (or alternatively of the multichamber system), the surface of trench 1102 is free of native oxide barriers. After the cleaning step is performed, gate valve 280 is closed. Without the native oxide barrier, dopants from doped dielectric layer 1106 may more easily and uniformly be driven into the substrate to form ultra-shallow junctions used as a channel-stop region to provide shallow trench isolation. Heater 25 with the wafer thereon is moved into the processing position and heated to high temperatures (about 500–700° C.) for deposition of layer 1106.

Figure 20B:
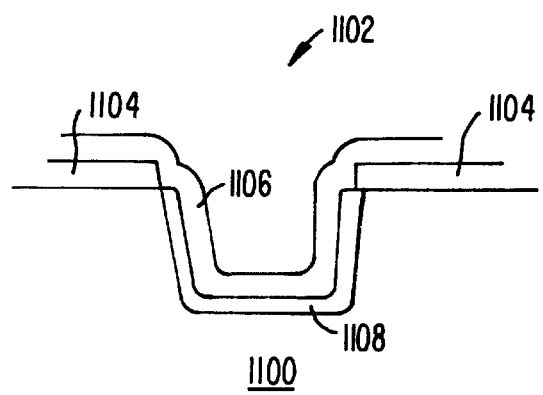

After deposition of doped dielectric layer 1106, the wafer remains in chamber 15 for the drive-in step. Gate valve 280 remains closed, and heater 25 is heated to a higher temperature (about 800° C.). The heating occurs for a specified time that depends on the desired junction depth needed for the diffusion. Alternatively, the wafer may then be transferred to an annealing furnace or a rapid thermal process reactor (preferably within the multichamber system) to drive dopants from doped dielectric layer into P type material 1100. Doped dielectric layer 1106 is used as a P type dopant diffusion source for the resulting ultra-shallow channel-stop region 1108, as shown in FIG. 20B. Ultra-shallow channel-stop region 1108 is a P+ type region formed in P type material 1100.

Figure 20C:
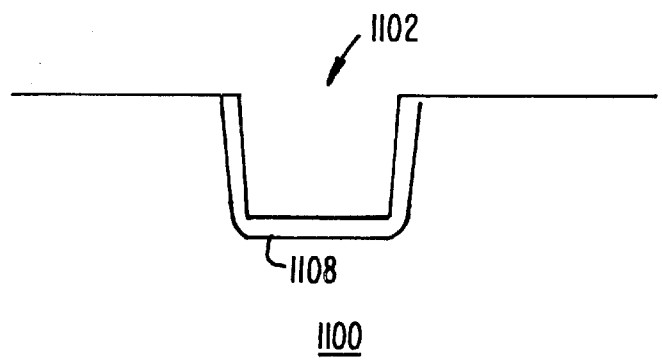
Figure 20D:
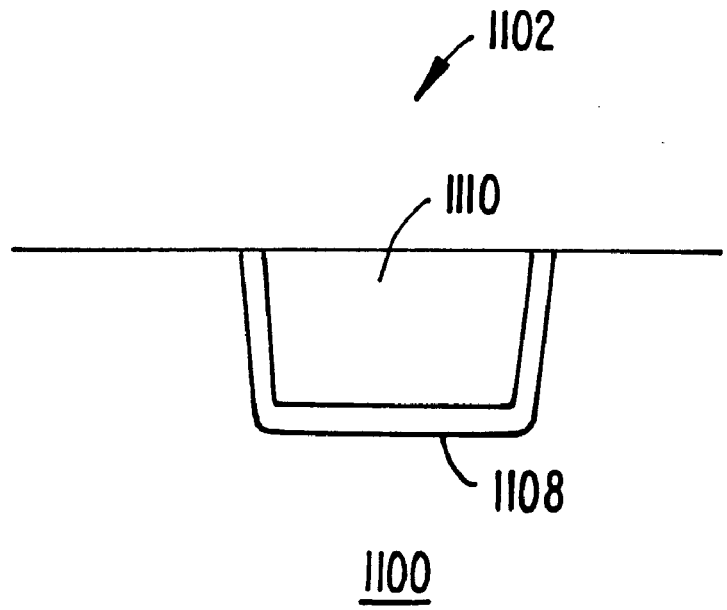

After diffusion, doped dielectric layer 1106 is removed by wet etching techniques or other removal technique from P type material 1100. Preferably, the wafer remains in chamber 15 so that gate valve 280 may be opened and radicals from remote microwave plasma system 55 may etch away layer 1106. Of course, reactive gases input to plasma system 55 depend on the type of doped dielectric layer 1106. FIG. 20C illustrates the partially completed shallow trench isolation structure after removal of doped dielectric layer 1106. As seen in FIG. 20D, trench 1102 is then filled with an oxide 1110 to form the shallow trench isolation structure. In a preferred embodiment, a high quality USG film deposited at high temperature may be used as oxide 1110 to fill high aspect ratio trenches. Oxide 1110 also may be formed using other deposition techniques.

Figure 20E:
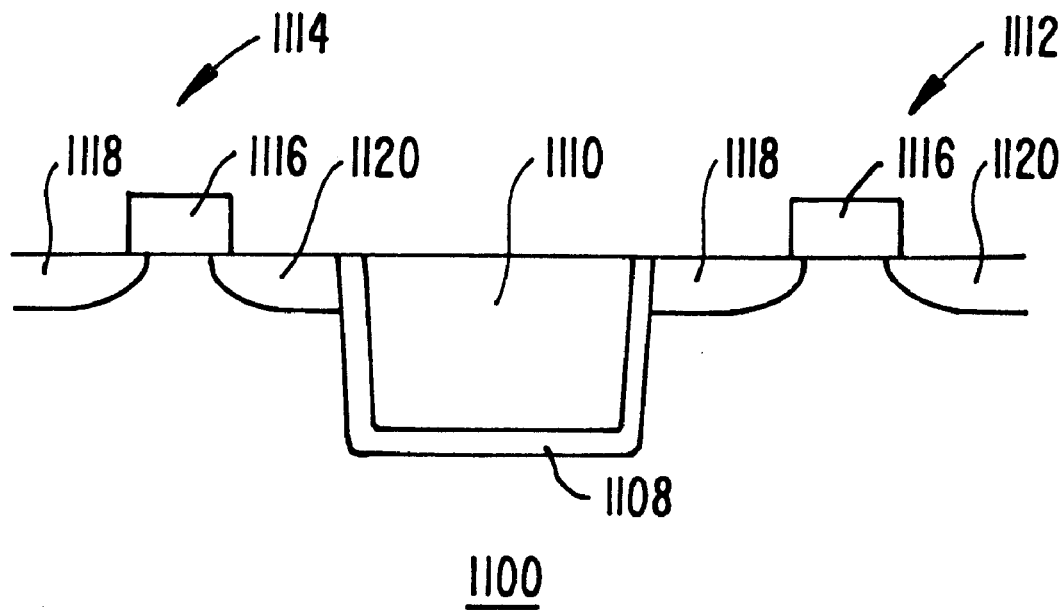

After completing shallow trench isolation structure having ultra-shallow channel-stop region 1108, devices 1112 and 1114 separated by shallow trench isolation structure may be formed, as seen in FIG. 20E. Devices 1112 and 1114 each include a gate electrode 1116 and adjacent source/drain regions 1118 and 1120. Thereafter, remaining process steps for the completion of the device may be performed by transferring the wafer to another chamber, preferably in multichamber system. After the wafer is transferred from chamber 15, a chamber clean may be performed using remote microwave plasma system 55 with resistively-heated heater 25 adjusted to a cleaning position and gate valve 280 being open, as already described above in connection with FIGS. 19A–9E.

Figure 20F:
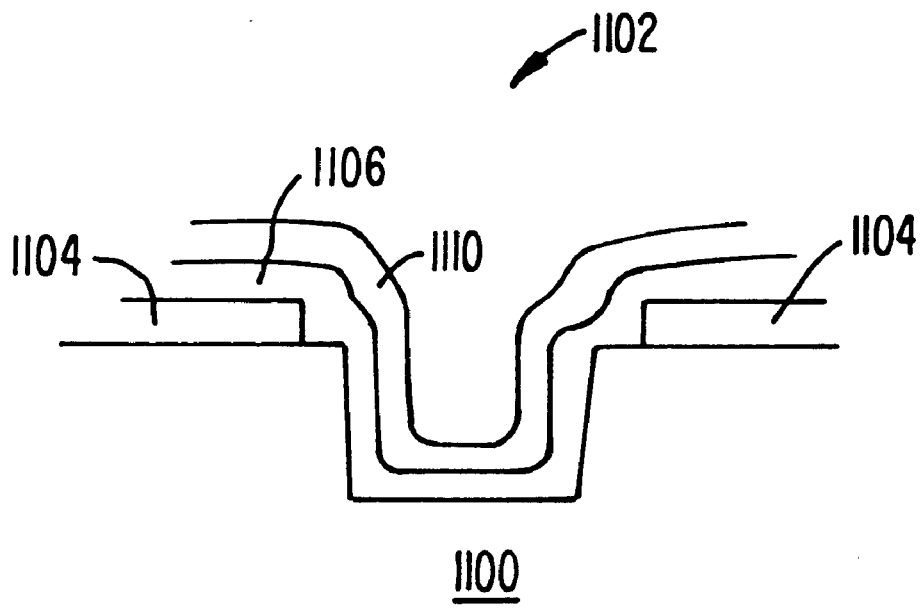
Figure 20G:
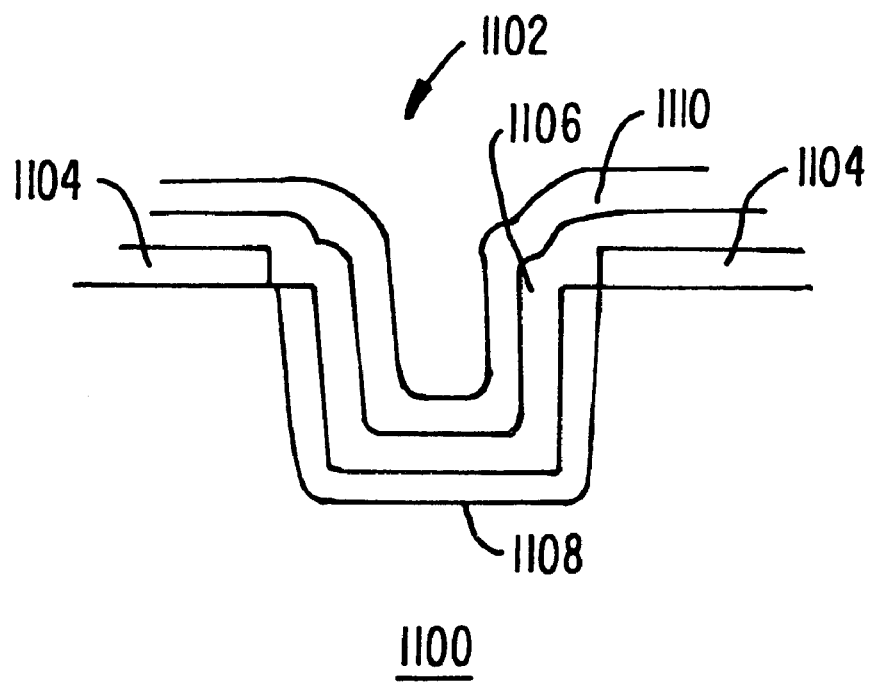

In an alternative embodiment, steps shown in FIGS. 20F–20G are performed after steps shown in FIG. 20A. After doped dielectric layer 1106 is formed over trench 1102 and mask 1104 as seen in FIG. 20A, a capping layer 1110 such as USG is formed overlying doped dielectric layer 1106 in chamber 15 in an in situ process. During the deposition of capping layer 1110, gate valve 280 is closed. Then the substrate is heated in situ in chamber 15 for dopant drive-in for diffusion of dopants from capped, doped dielectric layer 1106 into semiconductor material 1100 as discussed above for FIG. 20B. Alternatively, the wafer may be removed from chamber 15 for transfer to an annealing furnace or rapid thermal process reactor (preferably within the multichamber system) for diffusion of dopants from capped, doped dielectric layer 1106 into semiconductor material 1100 as discussed above for FIG. 20B. As seen in FIG. 20G, dopants from the doped dielectric layer 1106 with overlying cap layer 1110 have diffused into semiconductor material 1100 to form ultra-shallow channel-stop region 1108. Cap layer 1110 minimizes the outgassing of dopants upward from doped dielectric layer 1106, thereby resulting in more dopants diffusing down into the substrate material 1100. After the diffusion step is performed, gate valve 280 is opened and both the cap layer 1110 and doped dielectric layer 1106 may then etched away using remote microwave plasma system 55 with appropriate etchant chemistry to provide partially completed shallow trench isolation as shown in FIG. 20C, ready for the remaining processing steps of FIGS. 20D–20E. When the wafer is transferred out of chamber 15, gate valve 280 is in the closed position. A chamber clean of chamber 15 can then be performed by operating the plasma system 55 with gate valve 280 opened.

For shallow trench isolation between NMOS transistors in a P type substrate, the doped dielectric film 1106 may be a BSG film. For shallow trench isolation between PMOS transistors in an N type substrate (or in N wells of CMOS circuits), the doped dielectric film 1106 may be a PSG film or an arsenic-doped silicate glass film. For smaller device geometries such as less than 0.35 μm having a trench 1102 with a depth of about 0.5 μm, channel stop region 1108 of about 0.1 μm junction depth may be formed using a BSG film 1106 about 200 Å thick and a USG capping about 200 Å thick, according to preferred embodiments of the present invention.

It should be understood that simplified integrated circuit 900 is for illustrative purposes only. One of ordinary skill in the art could implement the present method for fabrication of other integrated circuits such as microprocessors, application specific integrated circuits (ASICS), memory devices, and the like. Further, the present invention may be applied to PMOS, NMOS, CMOS, bipolar, or BiCMOS devices. Although ultra-shallow source/drain junctions and ultra-shallow trench isolation applications are discussed above, the present invention also may be used in other applications where an ultra-shallow doped region is desired. The present invention also may be used for forming undoped oxides as well as doped oxides for use as various layers in integrated circuit devices, including PMD, IMD, passivation, and damascene layers.

Exemplary wafer cleaning, deposition, and chamber cleaning processes for in situ or individual operation within chamber 15 are further described below, in accordance to various embodiments of the present invention.

B. Cleaning Native Oxides Prior to Deposition

In accordance with a specific embodiment of the present invention, native oxides that may exist on the silicon substrate or region where an ultra-shallow doped junction is desired may be cleaned prior to deposition of the doped dielectric layer that may be used, for example, as a dopant diffusion source or as a PMD layer. In these embodiments, the native oxides can be cleaned by using fluorine radicals from a plasma formed with reactive clean gases like $NF_3$ by remote microwave plasma system 55. Use of in situ processes in one chamber or alternately in chambers of the same multichamber system permit enhanced quality in the ultra-shallow junctions formed in accordance with these specific embodiments, as well as providing for dielectric layers having low moisture content and low shrinkage.

In a specific embodiment, chamber 15 is maintained at the deposition temperature, a temperature ranging between about 300–650° C., and preferably at about 550–600° C., for the entire cleaning process. Chamber 15 is maintained at a pressure ranging between about 1–2 torr, preferably at about 1.5 torr, while maintaining the temperature. Heater 25 is moved to a position about 600 mil from gas distribution plate 20, while gate valve 280 is opened and the clean gas $NF_3$ is introduced into applicator tube 292 at a rate of about 600 sccm. The clean gas is introduced into applicator tube 292 and the pressure is permitted to stabilize for about 3 seconds before microwave energy is applied to the $NF_3$ in applicator tube 292. Microwave power of between about 500–2500 Watts, preferably between about 1000–1500 Watts, from magnetron 711 operating in CW mode is then applied for about 5–10 seconds. The microwaves are transmitted from magnetron 711 through the waveguide and optimizing system to enter applicator tube 292 through the window, as discussed above. UV lamp 731 ignites the reactive gases in applicator tube 292 to form a plasma, with ionization sustained by the microwave energy entering applicator tube 292 at the window. The radicals from the upstream plasma formed in applicator tube 292 are output to flow into inlet 290. The radicals flow through the lined passage in enclosure assembly 200 to conduit 47 of clean manifold 270 through the opened gate valve 280 and into outer annular passage 297 to enter chamber 15 and clean native oxides off the wafer. Used clean gas reactants and oxide residues are then exhausted out of chamber 15 via the opened throttle valve. The present description is for chamber 15 which has a total volume of about 6 liters. It is recognized that flow values may differ depending on the size and type of chamber used in other embodiments.

In a specific embodiment, with chamber 15 maintained at pressures lower than about 1–2 torr, rapid removal of fluorine species occurred, resulting in poor cleaning results. At chamber pressures higher than about 1–2 torr, recombination may occur due to collision losses, as well as causing overheating and damage to applicator tube 292. Chamber 15 should be maintained at pressure levels where fluorine species are not rapidly removed, recombination does not occur, and applicator tube 292 does not break. In some embodiments, the chamber pressure may be limited by the physical dimensions and material of applicator tube 292, when microwave power is being applied. In a specific embodiment, the pressure in applicator tube 292, when microwave power is applied, may be about 3 times as much as the optimal chamber pressure. When different applicator tubes are used with different flow rates, the optimal chamber pressure will vary. Of course, any pressure may be used when applicator tube 292 is used without microwaves being applied.

Since the plasma is formed upstream of the wafer, only the reactive fluorine radicals in the plasma are able to reach the wafer to clean the native oxides from the wafer. As mentioned above, the cleaning step preferably is done for about 5–10 seconds for a typical native oxide of thickness of about 90 Å. The above cleaning step etches native oxides at a rate of about 2 μm/minute. Of course, the total time of the cleaning step depends on the thickness of the particular oxide to be cleared off the wafer. With remote microwave plasma system 55 of present invention, native oxides or other oxides may be etched and plasma damage to the wafer is avoided.

Although the above wafer cleaning process conditions are exemplary for the present embodiment, other conditions may also be used. The above description discusses $NF_3$, merely as an example, in a Giga Fill™ Centura system available from Applied Materials fitted for 200-mm wafers, as do the various deposition descriptions below. However, other fluorine-containing or chlorine-containing gases, such as $NF_3$ and $N_2$, $NF_3$ and argon, $NF_3$ and $O_2$, a dilute $F_2$, $CF_4$, $C_2F_6$, $C_3F_8$, $SF_6$ or $Cl_2$, etc., may be used as well.

C. Exemplary Silicate Glass Depositions

According to the process of the present invention, dielectric layers used as the dopant source, PMD layer, IMD layer, oxide filling layer, capping layer, or other layers may be formed using any of several different processes. The process recipes of a BSG film, a PSG films, a BPSG film, and a USG film are set forth below as examples of doped and undoped dielectric layers used in the present invention. Of course, during the below described deposition of various dielectric films, gate valve 280 remains closed (unless remote plasma system 55 is being used for deposition, in accordance with an alternative embodiment). The exemplary processes may be performed in CVD apparatus 10, which is a closed, single-wafer, SACVD system in preferred embodiments.

CVD apparatus 10 also may be adapted with different and/or additional input gas supply sources to deposit BPSG, arsenic doped silicate glass (AsSG), or other dielectric layers as well. Of course, those of ordinary skill in the art will understand that other process recipes and other reaction systems like plasma enhanced CVD (PECVD) may also be used to deposit the dielectric films. Examples of boron sources include TEB, trimethylborate (TMB), diborane ($B_2H_6$), and other similar compounds. Examples of phosphorus sources include triethylphosphate (TEPO), triethylphosphite ($TEP_i$), trimethylphosphate (TMOP), trimethylphosphite ($TMP_i$), and other similar compounds. In addition to BSG or PSG films, arsenic doped oxides or arsenic silicate glass (AsSG) also may be deposited using, for example, a liquid source with an arsenic compound or an arsenic gas diluted in argon, as examples. Examples of silicon sources include silane ($SiH_4$), TEOS, or a similar silicon source, and oxygen sources include $O_2$, $O_3$, microwave-generated atomic oxygen (O), or the like. In the descriptions below, flow rates for liquid sources are provided in milligrams per minute (mgm) while gas flow rates are provided in standard cubic centimeters per minute (sccm). In these descriptions, liquid sources are vaporized using a Precision Liquid Injection System, and liquid flow rates in mgm may be converted to gas flow rates in sccm by multiplying liquid flow rates by a factor of about 1.923 so that flow ratios may be calculated accordingly. Preferably, stable doped dielectric films may be formed using the TEOS/$O_3$ chemistry in a SACVD process to form damage-free, uniformly doped ultra-shallow junctions in some embodiments. In other embodiments, a low moisture doped dielectric film may be formed using TEOS/$O_3$ chemistry with a SACVD process conducted in CVD apparatus 10 to provide a planarized insulating layer with high aspect ratio gap-fill, low shrinkage, low metal contamination, and low fluorine incorporation.

1. Exemplary BSG Film Deposition

As merely an example, the BSG film deposition recipe described below is capable of forming a BSG film that may be useful as a doped dielectric layer used as a dopant diffusion source. Of course, the recipe may be varied depending on the particular use for and desired qualities of the BSG layer. A PSG layer formed as a doped dielectric layer used as a dopant diffusion source could similarly be formed using the recipe below and appropriately substituting the dopant source gas employed.

The exemplary BSG bulk film is deposited by heating the wafer and heater 25 to a temperature of between about 200–650° C., preferably to a temperature within the range of about 400–650° C. and most preferably to about 500° C., and maintaining this temperature range throughout the deposition. With gate valve 280 closed, chamber 15 is maintained at a pressure within a range of about 10–760 torr. Preferably, the pressure is maintained within the range of about 400–600 torr, and most preferably it is maintained at about 600 torr. Heater 25 is positioned about 150–300 mil from gas distribution plate 20 and is preferably positioned about 250 mil from plate 20.

A process gas including TEB as the source of boron, TEOS as the source of silicon, and $O_3$ as a gaseous source of oxygen is formed. Being liquids, the TEB and TEOS sources are vaporized and then combined with an inert carrier gas such as helium. The liquids are vaporized either by liquid injection system in gas mixing system 93, which provides greater control of the volume of reactant liquid introduced. The flow rate of TEB is between about 50–550 mgm depending on the desired dopant concentrations, while the TEOS flow rate is between about 300–1000 mgm and preferably about 500 mgm. The vaporized TEOS and TEB gases then are mixed with a helium carrier gas flowing at a rate of between 3000–6000 sccm, preferably at a rate of about 4000 sccm. Oxygen in the form of $O_3$ is introduced at a flow rate of between about 3000–6000 sccm and is preferably introduced at a flow rate of about 5000 sccm. The ozone mixture contains between about 5–16 weight percentage (wt %) oxygen. The gas mixture is introduced into chamber 15 from the distribution plate 20 to supply reactive gases to the substrate surface where heat-induced chemical reactions take place to produce the desired film.

The above conditions can result in a BSG film deposited at a rate of between 500–1000 Å/minute. By controlling the deposition time, BSG films having a thickness between about 50–500 Å and preferably between about 100–300 Å may be formed at the process conditions described above in about 10–60 seconds. The thickness of the BSG film deposited may thus be easily controlled. Preferably, the wt % of boron in the resulting BSG film ranges between about 2–8 wt % and preferably is about 6 wt %.

2. Exemplary PSG Film Deposition

As merely an example, the PSG film deposition recipe described below is capable of forming a PSG film that may be useful as a PMD layer. Of course, the recipe may be varied depending on the particular use for and desired qualities of the PSG layer. Other doped dielectric layers besides PSG films may be used as PMD layers by using similar recipes to the recipe below and appropriately substituting the dopant(s) source gas(es) employed.

The exemplary PSG bulk film is deposited by heating the wafer and heater 25 to a temperature of between about 200–650° C., preferably to a temperature within the range of about 400–650° C. and most preferably to about 600° C., and maintaining this temperature range throughout the deposition. With gate valve 280 closed, chamber 15 is maintained at a pressure within a range of about 10–760 torr. Preferably, the pressure is maintained within the range of about 400–600 torr, and most preferably it is maintained at about 450 torr. Heater 15 is positioned about 250–350 mil from gas distribution plate 20 and is preferably positioned about 330 mil from plate 20.

A process gas including TEPO as the source of phosphorus, TEOS as the source of silicon, and $O_3$ as a gaseous source of oxygen is formed. Being liquids, the TEPO and TEOS sources are vaporized by the liquid injection system and then combined with an inert carrier gas such as helium. The flow rate of TEPO is between about 10–100 mgm, preferably between about 5–30 mgm, most preferably about 24 mgm, depending on the desired dopant concentration, while the TEOS flow rate is between about 500–1500 mgm, preferably about 1000 mgm. The vaporized TEOS and TEPO gases then are mixed with a helium carrier gas flowing at a rate of between 2000–6000 sccm, preferably at a rate of about 4000 sccm. Oxygen in the form of $O_3$ (having between about 5–16 wt % oxygen) is introduced at a flow rate of between about 2500–6000 sccm and is preferably introduced at a flow rate of about 4000 sccm. The gas mixture is introduced into chamber 15 from gas distribution plate 20 to supply reactive gases to the substrate surface where heat-induced chemical reactions take place to produce the desired film.

The above conditions result in a PSG film deposited at a rate of about 1780 Å/minute. By controlling the deposition time, the thickness of the PSG film deposited may thus be easily controlled. Preferably, the wt % of phosphorus in the resulting PSG film ranges between about 2–8 wt % and preferably is about 4 wt %.

3. Exemplary BPSG Film Deposition

As merely an example, the BPSG film deposition recipe described below is capable of forming a BPSG film that may be useful as a PMD layer. Of course, the recipe may be varied depending on the particular use for and desired qualities of the BPSG layer.

The exemplary BPSG bulk film is deposited by heating the wafer and heater 25 to a temperature of between about 100–800° C., preferably to a temperature within the range of about 400–650° C. and most preferably to about 480° C., and maintaining this temperature range throughout the deposition. With gate valve 280 closed, chamber 15 is maintained at a pressure within a range of about 10–760 torr. Preferably, the pressure is maintained within the range of about 150–600 torr, and most preferably it is maintained at about 200 torr. Heater 15 is positioned about 150–400 mil from gas distribution plate 20 and is preferably positioned about 300 mil from plate 20.

A process gas including TEB as the source of boron, TEPO as the source of phosphorus, TEOS as the source of silicon, and 03 as a gaseous source of oxygen is formed. Being liquids, the TEB, TEPO and TEOS sources are vaporized by the liquid injection system and then combined with an inert carrier gas such as helium. Of course, it is recognized that other sources of boron, phosphorus, silicon, and oxygen also may be used. The flow rate of TEB is preferably between about 150–200 mgm. The flow rate of TEPO is between about 10–100 mgm, preferably between about 35–75 mgm, most preferably about 24 mgm, depending on the desired dopant concentration, while the TEOS flow rate is between about 300–700 mgm. The vaporized TEOS, TEB, and TEPO gases then are mixed with a helium carrier gas flowing at a rate of between 2000–8000 sccm, preferably at a rate of about 6000 sccm. Oxygen in the form of $O_3$ is introduced at a flow rate of between about 2000–5000 sccm and is preferably introduced at a flow rate of about 4000 sccm. The ozone mixture contains between about 5–16 wt % oxygen. The gas mixture is introduced into chamber 15 from gas distribution plate 20 to supply reactive gases to the substrate surface where heat-induced chemical reactions take place to produce the desired film.

The above conditions result in a BPSG film deposited at a rate of between 3500–5500 Å/minute. By controlling the deposition time, the thickness of the BPSG film deposited may thus be easily controlled. The resulting BPSG film has a boron concentration level of between 2–6 wt % and a phosphorus concentration level of between 2–9 wt %.

The parameters in the above BSG, PSG, BPSG processes and in the below USG processes should not be considered limiting to the claims. For example, the present invention is also applicable to silicon oxide films doped with other dopants including, for example, arsenic. As another example, the flow values discussed above apply for a chamber outfitted for 200-mm wafers, but may differ depending on the type or size of the chamber used. One of ordinary skill in the art can also use other chemicals, chamber parameters, and conditions to produce similar films.

It is believed that film stability may be a factor in the availability of dopant atoms in the doped dielectric films for diffusion into the semiconductor material. Several methods to improve film stability and improve the ability to control dopant diffusion from these doped dielectric films into the semiconductor material were investigated. Each method described may be performed on a doped dielectric layer, after the layer is deposited using a recipe such as one of the exemplary deposition recipes described above. Furthermore, although methods described below are with respect to treatment of a BSG (or PSG) film, the methods are equally applicable to any doped silicon oxide film.

4. Exemplary USG Film Depositions a. Oxide Filling Material Or Insulating Layer

According to one embodiment of the present invention, an undoped silicate glass (USG) layer can be deposited in CVD apparatus 10 for use, for example, as an oxide filling material for filling a shallow trench used for shallow trench isolation. Of course, the USG film also may be used as an IMD layer, an insulating layer, or other layer. The exemplary USG recipe discussed below provides a very dense and uniform film which can survive annealing at temperatures of greater than 800° C. with minimal shrinkage. The USG film, which provides excellent gap fill capability for high aspect ratio step coverage, can also endure several etch processes at very uniform etch rate without opening up any voids in the USG. The USG film, also can endure chemical mechanical polishing (CMP) planarization without opening up any voids or creases in the USG.

The wafer and heater 25 are heated to a temperature within the range of about 200–650° C., but preferably between about 550–650° C., and then maintained at this temperature throughout the deposition. Heater 25 is positioned about 250–400 mil away from gas distribution plate 20 and preferably at about 350 mil. With gate valve 280 closed, the pressure in chamber 15 is maintained at a level of between about 10–760 torr, preferably about 600 torr.

A process gas comprising oxygen and silicon sources is introduced into the deposition chamber. In a preferred embodiment, the silicon source is TEOS and the oxygen source is $O_3$, but those skilled in the art will recognize that additional silicon sources such as $SiH_4$, TMCT or similar sources, and other oxygen sources such as $O_2$, $H_2O$, $N_2O$, microwave-generated atomic oxygen, and similar sources and mixtures of the same also can be employed. When TEOS is used as a silicon source, a carrier gas such as helium or nitrogen is employed. The ratio of $O_3$ to TEOS may range from about 2–17:1, but is preferably between about 2–6:1.

The optimal total flow of the gaseous reactants will vary according to the geometry and design of the deposition chamber. The gas flow also can be varied to control the deposition rate. Typically, TEOS is introduced at a flow rate of between about 500–2500 mgm and is preferably introduced at a flow rate of about 2000 mgm. $O_3$ (between about 5–16 wt % oxygen) is introduced at a flow rate of between about 2000–10000 sccm, preferably about 5000 sccm. Helium or nitrogen may be used as a carrier gas that is introduced at a flow rate of between 2000–10000 sccm and preferably about 7000 sccm. Usually, the total flow of gases into the deposition chamber will vary between about 5000–20000 sccm, preferably about 15000 sccm. Under the above conditions, deposition rates of about 1450 Å/minute or greater are attainable. The flow values above are for a 200-mm wafer chamber and will vary depending on size of chamber used and size of wafer.

b. Capping Layer

According to another embodiment of the present invention, the deposited BSG (or PSG) layer may be capped with a thin, separate USG layer. The USG capping layer is a stable film that does not readily absorb moisture. Thus, the USG capping layer provides a hydrophobic surface on top of the BSG (or PSG) layer that prevents moisture present in the ambient from being absorbed into the BSG (or PSG) film. Furthermore, the USG capping layer is a relatively dense film that impedes boron (or phosphorus) evolution. The USG capping layer thereby facilitates controlled diffusion of more dopant atoms in the doped dielectric layer downward into the semiconductor material. Without the USG capping layer, some of the dopant atoms may diffuse upward away from the semiconductor material during the subsequent anneal or rapid thermal process. Thus, the use of a capping layer contributes to controlling the diffusion and the junction depth. The USG layer can be deposited in a separate processing chamber from the BSG (or PSG) layer, but preferably is done as an in situ process in chamber 15 where deposition of the BSG (or PSG) layer also occurred. Of course, many processes for forming a capping layer are possible.

The following process for forming a USG layer is described as an example. An undoped silicate glass layer may also be used not only as a capping layer, as described below, but as an insulating dielectric layer without use of an underlying doped dielectric layer.

The wafer and heater 25 are heated to a temperature within the range of about 200–600° C., but preferably about 500° C., and then maintained at this temperature throughout the deposition. Heater 25 is positioned about 250–350 mil away from gas distribution plate 20 and preferably at about 300 mil. With gate valve 280 closed, the pressure in chamber 15 is maintained at a level of between about 50–760 torr, and is preferably at a pressure of between about 200–600 torr, most preferably about 400 torr.

A process gas comprising oxygen and silicon sources is introduced into the deposition chamber. In a preferred embodiment, the silicon source is TEOS and the oxygen source is $O_3$, but those skilled in the art will recognize that additional silicon sources such as silane, TMCT or similar sources, and other oxygen sources such as $O_2$, $H_2O$, $N_2O$ and similar sources and mixtures of the same also can be employed. When TEOS is used as a silicon source, a carrier gas such as helium or nitrogen is employed. The ratio of $O_3$ to TEOS may range from about 2–17:1, but is preferably between about 2–6:1.

The optimal total flow of the gaseous reactants will vary according to the geometry and design of the deposition chamber. The gas flow also can be varied to control the deposition rate. Typically, TEOS is introduced at a flow rate of between about 500–1500 mgm and is preferably introduced at a flow rate of between about 1000–1250 mgm. $O_3$ (between about 5–16 wt % oxygen) is introduced at a flow rate of between about 2000–10000 sccm, preferably about 7000 sccm. Helium or nitrogen may be used as a carrier gas that is introduced at a flow rate of between about 2000–6000 sccm and preferably about 4000 sccm. Usually, the total flow of gases into the deposition chamber will vary between about 5000–20000 sccm, preferably about 15000 sccm. Under the above conditions, deposition rates of between about 500 and 1500 Å/minute are attainable. At such deposition rates, a USG layer of about 100–200 Å can be deposited in approximately 20 seconds. The flow values above are for a 200-mm wafer chamber and will vary depending on size of chamber used and size of wafer.

The following processes for forming a USG capping layer are described as examples. Preferred applications will have USG cap layers of between about 50–500 Å, and preferably between about 100 and 300 Å. A person of ordinary skill in the art, however, will realize that capping layers of different thickness can be employed depending on the specific application and device geometry size. Depending on the application and gap sizes in which the deposited film is used, it may be preferable, although not essential, that the capping and doped dielectric layers be relatively thin. For thin layers, the time to deposit and the time to etch away are reduced compared to thicker layers. The USG capping layer is deposited, and both the USG layer and the doped dielectric layer are etched back. It is also recognized that different capping layers such as other similar stable oxide films may be utilized to cap the doped dielectric layer. Further, the USG cap layer may be formed over doped dielectric films deposited by APCVD, PECVD, or LPCVD, in place of SACVD. As discussed above, use of chamber 15 for in situ performance of multiple process steps is most preferred, with use of a multichamber system in which vacuum is not broken during transfer of substrates between various chambers in the multichamber system is also preferred.

According to another embodiment of the present invention, an in situ USG or similar cap layer is formed on a doped dielectric film by turning off the boron source or the phosphorus source just before completion of deposition of the doped layer. In this embodiment, the initial doped dielectric layer such as BSG (or PSG) is formed as described above. Flow of the dopant source into chamber 15 then is stopped while the thermal reaction continues for an additional period of between 1–30 seconds. Preferably, the thermal reaction continues for about 3–10 seconds. In this embodiment, the dopant source is stopped by closing a valve on the source's supply line so that the thermal reaction is maintained without a dopant for at least 5 seconds.

Of course, stopping the dopant gas source must be coordinated with the time it takes the gas to travel from the point of the valve to the gas mixing system 93 and then through the faceplate of plate 20. In most CVD machines several seconds is required for gas to flow from the injection valve to the deposition chamber, so the valve should be closed sufficiently in advance to allow for these delays. Thus, if TEB is the boron source, closing the valve on the TEB supply line several seconds before completion of deposition of the BSG layer results in a thin USG cap which prevents occurrence of the previously described moisture absorption and outgassing phenomenon.

The in situ deposition of the USG cap formed on the doped dielectric layer results in improved stability and immunity to moisture absorption, and contributes to improved control of the diffusion that forms ultra-shallow doped regions.

Instead of or in addition to the use of a USG capping layer, a plasma treatment of the doped dielectric layer also may be used to reduce moisture absorption and improve stability in the doped dielectric layer. In those embodiments equipped with a RF plasma system, this plasma densification treatment may be used where plasma damage to the device is not a significant concern. In some embodiments, the deposition at temperatures greater than about 500° C. may be sufficient to provide a dense dielectric film. The improved stability of the plasma treated doped dielectric layer contributes to improved control of the diffusion that forms the ultra-shallow doped regions. Chamber 15 is maintained at between about 1–5 torr during the plasma densification treatment. With gate valve 280 closed, a plasma formed using a reactive gas such as, for example, nitrogen ($N_2$), ammonia ($NH_3$), or argon, is introduced into chamber 15. As merely one example of the plasma treatment that may be used, a reactive gas such as $N_2$ is introduced in gas mixing system 93 at a rate of about 1000 sccm mixed with helium at 1000 sccm. RF plasma system is operated, for example, at a power level of about 450 Watts at a RF frequency of about 350 Megahertz (MHz) to create a plasma in chamber 15. The plasma serves to passivate the surface of the doped dielectric layer, which may have some nitridation on its surface. The plasma treatment thus densifies the doped dielectric film. More dopants in the densified doped dielectric film, which is resistant to moisture absorption, are available for forming the ultra-shallow junctions.

D. Heating Processes For In Situ Deposition And/Or For Reflow

CVD apparatus 10 has high temperature capabilities allowing an in situ heating step following a deposition process on the same wafer for a two-step deposition/reflow process, or an in situ heating step concurrent to a deposition process on the same wafer for a one-step deposition/reflow process. For use as a PMD layer formed over high aspect ratio transistors or isolation trenches an undoped or doped dielectric film, such as PSG, often requires planarization which is important in forming integrated circuit devices. Planarization of a doped dielectric layer may be performed by reflowing the layer at high temperatures. Performing reflow also contributes to improving gap-fill of the deposited film, especially for high aspect ratio features on the wafer. Of course, heating steps for other purposes and applications also may be performed in CVD apparatus 10. The following heating procedure discussed below serves merely as an exemplary heating step which may be used for reflow, but other heating steps for dopant drive-in in some applications or for other purposes also can be done.

According to a specific embodiment, two-step deposition/reflow process is described below. With gate valve 280 closed, chamber 15 may be maintained at a pressure of about 200–760 torr. With the wafer and heater 25 in the processing position between about 200–400 mil, preferably between about 330–350 mil, from distribution plate 20, the wafer and heater 25 are heated to a high temperature of between about 500–800° C., preferably between about 550–650° C., in chamber 15, for deposition processing. Stopping reactive gas flows, the wafer may then be heated at between about 750–950° C., preferably between about 750–850° C. for about 5–30 minutes, preferably about 15–20 minutes, in order to reflow the dielectric layer, according to a specific embodiment. The reflow temperature may be the same as or higher than the deposition temperature in the two-step process. Further, for a multiple-step deposition/reflow process, the temperature may be ramped from the deposition temperature to an intermediate temperature (or intermediate temperatures) before being ramped to the reflow temperature. Of course, the time and temperature for the heating steps may differ depending on the particular application being performed and on the particular layer being formed.

According to another specific embodiment, a one-step deposition/reflow process is described. With gate valve 280 closed, chamber 15 may be maintained at a pressure of about 200–760 torr. With the wafer and heater 25 in the processing position between about 200–400 mil, preferably between about 330–350 mil, from distribution plate 20, the wafer and heater 25 are heated to a high enough temperature of between about 750–950° C., preferably between about 750–850° C., in chamber 15, for simultaneous deposition and reflow processing to occur. Of course, the time and temperature for the deposition/reflow step may differ depending on the particular layer being formed.

As discussed above, keeping the wafer within the same chamber 15 for multiple in situ processes prevents exposure of the wafer to the environment, where moisture may be absorbed, and contamination by impurities. Further, deposition of dielectric films at temperatures greater than about 550° C. can provide dense and high quality films which do not form voids when heated. Deposition of the deposited films at these temperatures also reduces shrinkage.

E. Chamber Cleaning/Seasoning/Gettering Processes

After the processing step or multiple processing steps, such as the exemplary steps discussed above, have been performed on the wafer in chamber 15, the wafer is transferred out of chamber 15 for subsequent process steps as needed. When the vacuum lock door is closed, sealing chamber 15 without a wafer on heater 25, chamber 15 may undergo a chamber cleaning process to eliminate deposition process residues such as undesired oxides and/or nitrides from portions of chamber 15, including the unlined chamber walls in the lower portion of chamber 15, the bottom of heater 25, as well as other chamber components. To ensure reliable wafer-to-wafer repeatability, the chamber clean removes any residues built up during the deposition processes. These residues can be cleaned from chamber components by using fluorine radicals, for example, from a plasma formed with reactive clean gases by remote microwave plasma system 55. Due to its high reactivity with F atoms, residue silicon oxide can be removed by the formation of a $SiF_4$ gas product which may be pumped away out of chamber 15. The chamber cleaning procedure discussed below may be performed after processing of every wafer or every several wafers.

In a preferred embodiment of the present invention, $NF_3$ is used as the clean gas to provide the fluorine radicals. The present invention preferably uses remote microwave plasma system 55 to decompose $NF_3$ gas and generate a flow of F atoms into chamber 15. Using a fluorine chemistry with remote microwave plasma system 55 of the present invention advantageously has low kinetic energy and does not have physical sputtering effects or formation of charging species in the subsequently deposited film, compared to in situ plasma processes. Furthermore, consistent with environmental requirements to reduce global warming effects, the use of $NF_3$ does not generate any long-lived perflourocarbon (PFC) products.

Figure 21:
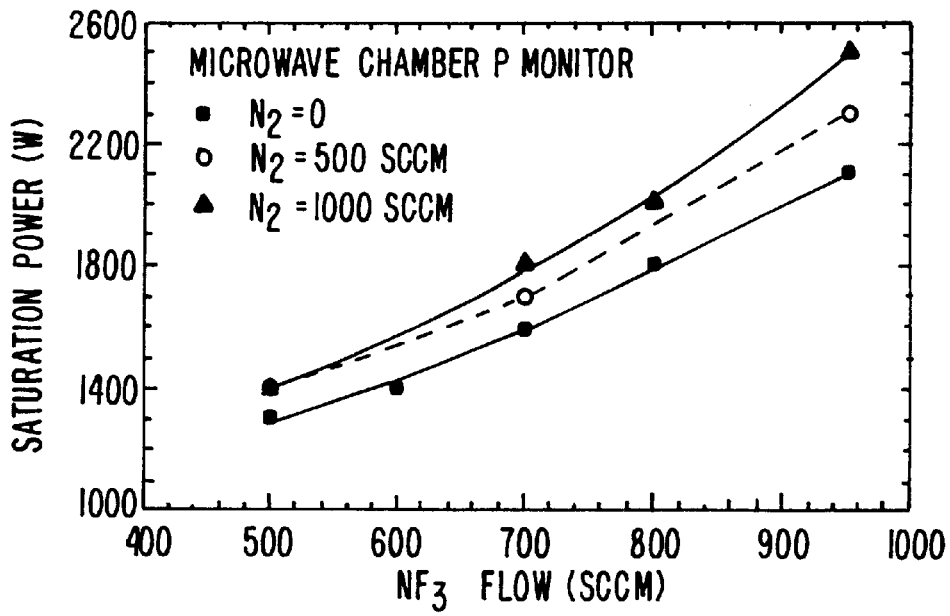
FIG. 21 illustrates the relationship between $NF_3$ flow and microwave saturation power that gives optimal cleaning rates provided with remote microwave plasma system 55 in accordance with a specific embodiment of the present invention.

To ensure the best clean efficiency, the F flux as well as its cleaning uniformity should be optimized. At a certain $NF_3$ gas flow, there is a threshold microwave power setting, above which the generation of F atoms are compensated by their recombination. FIG. 21 shows the relationship between $NF_3$ flow and microwave saturation power that gives the highest clean rate without any excessive hardware costs, in accordance with a specific embodiment of the present invention. As shown in FIG. 21, the microwave saturation power ranges from between about 1300–2100 Watts for corresponding $NF_3$ flows of between about 500–950 sccm, according to the specific embodiment. For a preferred embodiment discussed below, the microwave saturation power is about 2100 Watts for a $NF_3$ flow of about 950 sccm. The clean uniformity can be controlled by chamber pressure as well as heater spacing, both of which can adjust the mean free path of the gas species and pumping profile. As discussed earlier, since the highest pressure that can be tolerated by the above-discussed embodiment of applicator tube 292 is about 2 torr, spacing was used to optimize clean uniformity. In other embodiments using different embodiments of applicator tube 292, both pressure and spacing may be used in the clean uniformity optimization.

In an exemplary chamber cleaning process, chamber 15 is maintained at a temperature ranging between about 300–650° C., more preferably at about 550–600° C. throughout the cleaning procedure, in preferred embodiments. Most preferably, chamber 15 is maintained at the same temperature at which the particular process is being run in chamber 15. For example, chamber clean processes would be run at 600° C. in those chambers used, as an example discussed above, for depositing PSG films at 600° C. With the throttle valve opened and gate valve 280 closed, heater 25 is positioned about 100–250 mil, preferably about 150 mil, from gas distribution plate 20 so that gas distribution plate 20 is heated up. Heating up gas distribution plate 20 allows a faster clean to occur. This heating step may be done for between about 3–10 seconds, preferably about 5 seconds.

Then, pressure and clean gas flow are optimally stabilized before the clean is performed. During the pre-clean stabilization step, chamber 15 optimally should be maintained at pressure levels, which are also used during the clean step, where fluorine species are not rapidly removed and recombination does not occur. In the pre-clean stabilization step, chamber 15 is brought to a pressure between about 1–2 torr, preferably about 1.5 torr, with gate valve 280 is open. With chamber 15 maintained at pressures lower than about 1–2 torr, rapid removal of fluorine species occurred, resulting in poor chamber cleaning results. At chamber pressures higher than about 1–2 torr, recombination may occur due to collision losses, as well as causing overheating and damage to applicator tube 292. Heater 25 is moved away from gas distribution plate 20 to a distance of between about 450–700 mil, preferably about 600 mil. The clean gas, $NF_3$, is also introduced at a rate of between about 600–1100 sccm, preferably about 950 sccm, into applicator tube 292. This pre-clean stabilization step lasts between about 2–6 seconds, preferably about 3 seconds before microwave power is applied during the chamber clean step.

In the chamber clean step, the pre-clean stabilization conditions in chamber 15 are maintained at a pressure ranging between about 1–2 torr, preferably at about 2 torr. When the cleaning procedure is performed, microwave power of between about 500–2500 Watts is applied to applicator tube 292. Preferably, magnetron 711 provides about 2.45 GHz microwaves and is operated in CW mode at about 2100 Watts for the preferred clean gas flow of about 950 sccm. The microwaves are transmitted from magnetron 711 through the waveguide and optimizing system to enter applicator tube 292 through the window, as discussed above. UV lamp 731 ignites the reactive gases in applicator tube 292 to form a plasma, with ionization sustained by the microwave energy entering applicator tube 292 at the window.

During the chamber clean step, fluorine radicals from the plasma formed in applicator tube 292 to which microwaves are applied may then flow through opened gate valve 280 and into chamber 15 to clean surfaces of undesired oxide residues. Since the plasma is formed upstream of chamber 15, only the reactive fluorine radicals in the plasma are able to reach and remove the residue built-up portions of chamber 15. Therefore, various portions of chamber 15 are cleaned of deposition process residues while minimizing direct plasma damage to the chamber 15. The chamber clean lasts between about 30 seconds to about 10 minutes, preferably between about 60–200 seconds, and most preferably for about 160 seconds. Of course, the chamber clean time may vary depending on the thickness and type of oxide residue in chamber 15. As mentioned above, it is recognized that flow values may differ depending on the size and type of the chamber, as well as the dimensions and material of the applicator tube, used in other embodiments. The above-described clean process also reduces backside undesired residue deposition behind both the blocker and gas distribution plates.

After the chamber clean, additional post-clean steps may be performed. During the post-clean steps, chamber 15 is preferably maintained at the above temperatures discussed for the above deposition and clean processes. At the end of the chamber clean step, clean gas flow is stopped and microwave power is no longer supplied. Chamber 15 is pumped to remove most of the F residue atoms. During this post-clean pumping step, heater 25 is moved to a position of between about 1500–2200, preferably about 2000 mil, from gas distribution plate 20 while the throttle valve is opened and gate valve 280 remains open. The pumping step lasts between about 5–20 seconds, preferably about 10 seconds, depending on the amount of clean gas reactants and residue exhausted out of chamber 15. Clean endpoint detection system also may be utilized to assist in determining the stop time for the post-clean pumping until substantially all deposition process residues are removed from chamber 15.

After the fluorine-based chamber cleaning procedure, there may be some adsorption of active fluorine species on the surface of the chamber walls, close to where the wafer would be located when the next deposition process occurs. In the next deposition process, the fluorine might then interact or be incorporated into the deposited film, causing film sensitivity at the surface. This film sensitivity manifests itself as a rough surface, which may be problematic with the tolerances required by high integration devices, resulting in device malfunctions. The present invention provides the ability to getter any adsorbed fluorine from the surface of chamber walls by several methods discussed below.

After the post-clean pumping step, a seasoning may be performed to recombine all free F species by either chemical reaction or trapping the F to the chamber walls through silicon oxide ($SiO_2$) deposition. The post-clean pumping and seasoning steps are performed for reducing both particle formation and F content inside subsequently deposited films.

Optimally, between the post-clean pumping step and seasoning step is another stabilization step to stabilize chamber pressure and gas flow and to move heater 25 into position for the seasoning step. In this stabilization step, gate valve 280 is closed and chamber 15 is maintained at a pressure of between about 20–70 torr, preferably 50 torr. Heater 25 is also moved to a position of between about 300–550 mil, preferably about 500 mil, from gas distribution plate 20. In a specific embodiment, the seasoning step presently described uses ozone and TEOS with helium as the carrier gas to season chamber 15 for subsequent silicon oxide deposition. Of course, other gases may be used in the seasoning and pre-seasoning stabilization steps, depending on the type of silicon oxide deposition desired. In the pre-seasoning stabilization step, liquid TEOS at a flow rate of between about 200–400 mgm, preferably about 300 mgm, is vaporized and transported with a helium carrier gas flowing at a rate of between about 4000–8000 sccm, preferably at about 6000 sccm, into chamber 15. Gas flows may be introduced into chamber 15 via the normal inlets used for deposition or via applicator tube 292 without application of microwaves. This stabilization step lasts between about 5–25 seconds, preferably about 15 seconds, before the seasoning step begins with the introduction of the oxygen source to begin deposition of the seasoning oxide onto chamber 15. In the thermal seasoning step, ozone is introduced at the flow rate used for the particular deposition process used (e.g., about 5000 sccm for the experimental USG deposition process at 550° C. discussed above, or about 4000 sccm for the experimental PSG deposition process at 600° C. discussed above) for between about 10–20 seconds, preferably about 15 seconds, to deposit a thin layer of silicon oxide (e.g., the experimental USG deposition process having about 12.5 wt % oxygen, or the experimental PSG deposition process having about 8 wt % oxygen) onto surfaces in chamber 15. During the seasoning step, the ozone flow is optimally consistent with the deposition process to minimize any fluctuation in ozone flow and concentration. Seasoning chamber 15 thereby can trap fluorine atoms that may have been adsorbed onto the surfaces of chamber 15.

Following the thermal seasoning step discussed above, final stabilization and pumping steps may be performed. Optimally, these final steps are also performed at the deposition temperatures discussed above. In the final stabilization step, the throttle valve is opened periodically to allow the chamber pressure to adjust to atmosphere, while gate valve 280 remains closed. Heater 25 is moved to a position of between about 800–1000 mil, preferably about 999 mil, from gas distribution plate 20. TEOS flow is stopped, while helium and ozone flows remain the same as in the seasoning step. The final stabilization step is performed for a time period of between about 5–20 seconds, preferably about 10 seconds, before the final pumping step begins. In the final pumping step, gate valve 280 remains closed and heater 25 is not moved. All gas flows are stopped and the throttle valve is opened. The final pumping step lasts between about 5–20 seconds, preferably about 10 seconds, before another wafer is introduced into chamber 15, which is now ready for the next deposition process, heating, or wafer cleaning step. It is recognized that final stabilization and pumping steps also may be modified and similarly used with the particular seasoning step or alternative gettering step (examples discussed below) selected.

In embodiments alternative to those discussed above, the pre-clean stabilization step discussed above may further include a ramping of the microwave power from a low microwave power to the final clean operating level of microwave power, allowing pre-clean stabilization of pressure and microwave plasma generation. In a preferred alternative embodiment, the pre-clean stabilization step discussed above may be substituted with the following pre-clean stabilization.

Allowing for simultaneous stabilization of pressure and microwave power, the step of ramping up the microwave power to generate a $N_2$ (or other inert gas, depending on the clean gas used) plasma provides a lower pressure shock profile on applicator tube 292 upon $NF_3$ plasma generation, in accordance with a specific embodiment. Microwave power levels applied to magnetron 711 from microwave power supply 110 may be adjusted under the control of processor 50. For example, the microwave power may be ramped from zero to a level of about 300 Watts (or some other power level between 0 and the final clean operating power level) during the stabilization step, and then to 2100 Watts in the clean step, to provide a more gradual, optimal stabilization process. Specifically, after the heating step, heater 25 is moved to a position about 600 mil from gas distribution plate 20 and $N_2$ is introduced at a flow of between about 100–400 sccm, preferably about 300 sccm, into applicator tube 292, while the throttle valve remains open and gate valve 280 remains closed. After about 5 seconds, the throttle valve is closed and gate valve 280 is opened, allowing pressure to stabilize for the next 5 seconds as chamber 15 is brought to the clean process pressure, about 1.5 torr in a specific embodiment. Then, an intermediate level of microwave power between about 200–400 Watts, preferably about 300 Watts, is applied to applicator tube 292 to form a $N_2$ plasma during the next 5 seconds. For the next 5 seconds, $NF_3$ is also introduced into applicator tube 292 while the microwave power level is ramped to the clean level. Specifically, $NF_3$ may be introduced at a rate between about 600–1100 sccm, preferably about 950 sccm, into applicator tube 292, while the microwave power level is ramped up to the final microwave power clean operating level of about 2100 Watts. Then, $N_2$ flow is stopped and plasma is generated using only $NF_3$, allowing for stabilization of the $NF_3$ plasma generation stabilization for about 5 seconds. From this point, the clean may proceed, as discussed above. In the above discussed alternative embodiment, both pressure and plasma generation are stabilized prior to performing the cleaning step with the $NF_3$ cleaning plasma. This alternative pre-clean pressure/plasma stabilization may last for a total time period preferably between about 20–30 seconds with each power level ramp-up allotted an appropriate slice of time from the time period. Accordingly, pressure shocks from an immediate, one-step application of high microwave power (for example, from 0 to 2100 Watts) on applicator tube 292 are thus minimized, resulting in an enhanced lifespan for applicator tube 292.

Although the above described embodiment is a two-step power level ramp-up, other embodiments may have multiple-step ramp-ups (for example, from 0 to 300 to 1200 to 2100 Watts). Further, a microwave power ramp-down step optionally may be performed between the above described clean step and the post-clean pumping step. Two-step or multiple-step ramp-downs also are possible for other embodiments. Of course, the ramping may be continuous, a series of discrete steps, or a combination thereof. For CVD systems which have a RF plasma system, ramp-up and/or ramp-down of RF power levels may be performed for pre-clean stabilization steps where an in situ plasma chamber clean is used, in accordance with further embodiments. Although specific times are discussed above for each part of the stabilization, in other embodiments, the specific times may be varied and parts of the stabilization may be combined or eliminated to reduce time.

As an alternative to the thermal chamber seasoning discussed above, a chamber seasoning may be employed which uses TEOS and $O_2$. Vaporized TEOS may be introduced into chamber 15 via inlet 43 and gas mixing box 273 or using the bypass passage in the lid. The $O_2$ is sent through applicator tube 292 for radiation (for example, between about 500–2100 Watts, preferably 2100 Watts) by microwaves from magnetron 711 of microwave plasma system 55, to produce atomic oxygen. $O_2$ may be introduced into applicator tube 292 at a flow rate of between about 50–200 sccm, preferably about 100 sccm, while gate valve 280 is opened and chamber 15 is maintained at a pressure of between about 1–2 torr, preferably about 1.5 torr, and a temperature of between about 300–650° C., preferably between about 550–600° C. The atomic oxygen is able to react with the TEOS in chamber 15 to provide a microwave-enhanced chamber seasoning. Alternatively, for embodiments having a RF plasma system able to provide an in situ plasma, vaporized TEOS may be introduced into chamber 15 where the RF plasma system can create a plasma with which the atomic oxygen may react for a RF-enhanced chamber seasoning.

As another alternative to chamber seasoning to provide gettering of fluorine atoms from chamber surfaces, $SiH_4$ may be flowed at a rate of between about 50–200 sccm, preferably about 100 sccm, into chamber 15 to purge chamber 15. Silane may flow into chamber 15 via line 85 into chamber 15 from one of the other supply sources 90 (FIG. 1C) to gas mixing system 93 with closed gate valve 280, via other purge inlets to chamber 15 with closed gate valve 280, or via applicator tube 292 with or without application of microwaves and with opened gate valve 280. During the silane purge procedure, chamber 15 is maintained at a pressure of about 1–5 torr and a temperature of between about 300–650° C., preferably between about 550–600° C., with gate valve 280 closed. Purging chamber 15 absorbs the F atoms and results in the formation of $SiF_4$ gas, which is then pumped out of chamber 15 via the exhaust system. The endpoint detection system, as described above in detail, then allows the system to determine when the chamber cleaning process is completely done.

As a further alternative to seasoning or to purging chamber 15 with silane, as described above, gettering may be achieved by providing active hydrogen into chamber 15. Hydrogen (e.g. $H_2$ or other hydrogen source) would be used as the "clean gas" supply source at a flow rate of between about 50–200 sccm, preferably about 100 sccm, and sent via switching valve 105 into applicator tube 292 via inlet 57 (FIG. 1C). Magnetron 711 is operated at CW mode at a power level of between about 500–2500 Watts, preferably about 1000 Watts, to provide microwave energy to applicator tube 292, thereby producing a plasma therein. The active hydrogen from the plasma in applicator 292 would then flow through the lined passage in enclosure assembly 200 and into conduit 47 for use in chamber 15. Of course, for systems which also include RF plasma systems, hydrogen may be introduced into chamber 15 and RF energy applied in chamber 15 to provide the active hydrogen. During the gettering procedure, chamber 15 is maintained at a pressure of about 1–2 torr and, optimally, at the deposition temperature of about 300–650° C., preferably between about 550–600° C. with gate valve 280 open. The active hydrogen reacts with the adsorbed fluorine to produce hydrogen fluoride (HF) vapor which may then be pumped out of chamber 15. An endpoint detection system, operating on similar principles as the endpoint system described above but to detect changes in light intensity due to absorbance by HF, may also be used.

Yet another alternative to seasoning, purging chamber 15 with silane, or using active hydrogen, is to provide ammonia into chamber 15. Ammonia ($NH_3$) would be used as the "clean gas" supply source in gas panel 80 at a flow rate of between about 50–200 sccm, preferably about 100 sccm, and sent via switching valve 105 into applicator tube 292 via inlet 57 (Fig. IC). Magnetron 711 is operated at CW mode at a power level of between about 500–2500 Watts, preferably about 1000 Watts to provide microwave energy to applicator tube 292, thereby producing a plasma therein. The ammonia from the plasma in applicator 292 would then flow through the lined passage in enclosure assembly 200 and into conduit 47 for use in chamber 15. During the gettering procedure, chamber 15 is maintained at a pressure of about 1–2 torr and, optimally, at the deposition temperature of between about 300–650° C., preferably between about 550–600° C. with gate valve 280 open. The ammonia reacts with the adsorbed fluorine to produce an ammonium fluoride compound and HF vapor which may then be pumped out of chamber 15. Of course, for systems which also include RF plasma systems, ammonia may be introduced into chamber 15 and RF energy applied in chamber 15 to provide the ammonium fluoride compound and HF. An endpoint detection system, operating on similar principles as the endpoint system described above but detecting light intensity changes due to absorbance by ammonium fluoride and HF, may also be used.

Although the cleaning process conditions described above are exemplary for the present embodiment, other conditions may also be used. The above description discusses $NF_3$, merely as an example, in a Giga Fill™ Centura chamber available from Applied Materials fitted for 200-mm wafers and having 6 liters total volume, as do the various deposition descriptions below. However, other fluorine-containing or chlorine-containing gases, such as $NF_3$ and argon, $NF_3$ and $N_2$, $NF_3$ and $O_2$, $NF_3$ and atomic oxygen generated by microwave plasma system 55, dilute $F_2$, $CF_4$, $C_3F_8$, $SF_6$, $C_2F_6$, $Cl_2$, etc., may be used as well. Other gases besides those described above also may be used for the gettering procedure. Also, pre-seasoning stabilization steps would vary depending on the particular type of seasoning/gettering process selected from the various alternatives to the above discussed thermal seasoning. The above descriptions for cleaning, gettering, and seasoning are stated to occur at preferred temperatures (for example, about 550–600° C.), but it is noted that, most preferably, chamber 15 is maintained at the same temperature at which the particular process is being run in chamber 15. Of course, different temperatures also may be used in other embodiments. Further, some embodiments may combine, add, or eliminate some portions of the cleaning, gettering, and seasoning steps described above.

III. Test Results And Measurements

A. Ultra-shallow Doped Junctions

To demonstrate the operation of the apparatus and method according to embodiments of the present invention, experiments were performed measuring the sheet resistivity and junction depths of ultra-shallow junctions formed using as examples BSG films manufactured without a USG capping layer and formed using BSG films with a USG capping layer. The uncapped BSG films were about 150 Å thick, while the capped BSG films were about 150 Å thick with about a 200 Å USG cap. Both capped and uncapped BSG films were deposited on a low-resistivity N-type silicon wafer. Sheet resistivity and junction depths of ultra-shallow junctions formed using the uncapped and capped BSG films were measured. For films deposited in chamber 15 of CVD apparatus 10, described in detail above, gate valve 280 is closed during the film deposition steps according to a specific embodiment. Actual process conditions used in the experiments are as follows. Specifically, the BSG films were deposited at a temperature of about 500° C. and at a pressure of about 600 torr. Spacing between the susceptor and manifold was about 300 mil. Gas flows in the experiments included introducing TEB into the chamber at a rate of about 200 mgm, introducing TEOS at a rate of about 500 mgm, introducing oxygen ($O_3$) at a rate of about 5000 sccm, and introducing the helium carrier gas at a rate of about 8000 sccm.

The above conditions resulted in BSG film deposited at a rate of 700 Å/minute. The deposited BSG film had a thickness of about 150 Å for a process time of about 15 seconds.

In experiments where a USG cap was used, the USG capping layer was formed in an in situ process immediately after the bulk BSG layer was deposited. The preferred embodiments use a chamber that is a closed system which minimizes moisture available to react with the BSG film before deposition of the USG capping film. The susceptor was heated to a temperature of about 500° C., the chamber was maintained at a pressure of about 600 torr, and the susceptor was positioned about 300 mil from the gas distribution manifold. TEOS, ozone and helium were introduced into the deposition chamber at flow rates of about 500 mgm, 5000 and 5000 sccm, respectively. The above conditions resulted in a USG film deposited at a rate of about 700 Å/minute. A USG film had a thickness of about 200 Å for a process time of about 15 seconds.

Diffusion of dopants from the uncapped and capped BSG films is achieved by heating the film using annealing or a rapid thermal process. For example, a rapid thermal process for 60 seconds in a nitrogen ($N_2$) ambient may result in a junction depth of about 500–1000 Å depending on the temperature, time and dopant concentration.

The parameters used in the experiments using BSG films should not be limiting to the claims as described herein. One of ordinary skill in the art can also use other chemicals, chamber parameters, dopants, and conditions to produce BSG films or other films such as PSG, AsSG, and others.

Experiments were conducted using uncapped BSG films of about 200 Å thickness having about 6 wt % of boron. These experiments illustrate the ability to form ultra-shallow junctions using BSG films as the dopant source for a subsequent diffusion step.

At boron concentrations exceeding 6 wt % boron, uncapped BSG films deposited at temperatures less than about 500° C. tended to become unstable and to crystallize within hours. As mentioned above, crystallization reduces the amount of boron atoms available for diffusion into the silicon substrate. Deposition of BSG at temperatures greater than about 550° C. are believed to provide stable uncapped BSG films with boron concentration of more than 6 wt %. For applications where boron concentrations greater than 6 wt % boron are needed, BSG films may be optimally capped with a USG film to prevent crystallization. By preventing outgassing, the USG cap also provides the ability to control the direction of the diffusion of dopant atoms into the silicon substrate. The USG cap therefore prevents more boron atoms from being lost so that more boron atoms are available for diffusion that may be directed more easily into the silicon substrate.

To demonstrate the further advantages of using a capping layer over the doped dielectric layer for some applications, further experiments were conducted using BSG films having about a 150 Å thickness and a 6.131 wt % boron, with about a 200 Å USG cap deposited over the BSG film. These further experiments illustrate the ability to form ultra-shallow junctions using capped BSG films as the dopant source for a subsequent diffusion step. Sheet resistivity and junction depth of the ultra-shallow junctions formed using uncapped and capped BSG films were measured. These experiments show that subjecting the BSG film to a 1 minute rapid thermal process at about 1050° C. provides the capability to control the sheet resistivity and junction depth of ultra-shallow junctions formed with either the BSG film alone or with the BSG film with USG cap.

Figure 22A:
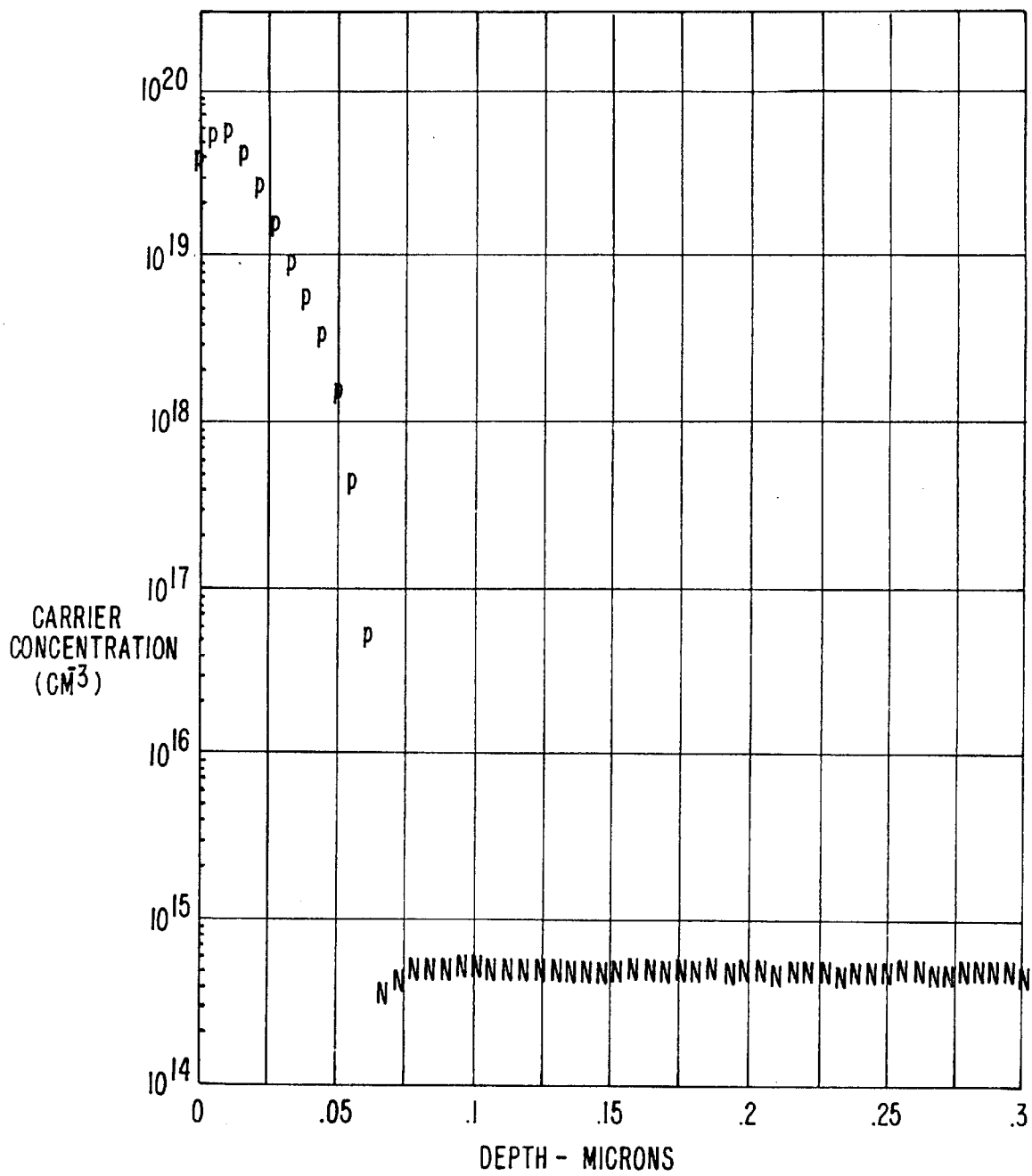
FIGS. 22A–22C are graphs illustrating experimental results showing the dopant profile of the ultra-shallow junctions formed using capped BSG films produced according to an embodiment of the present invention.
Figure 22B:
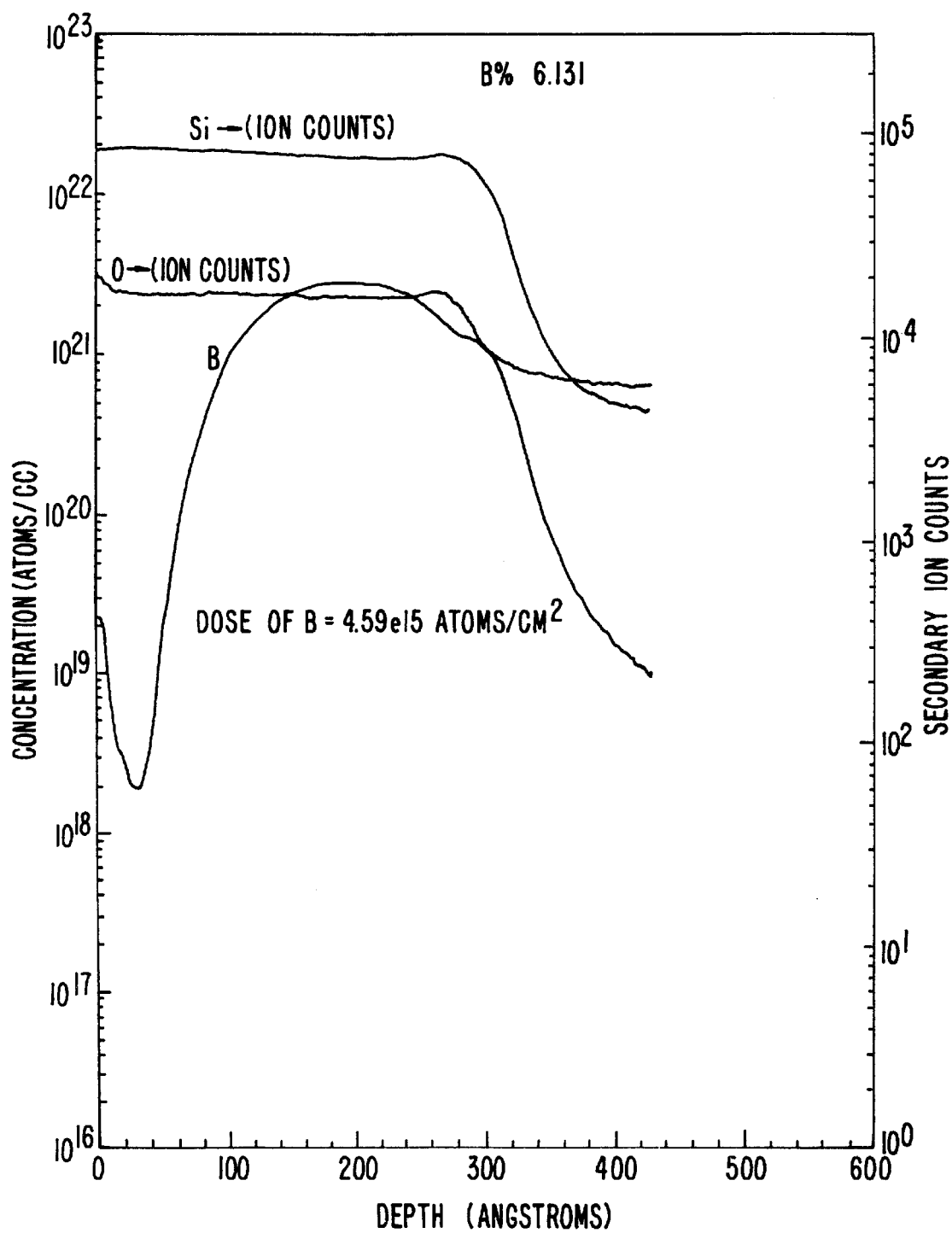
Figure 22C:
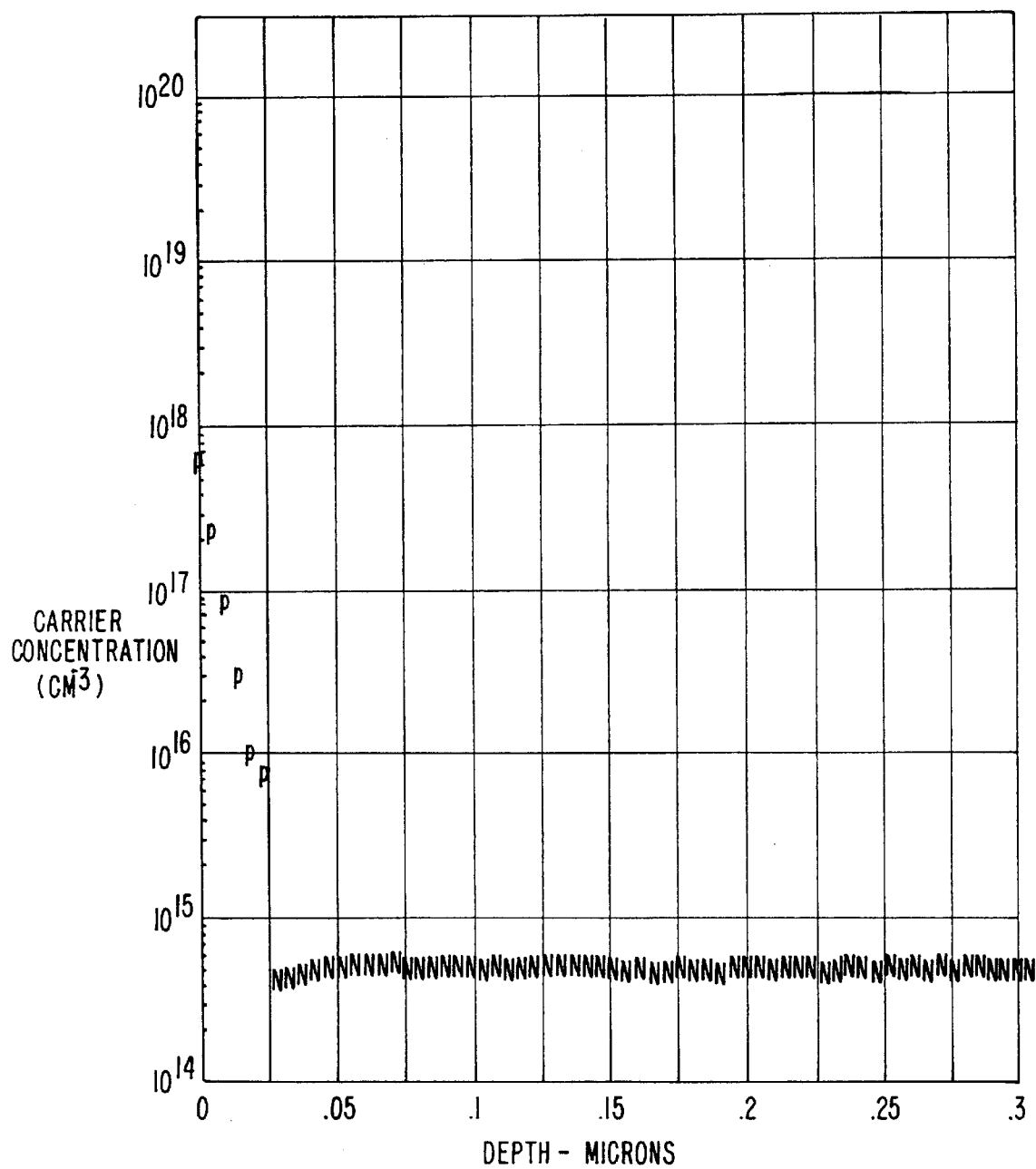

FIGS. 22A–22C provide information about the effect of the USG cap on the junction depth and dopant uniformity of the diffused regions. Measurements for FIGS. 22A and 22C were performed using solid state measurement equipment for the spreading resistance profiles, as is well known to those skilled in the art. Carrier concentration is shown as a function of depth. A "p" represents the measured concentration of boron at a depth measured from the silicon substrate surface, and an "N" represents the measured concentration of the N type silicon substrate at a depth measured from the silicon substrate surface. The junction depth is defined as the position where the dopant concentration equals the substrate concentration. In the present experiments, the silicon substrate used had a substrate concentration of about $1.6 \times 10^{14}$ carriers/cm$^3$. Sheet resistivity of the diffused regions shown in FIGS. 22A and 22C was measured using four-point probe (4 pp) techniques, as are well known to those skilled in the art. FIG. 22B illustrates the total impurity profile of the wafer of FIG. 22A as measured by the more elaborate method of secondary-ion-mass-spectroscopy (SIMS) which is useful for providing precision profile measurements in high-concentration or shallow-junction diffusions, as is well known to those skilled in the art.

Specifically, FIG. 22A is a graph showing the dopant profile of an ultra-shallow junction formed after a heating step using a 6.131 wt % BSG layer having a USG capping layer. The BSG film was about 150 Å thick and the USG capping layer deposited on top of the BSG film was about 200 Å thick. The heating step was performed by a rapid thermal process for about 60 seconds at about 1050° C. The BSG and USG films were then stripped by etching. As seen in FIG. 22A, the resulting junction has a depth of about 0.06 μm in the silicon substrate, and the dopant profile appears fairly uniform. The maximum concentration of boron is about $6 \times 10^{19}$ carriers/cm$^3$. The sheet resistance of the resulting junction was measured to be about 685 Ω/cm$^2$. The 4 pp sheet resistance was measured to be about 222 Ω/cm$^2$, with the summation of dose ions in the P type layer measured ($\Sigma p$) being $1.6 \times 10^{14}$ carriers/cm$^2$.

FIG. 22B illustrates the dopant depth profile as measured by SIMS for an ultra-shallow junction described in FIG. 22A. From the surface of the silicon substrate to a depth of about 100 Å from the surface, the concentration of boron ranges between about $2 \times 10^{18}$ carriers/cm$^3$ to about $1 \times 10^{21}$ carriers/cm$^3$. Between about 100 Å to about 300 Å from the surface of the silicon substrate, the concentration of boron ranges between about $1 \times 10^{21}$ carriers/cm$^3$ to about $3 \times 10^{21}$ carriers/cm$^3$. Below about 300 Å from the surface of the silicon substrate, the concentration of boron, silicon, and oxygen diminishes rapidly indicating the bulk substrate. The steep shallow junction shown in FIG. 22B demonstrates the dopant incorporation possible according to an embodiment of the present invention.

FIG. 22C is a graph showing the dopant profile of an ultra-shallow junction formed without the heating step using a 6.131 wt % BSG layer having a USG capping layer. The BSG film was about 150 Å thick and the USG capping layer deposited on top of the BSG film was about 200 Å thick. No heating step was performed. The BSG and USG films were stripped by an etching technique. As seen in FIG. 22C, it appears a junction with a depth of about 0.025 μm has formed despite the lack of a heating step. Apparently, the junction has formed due to the high dopant concentration of boron in the BSG film diffusing into the silicon substrate even without a heating drive-in step. The maximum concentration of boron is about $7 \times 10^{17}$ carriers/cm$^3$. The sheet resistance of the resulting junction was measured to be about 55 Ω/cm$^2$, with the summation of dose ions in the P type layer ($\Sigma p$) being $4.9 \times 10^{11}$ carriers/cm$^2$.

Figure 23B:
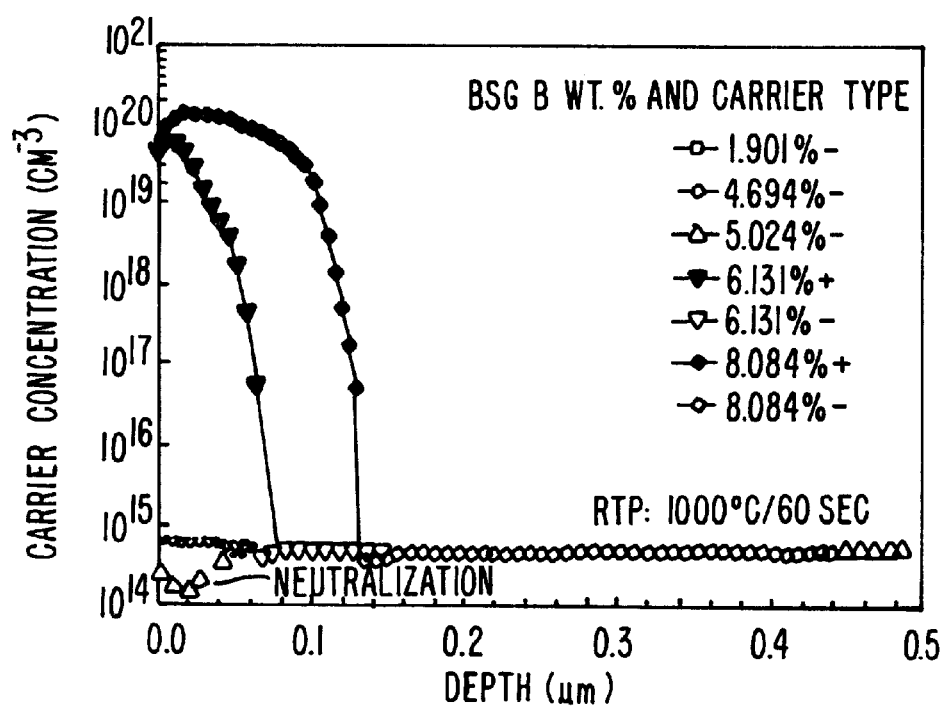
FIGS. 23A–23F are graphs illustrating further experimental results showing the dopant profile and sheet resistivity of the ultra-shallow junctions formed using different capped BSG films according to another embodiment of the present invention.
Figure 23A:
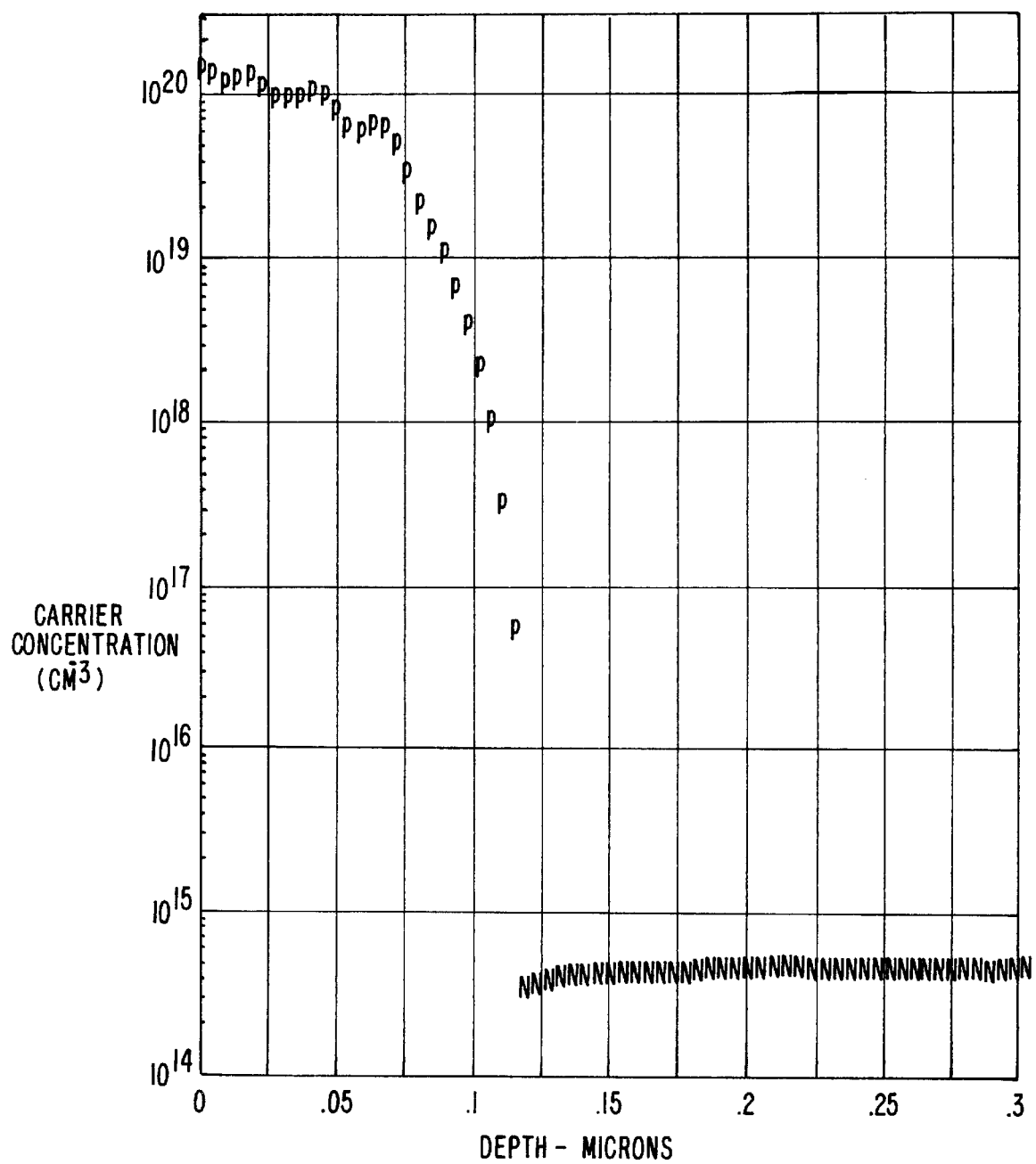

FIG. 23A is a graph showing the dopant profile of the junction formed with a heating step using an 8.084 wt %

Figure 23D:
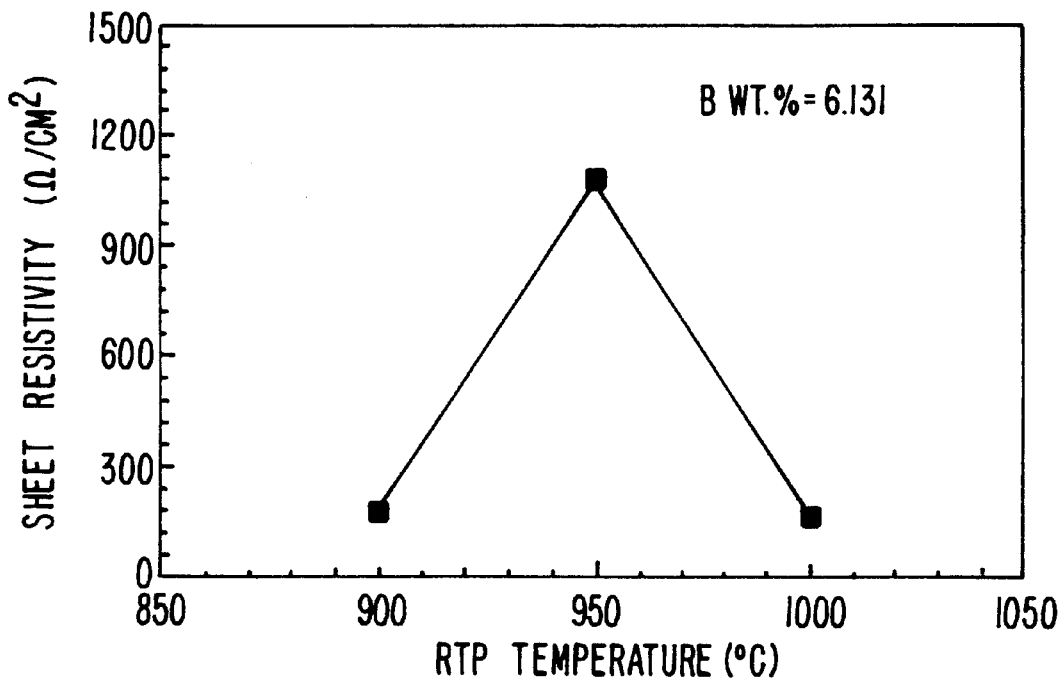
Figure 23C:
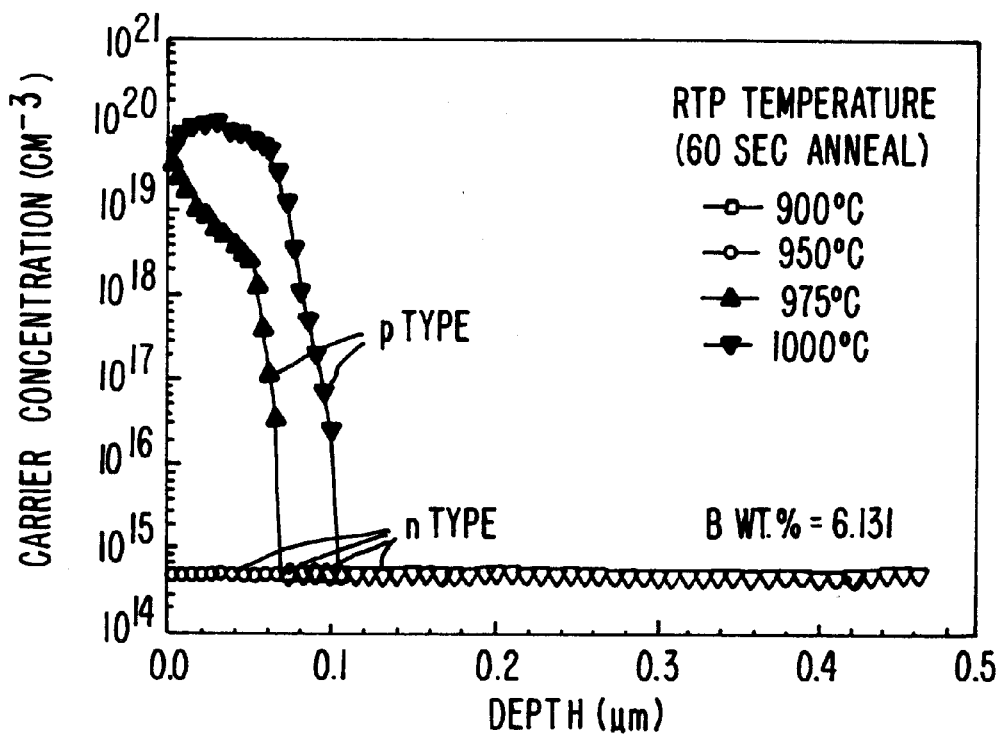
Figure 23F:
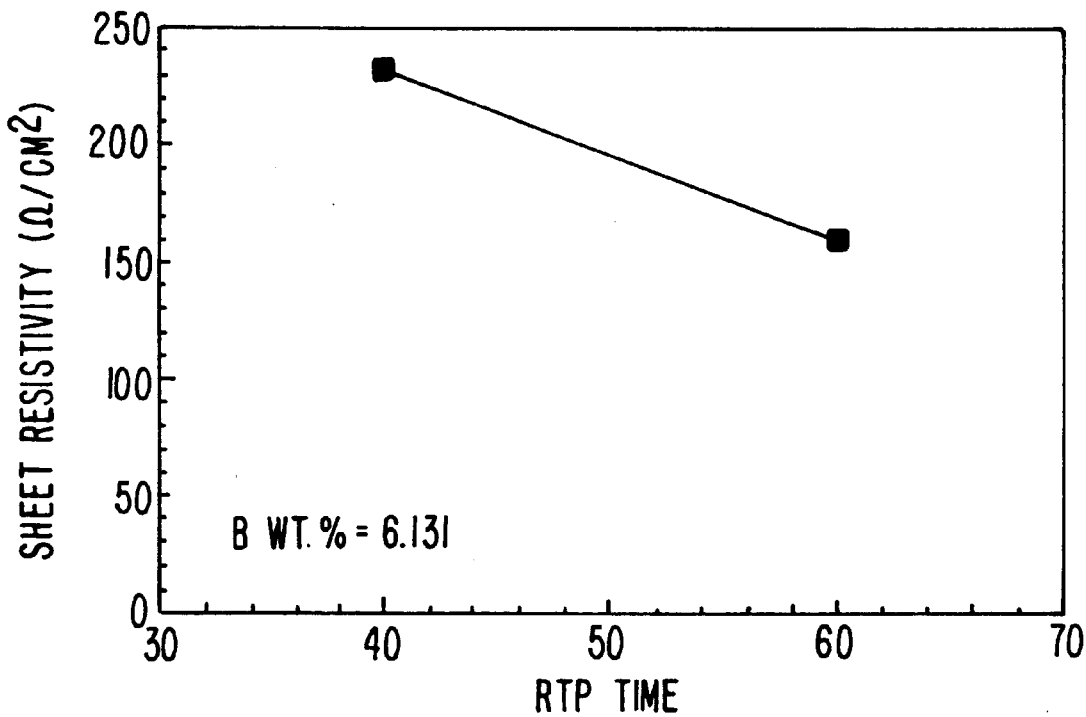
Figure 23E:
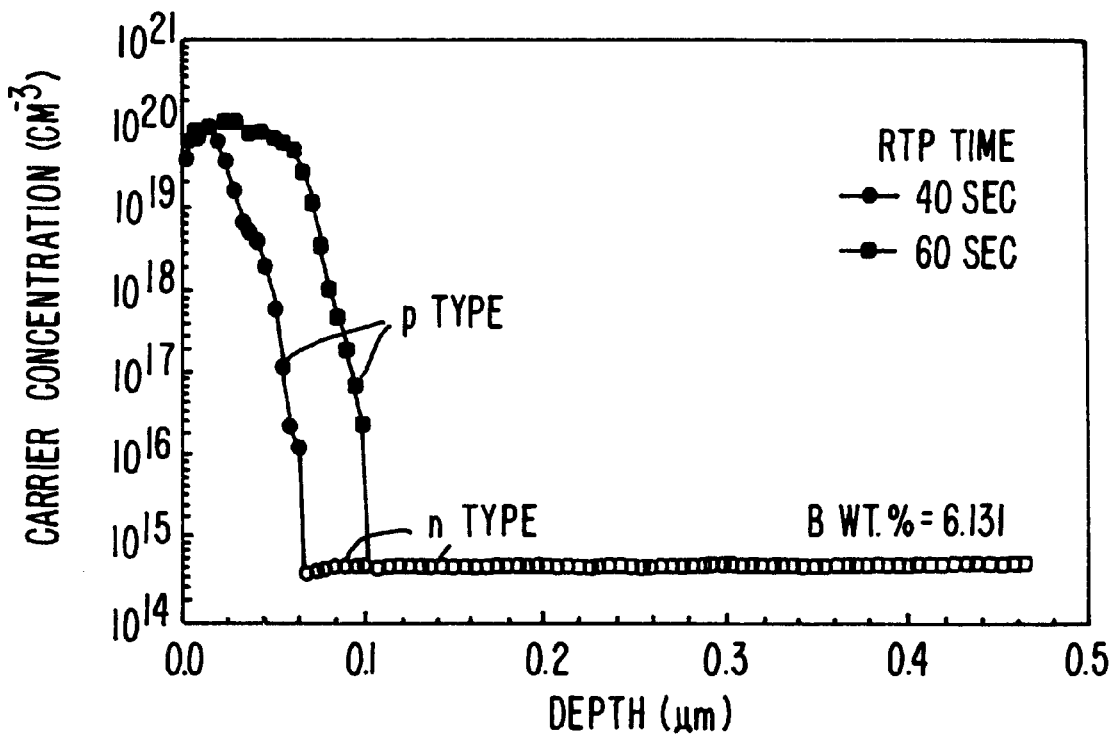

BSG layer having a USG capping layer. FIG. 23B is a graph comparing the dopant profiles of the junctions formed with the same heating step using a 6.131 wt % BSG layer having a USG capping layer and an 8.084 wt % BSG layer having a USG capping layer, in order to illustrate the effect of dopant concentration on junction depth. FIGS. 23C and 23D show the effect of the temperature of the heating step on junction depth and on sheet resistivity, respectively. FIGS. 23E and 23F show the effect of the time of the heating step on junction depth and sheet resistivity, respectively. The spreading resistance profiles and sheet resistivity measurements of FIGS. 23A–23F were performed using solid state equipment and four-point probe measurements.

FIG. 23A is a graph showing the dopant profile of the junction formed with a heating step using an 8.084 wt % BSG layer having a USG capping layer. The BSG film was about 150 Å thick and the USG capping layer deposited on top of the BSG film was about 200 Å thick. A heating step was performed using a rapid thermal process for about 60 seconds at about 1000° C. The BSG and USG films were stripped by an etching technique. As seen in FIG. 23A, an ultra-shallow junction having a depth of about 0.12 $\mu$m was formed with good dopant uniformity. The maximum concentration of boron is about $1 \times 20^{30}$ carriers/cm$^3$. The sheet resistance of the resulting junction was measured to be about 145 $\Omega$/cm$^2$, with the summation of dose ions ($\Sigma$p) being $7.9 \times 10^{14}$ carriers/cm$^2$. The 4 pp sheet resistance was measured to be about 96 $\Omega$/cm$^2$.

FIG. 23B shows the dopant profiles of the junctions formed with a heating step using different boron wt % BSG layers (in particular 6.131 wt % and 8.084 wt %) having USG capping layers. The BSG films were each about 150 Å thick and the USG capping layers deposited on top of the BSG films were each about 200 Å thick. The heating step performed was a rapid thermal process for about 60 seconds at about 1000° C. As seen in FIG. 23B, the resulting junction depth for the 8.084 wt % BSG film is almost twice as much as the resulting junction depth for the 6.131 wt % BSG film.

FIGS. 23C and 23D are graphs showing the effect of heating step temperature on dopant profiles and sheet resistivity, respectively, for 6.131 wt % BSG films having USG capping layers. The BSG films were about 150 Å thick and the USG capping layers deposited on top of the BSG films were about 200 Å thick. The heating steps were performed using a rapid thermal process for about 60 seconds at temperatures of about 900° C., 950° C., 975° C., and 1000° C. As shown in FIG. 23C, the junction formed after the heating step at 1000° C. is about 0.1 $\mu$m, compared to the about 0.06 $\mu$m junction formed after the heating step at the lower temperature 975° C. The sheet resistivity of the 6.131 wt % BSG film was about 180 $\Omega$/cm$^2$ for the heating step at 1000° C., and about 600 $\Omega$/cm$^2$ for the heating step at 975° C., as seen in FIG. 23D. A higher temperature heating step (beyond 950° C.) results in a deeper diffusion depth for the shallow junction formed.

FIGS. 23E and 23F are graphs showing the effect of heating step time on dopant profiles and sheet resistivity, respectively, for 6.131 wt % BSG film having USG capping layers. The BSG films were about 150 Å thick and the USG capping layers deposited on top of the BSG films were about 200 Å thick. The heating step was performed using a rapid thermal process at about 1000° C. for about 40 seconds and for about 60 seconds. As shown in FIG. 23E, the junction formed after about a 40-second heating step is about 0.06 $\mu$m, while the junction formed after a 60-second heating step is abut 0.1 $\mu$m. The sheet resistivity of the 6.131 wt % BSG films was about 230 $\Omega$/cm$^2$ after the 40 second heating step and about 150 $\Omega$/cm$^2$ after the 60 second heating step. Accordingly, it is seen that the length of time of the heating step may determine the diffusion depth in forming ultra-shallow junctions.

The above experiments of BSG used for ultra-shallow doped junction formation are presented merely as examples to illustrate aspects of the present invention and should not be considered as limiting the scope of the present invention.

B. PSG For PMD layer

To demonstrate the operation of the apparatus and method according to embodiments of the present invention, experiments were performed to deposit a PSG film, for example, as a PMD layer. Prior to the deposition of PSG film as the PMD layer, the wafer has typically been subjected to multiple processing steps to form, for example, gate electrodes, oxide sidewalls, isolation trenches, etc. In the experiments, the PSG films were deposited in a resistively-heated Giga Fill™ Centura chamber (a closed system having a total volume of about 6 liters and outfitted for 200-mm wafers) manufactured by Applied Materials, Inc.

In the experiments, pre-deposition steps were performed to bring chamber 15 to the desired deposition pressure and to stabilize the gas/liquid flows before depositing the PSG film as a PMD layer on a wafer. Of course, it is recognized that pre-deposition steps may be varied from the below description (which is merely an exemplary specific embodiment), as is optimal for different deposition recipes. The pre-deposition steps reduce unnecessary deposition on chamber walls and also contribute to yielding uniform depth profiles for the deposited films. Before any pre-deposition steps occur, a wafer is loaded in vacuum chamber 15 onto heater 25 through the vacuum-lock door, which is then closed. Heater 25 is heated up to the processing temperature of about 600° C., which is maintained throughout the pre-deposition steps, the deposition step and the post-deposition steps.

In a first pre-deposition step, heater 25 is at a position about 600 mil from gas distribution plate 20. With the throttle valve open for about 5 seconds, helium at a flow rate of about 4000 sccm, and O$_2$ at a flow rate of about 2900 sccm are introduced into chamber 15. The neutral gases, helium and O$_2$, are introduced first into chamber 15 for their flow rates to stabilize. These flow rates of helium and O$_2$ are maintained throughout the pre-deposition steps.

In the second pre-deposition step, the throttle valve is closed and the pressure in chamber 15 is increased to the deposition pressure. The second pre-deposition step lasts about 30 seconds and allows the pressure, which may initially fluctuate somewhat around the desired deposition pressure, to stabilize in chamber 15. Heater 25 is moved to the processing position of about 330 mil from gas distribution plate 20 in second pre-deposition step.

In the third pre-deposition step, when the pressure in chamber 15 has stabilized to the deposition pressure of about 450 torr, liquid TEOS is introduced to allow stabilization of TEOS and helium flow. With the TEOS flow rate at about 1000 mgm, the vaporized TEOS gas mixes with the helium carrier gas for about 3 seconds during the third pre-deposition step, before the deposition step.

Having stabilized the chamber pressure, temperature, and TEOS/helium gas flows, and adjusted the position of heater 25, deposition processing can begin. At the onset of the deposition step, O$_2$ flow is terminated. Liquid TEPO is introduced at a rate of about 24 mgm, and O$_3$ (about 8 wt % oxygen) is introduced at a rate of about 4000 sccm. Being liquids, the TEPO and TEOS sources are vaporized by the liquid injection system and then combined with the inert carrier gas helium. This mixture is introduced into chamber 15 from gas distribution plate 20 to supply reactive gases to the wafer surface where heat-induced chemical reactions take place to produce the desired PSG film. The above conditions result in a PSG film deposited at a rate of about 1780 Å/minute. By controlling the deposition time, a PSG film having a thickness of about 5300 Å is formed at the process conditions described above in about 404 seconds. The wt % of phosphorus in the resulting PSG film is about 4 wt %.

After deposition, a termination step is performed that is optimizes the stability of the deposited PSG film to provide moisture and crystallization resistance. In the termination step, which lasts for about 3 seconds, the deposition conditions are maintained while TEPO flow is terminated. The termination step therefore deposits a USG capping layer in an in situ manner in chamber 15, by the gas termination method discussed above. The USG layer is very thin compared to the thickness of the bulk PSG film.

After the PSG deposition and USG deposition steps, post-deposition steps are utilized to control the ramping down of chamber pressure and to control gas shut-off. By adjusting the pressure and gas shut-off, the post-deposition steps help reduce particle formation which otherwise can cause wafer contamination and damage.

In a specific embodiment, three post-deposition steps were used. In the first post-deposition step immediately following the above termination step, TEOS flow is terminated while heater 25 is moved into a position about 600 mil from gas distribution plate 20. Also, the throttle valve is opened periodically to allow chamber pressure to gradually ramp down during the first post-deposition step, which lasts about 15 seconds. In the second post-deposition step, the throttle valve is opened periodically to ramp down chamber pressure for the third post-deposition step (the pumping step), as helium flow into chamber 15 is terminated by pumping it through a bypass valve. Heater 25 is also moved lower to a position about 999 mil from plate 20 during the second post-deposition step, which lasts about 15 seconds. In the third post-deposition step, which lasts about 3 seconds, the throttle valve is opened and $O_3$ flow into chamber 15 is terminated by pumping it through a final valve.

The above experimental conditions for the deposition of PSG suitable for being used as a PMD layer are optimal to provide the best film quality with high throughput. By enhancing surface diffusion at increased surface temperature, the thermal PSG film deposited using the TEOS/$O_3$ chemistry at temperatures of about 600° C. exhibited excellent step coverage, more cross-linked structure, and more stable oxidization structure for P and Si, which yielded excellent film quality. The deposited PSG film was high quality in terms of flow-like step coverage, high moisture resistance, high breakdown voltage, smooth surface, no surface damage (i.e., plasma damage), and no fixed charge. The deposited PSG film exhibited good film thickness uniformity. Specifically, film thickness uniformity (49 pt., 1σ) at about 1.2 μm thickness of the deposited PSG film was measured to be less than about 1.5.

Figure 24A:
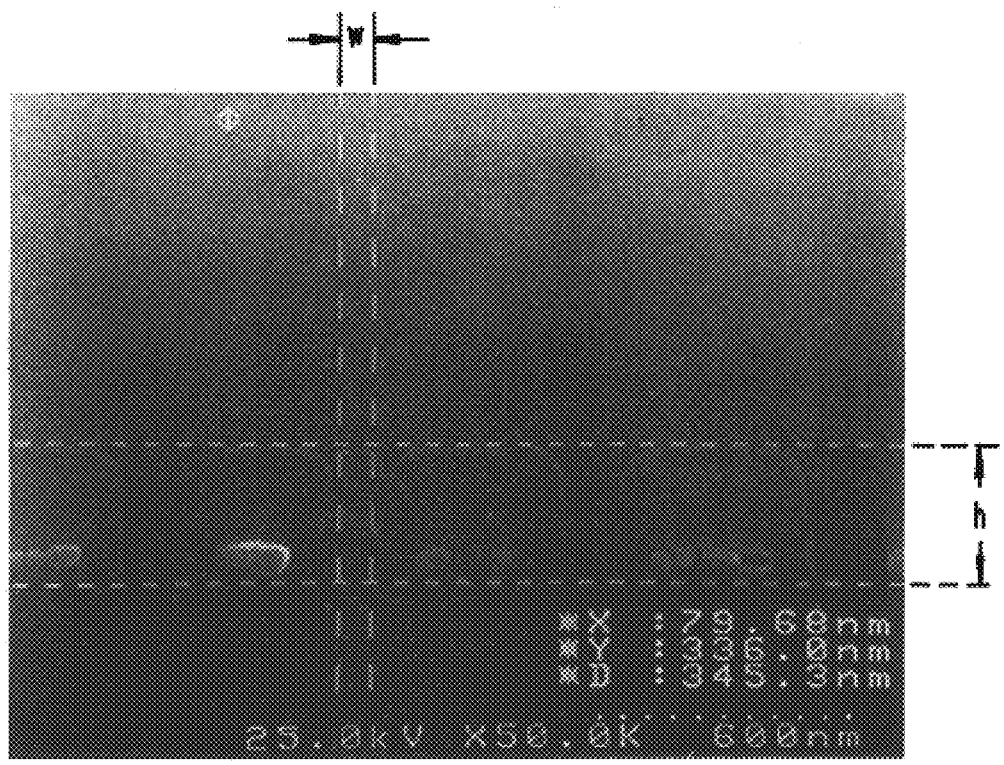
FIG. 24A is a photomicrograph demonstrating the as-deposited gap fill capabilities of PSG films deposited at 600° C. in accordance with a specific embodiment of the present invention.
Figure 24B:
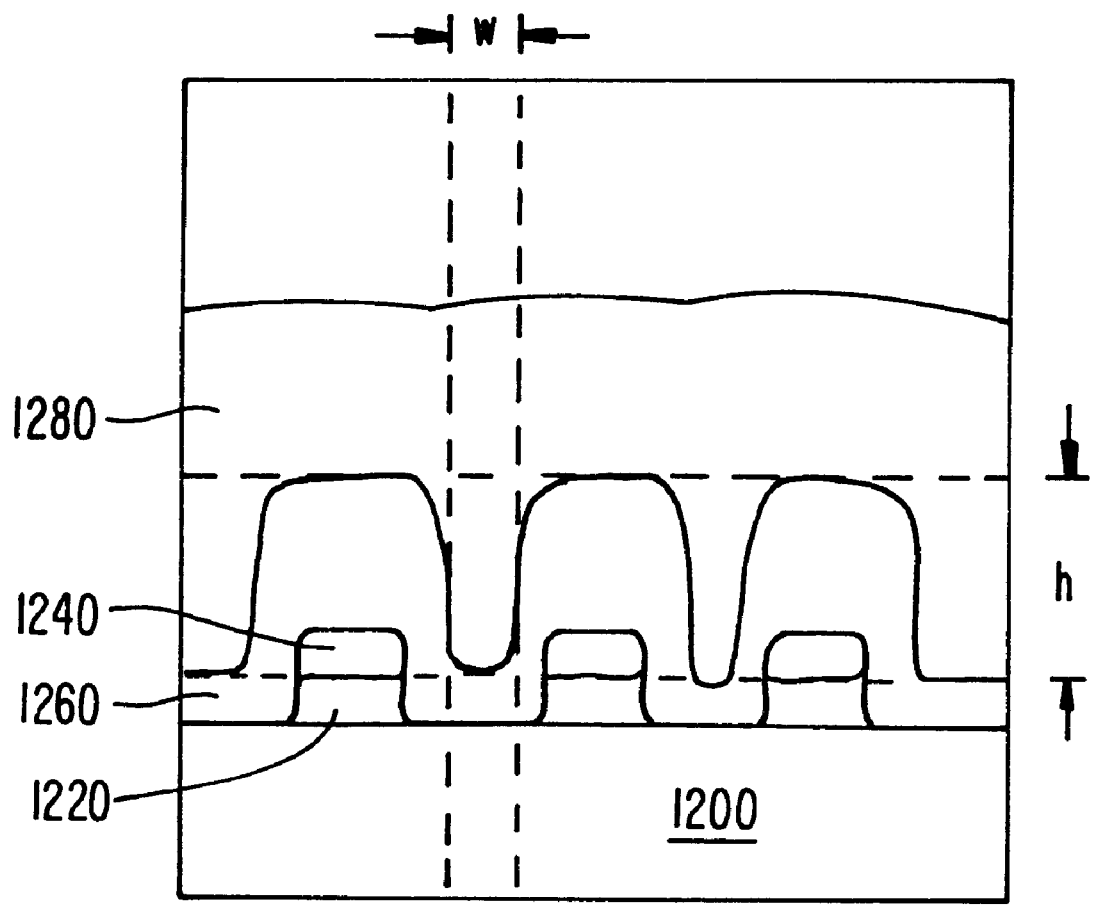
FIG. 24B is a simplified diagram of a section of the structure shown in FIG. 24A.

FIG. 24A is a photomicrograph demonstrating the as-deposited gap fill capabilities of PSG films deposited at 600° C. in accordance with a specific embodiment of the present invention. In particular, the PSG film deposited at 600° C. was shown to be capable of filling high aspect ratio gaps having a height (h) and a spacing (w) without the formation of voids, as seen in FIG. 24A. FIG. 24B is a simplified diagram (not shown to scale) of a section of the integrated circuit structure shown in FIG. 24A. As seen in FIG. 24B, substrate 1200 has stacked gate structures, specifically electrodes 1220 with tungsten silicide (WSi) caps 1240, formed thereon. An oxide layer 1260 is deposited onto stacked gate structures to form high aspect ratio gaps with h of about 0.35 μm and w of about 0.08 μm shown by dotted lines, as seen in FIGS. 24A–24B. FIG. 24A therefore demonstrates an exemplary structure with high aspect ratio (about 4.3:1) gaps that are filled by PSG film 1280, which is used as a PMD layer. Deposited at about 600° C. using the preferred recipe discussed above, PSG film 1280 exhibits excellent high aspect ratio gap fill capability without the need for a reflow typically done at about 750–800° C., which is often inconsistent with increasingly tight thermal budgets.

Figure 25:
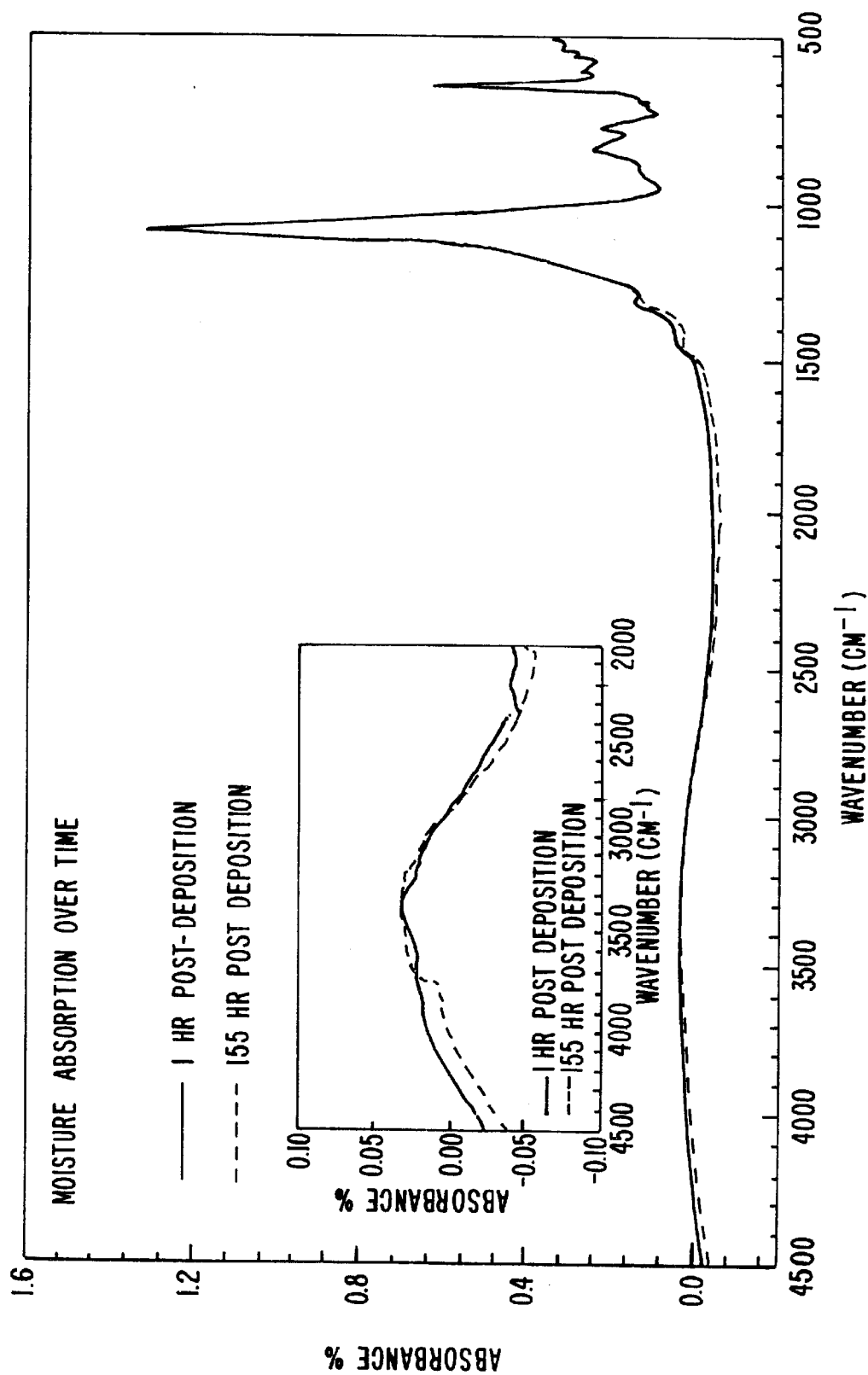
FIG. 25 illustrates the FTIR spectra of a PSG film deposited at about 600° C. under exemplary process conditions, according to a specific embodiment.

In addition to having excellent gap fill capability for high aspect ratios, PSG films deposited at about 600° C. advantageously are dense films that exhibit high resistance to moisture absorption. Moisture absorption of the deposited PSG film deposited was measured using conventional Fourier Transform Infrared spectroscopy (FTIR) techniques, as are well known to one of ordinary skill in the art. FIG. 25 illustrates the FTIR spectra of a PSG film deposited at about 600° C. under the following exemplary process conditions. According to a specific embodiment, the exemplary process conditions include TEOS flow of about 1000 mgm, TEPO flow of about 24 mgm, helium flow of about 6000 sccm, and ozone (about 12 wt % oxygen) flow of about 4000 sccm, at a pressure of about 400 torr and spacing of about 330 mil between heater 25 and gas distribution plate 20. The PSG deposition time was about 600 seconds. As seen in FIG. 25, the FTIR spectra of the PSG film deposited at about 600° C. demonstrated no water spikes indicating moisture absorption, and no measurable change in moisture absorption was seen over about 155 hours after deposition, illustrating the PSG film stability over extended periods.

As demonstrated by FIG. 25, the deposited PSG film is dense, resistant to absorbing moisture. Deposition of a PSG film at high temperatures, for example at about 600° C., tends to drive out any moisture that might be absorbed into the film, resulting in a dense film. As a dense film, the PSG film deposited at high temperature has the advantage of not requiring an additional step for further densification of the film. The dense nature of the deposited PSG film makes it compatible for use as a PMD layer which can be planarized either by a subsequent anneal at a temperature greater than about 1000° C., or preferably by a CMP step. In addition to moisture absorption resistance, the present PSG film deposited at high temperatures is able to provide good film thickness uniformity, as well as good gap fill without formation of voids or weak seams that can cause subsequent device problems. The high temperature PSG film is particularly useful as a PMD layer as it provides good phosphorus incorporation (between about 2–8 wt % phosphorus), which is important for gettering or trapping mobile ions such as sodium (Na+) ions that might otherwise migrate and cause shorting in the device.

The above description of experiments depositing and measuring characteristics of the deposited PSG film demonstrates its suitability for use, for example, as a PMD layer. However, the description should not be considered as limiting the scope of the invention.

C. USG For Oxide Filling Layer In Shallow Trench Isolation

To demonstrate the operation of the apparatus and method according to embodiments of the present invention, experiments were performed to deposit a USG film, for example, as a high quality oxide filling layer for shallow trench isolation. Prior to the deposition of USG film as the high quality oxide filling layer, the wafer has typically been subjected to multiple processing steps to form, for example, gate electrodes, oxide sidewalls, isolation trenches, etc. In the experiments, the USG films were deposited in a resistively-heated Giga Fill™ Centura chamber (a closed system having a total volume of about 6 liters and outfitted for 200-mm wafers) manufactured by Applied Materials, Inc.

In the experiments, pre-deposition steps were performed to bring chamber 15 to the desired deposition pressure and to stabilize the gas/liquid flows before depositing the USG film as a filling layer on a wafer. Of course, it is recognized that pre-deposition steps may be varied from the below description (which is merely an exemplary specific embodiment), as is optimal for different deposition recipes. The pre-deposition steps reduce unnecessary deposition on chamber walls and also contribute to yielding uniform depth profiles for the deposited films. Before any pre-deposition steps occur, a wafer is loaded in vacuum chamber 15 onto heater 25 through the vacuum-lock door, which is then closed. Heater 25 is heated up to the processing temperature of about 550° C., which is maintained throughout the pre-deposition steps, the deposition step and the post-deposition steps.

In a first pre-deposition step, heater 25 at a position about 600 mil from gas distribution plate 20. With the throttle valve open for about 5 seconds, helium at a flow rate of about 7000 sccm, and $O_2$ at a flow rate of about 2900 sccm are introduced into chamber 15. The neutral gases, helium and $O_2$, are introduced first into chamber 15 for their flow rates to stabilize. These flow rates of helium and $O_2$ are maintained throughout the pre-deposition steps.

In the second pre-deposition step, the throttle valve is closed and the pressure in chamber 15 is increased to the deposition pressure. The second pre-deposition step lasts less than about 40 seconds and allows the pressure, which may initially fluctuate somewhat around the desired deposition pressure, to stabilize in chamber 15. Heater 25 is moved to the processing position of about 350 mil from gas distribution plate 20 during the second pre-deposition step.

In the third pre-deposition step, when the pressure in chamber 15 has stabilized to the deposition pressure of about 600 torr, liquid TEOS is introduced to allow stabilization of TEOS and helium (or nitrogen) flow. With the TEOS flow rate at about 2000 mgm, the vaporized TEOS gas mixes with the helium (or nitrogen) carrier gas for about 5 seconds during the third pre-deposition step, prior to the deposition step.

Having stabilized the chamber pressure, temperature, and TEOS/helium gas flows, and adjusted the position of heater 25, deposition processing can begin. At the onset of the deposition step, $O_2$ flow is terminated while $O_3$ (about 12.5 wt % oxygen) is introduced at a rate of about 5000 sccm. Being liquid, the TEOS source is vaporized by the liquid injection system and then combined with the inert carrier gas helium. This mixture is introduced into chamber 15 from gas distribution plate 20 to supply reactive gases to the wafer surface where heat-induced chemical reactions take place to produce the desired USG film. The above conditions result in a USG film deposited at a rate of about 1450 Å/minute. By controlling the deposition time, a USG film having a thickness of about 10000 Å is formed at the process conditions described above in about 414 seconds.

After USG deposition, a purge step is performed that optimizes the stability of the deposited USG film to provide moisture resistance. In the purge step, which lasts for about 3 seconds, the deposition conditions are maintained while TEOS flow is terminated.

After the USG deposition step and purge step, post-deposition steps are utilized to control the ramping down of chamber pressure and to control gas shut-off. By adjusting the pressure and gas shut-off, the post-deposition steps help reduce particle formation which otherwise can cause wafer contamination and damage.

In a specific embodiment, three post-deposition steps were used. In the first post-deposition step immediately following the above termination step, the carrier gas flow into chamber 15 is terminated by pumping it through bypass valve. Heater 25 is moved into a position about 600 mil from gas distribution plate 20, as the throttle valve is opened periodically to gradually ramp down chamber pressure during the first post-deposition step, which lasts about 15 seconds. In the second post-deposition step, the throttle valve is opened periodically to continue ramping down chamber pressure, and $O_3$ flow into chamber 15 is continued. Heater 25 is also moved lower to a position about 600 mil from plate 20 during the second post-deposition step, which lasts about 15 seconds. In the third post-deposition step, which lasts about 3 seconds, the throttle valve is opened and $O_3$ flow into chamber 15 is terminated by pumping it through a final valve.

The above experimental conditions for the deposition of USG suitable for being used as a high quality oxide filling layer for shallow trench isolation are optimal to provide the best film quality with high throughput. In shallow trench isolation applications, the deposited USG film should be capable of void-free gap fill (typically at a nominal angle of about 85°), in addition to being a very dense and uniform film. The deposited USG film exhibited good film thickness uniformity. Specifically, film thickness uniformity (49 pt., 1σ) at about 5000 Å thickness of the deposited USG film was measured to be less than about 1.5.

Figure 26A:
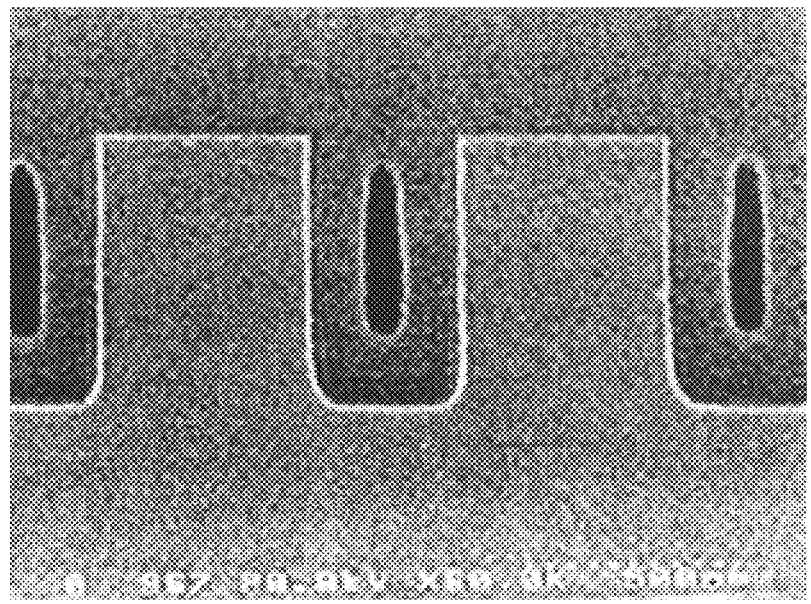
FIGS. 26A and 26B are photomicrographs demonstrating the relative gap fill capabilities of $TEOS/O_3$ USG films deposited at about 400° C. and about 550° C., respectively, after heating at about 1050° C. and a subsequent wet etch processing, in accordance with a specific embodiment of the present invention.
Figure 26B:
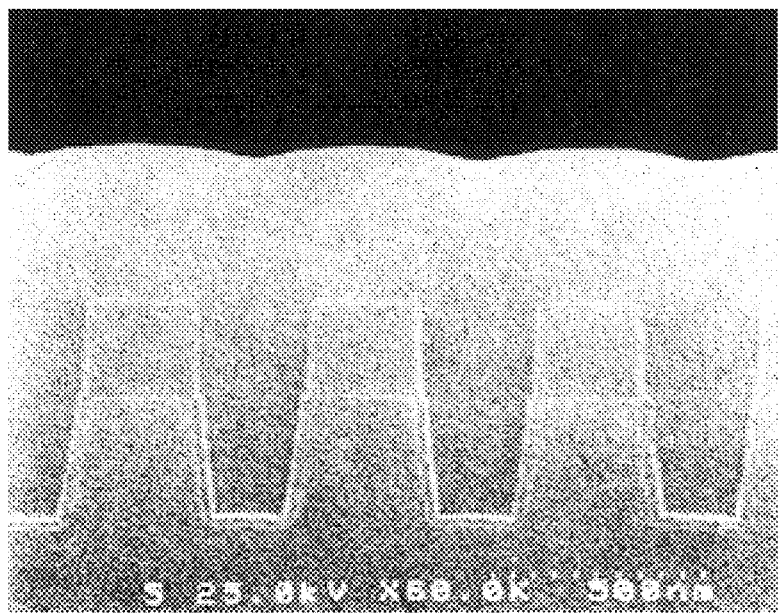

FIGS. 26A and 26B are photomicrographs demonstrating the relative gap fill capabilities of TEOS/$O_3$ USG films deposited at about 400° C. and about 550° C., respectively, after reflow at about 1050° C. and a 6:1 buffered oxide etch (BOE), in accordance with a specific embodiment of the present invention. In particular, FIG. 26A illustrates a trench structure having about 0.35 μm width and about 0.70 μm depth (about 2:1 aspect ratio gap) with a filling layer that is a USG film deposited at about 400° C. after a reflow at about 1050° C. FIG. 26A shows large voids in the deposited USG film, indicating that the USG film deposited at about 400° C. is not very dense and appears to have been prone to shrinkage. Even after a reflow at a temperature above about 1000° C., which can densify a USG film to some extent, the USG film deposited at the temperature of about 400° C. is not very dense and does not survive the high temperature anneal or a subsequent wet etch processing without opening up voids. In comparison, FIG. 26B shows a trench structure having about 0.18 μm width and about 0.45 μm depth (about 2.5:1 aspect ratio gap) with a void-free filling layer that is a USG film deposited at about 550° C. after a reflow at about 1050° C. and a subsequent wet etch processing. The USG film deposited at about 550° C. is capable of filling high aspect ratio gaps without the formation of voids after reflow, unlike USG films deposited at 400° C., as seen from FIGS. 26A and 26B. After etch processes at very uniform etch rates, USG films deposited at about 550° C. retain their superior step coverage without opening up voids.

Figure 27:
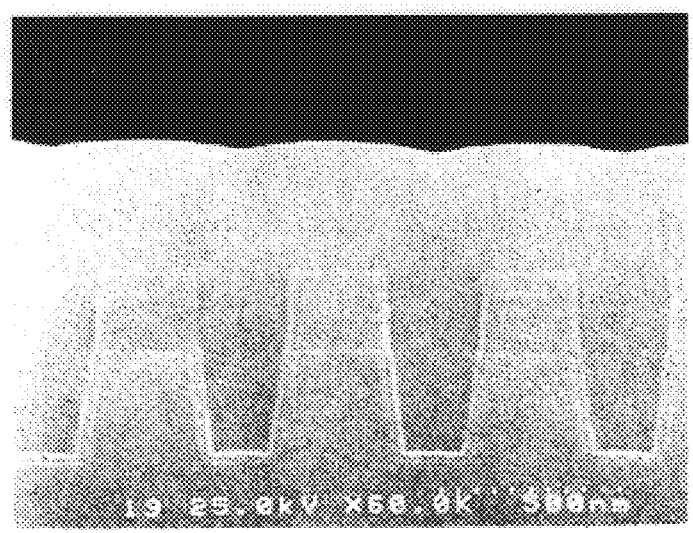
FIG. 27 is a photomicrograph demonstrating the gap fill capability of a USG film deposited at about 550° C. after heating at about 1000° C. and a subsequent wet etch processing, in accordance with a specific embodiment of the present invention.

As further evidence of the high aspect ratio gap filling capability of USG films deposited at about 550° C., FIG. 27 is a photomicrograph demonstrating the gap fill capability of the deposited USG film after an anneal at about 1000° C. and a subsequent wet etch processing, in accordance with a specific embodiment of the present invention. FIG. 27 shows a trench structure having about 0.16 μm width and about 0.48 μm depth (about 3:1 aspect ratio gap) with a filling layer that is a USG film deposited at about 550° C. after a reflow at about 1000° C. The trench structure of FIG. 27 has a smaller spacing and a higher aspect ratio than the trench structures shown in FIGS. 26A and 26B, illustrating the superior gap filling capability of the USG film deposited at about 550° C.

Figure 28:
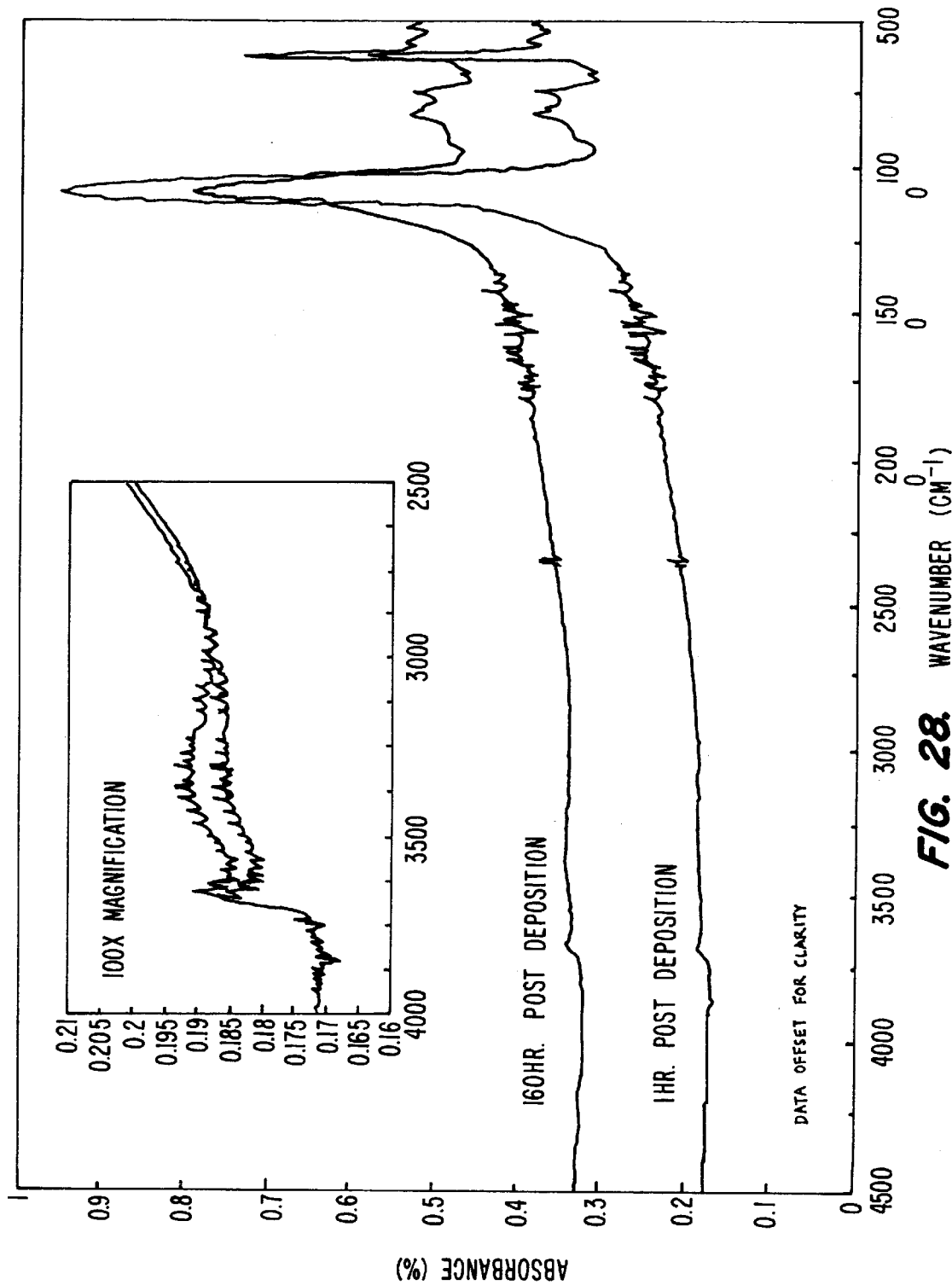
FIG. 28 illustrates the FTIR spectra of a USG film deposited at about 550° C. under exemplary process conditions, according to a specific embodiment.

In addition to having excellent gap fill capability for high aspect ratios, USG films deposited at about 550° C. advantageously are dense films that exhibit high resistance to moisture absorption. Moisture absorption of the deposited USG film deposited was measured using conventional FTIR techniques. FIG. 28 illustrates the FTIR spectra of a USG film deposited at about 550° C. under the following exemplary process conditions, according to a specific embodiment. According to the specific embodiment, the exemplary process conditions include TEOS flow of about 2000 mgm, helium flow of about 7000 sccm, and ozone (about 12.5 wt % oxygen) flow of about 5000 sccm, at a pressure of about 600 torr and spacing of about 350 mil between heater 25 and gas distribution plate 20. As seen in FIG. 28, the FTIR spectra of the USG film deposited at about 550° C. demonstrated low moisture absorption (less than about 1 wt % moisture). Further, FIG. 28 also illustrates that a moisture increase of less than about 0.5 wt % moisture in the USG film was seen over about 160 hours after deposition, indicating the stability of the USG film over extended periods.

Accordingly, as supported by FIG. 28, the deposited USG film is dense, resistant to absorbing moisture. Deposition of a USG film at high temperatures, for example at about 550° C., tends to drive out most moisture that might be absorbed into the film, resulting in a dense film. As a dense film, the USG film deposited at high temperatures of at least about 550° C. has the advantage of being less prone to shrinkage that might result in void formation after an annealing step and a subsequent wet etch processing, compared to USG films deposited at lower temperatures. The dense nature of the deposited USG film makes it compatible for use as a high quality oxide layer for filling trenches used in shallow trench isolation applications. Due to its high density, USG films deposited at high temperatures and used as oxide filling layers can be planarized by either a subsequent anneal or a CMP step, with minimized likelihood of opening up voids. In addition to moisture absorption resistance and good film thickness uniformity, the present USG film deposited at high temperatures provides excellent high aspect ratio gap fill without formation of voids or weak seams that can cause subsequent device problems.

In general, high pressure $O_3$/TEOS USG films may exhibit pattern or surface sensitivity effects, resulting in uneven deposition, which is undesirable. It has been seen that problems with uneven deposition are worsened with higher $O_3$/TEOS ratios. Advantageously, deposition of USG films at high temperatures such as at least about 550° C. requires use of more TEOS in order to achieve adequate deposition rates. Accordingly, the $O_3$/TEOS ratio of USG films deposited at high temperatures is low (less than about 5:1), thereby eliminating any pattern or surface sensitivity effects. Moreover, the film quality (e.g., density, shrinkage, etc.) is high for USG films deposited at high temperatures. Because of the high density of these high temperature deposition USG films, plasma densification treatments or plasma oxide caps are not needed, thereby avoiding any plasma damage to the wafer. The lack of a plasma from such treatments in the chamber thus reduces possibility of metal contamination and potential shorting of devices in the wafer. Compared to low temperature thermal USG films, which often require a plasma densification treatment or plasma oxide cap and may shrink to open voids after an anneal, thermal USG films deposited at temperatures of about 550° C. exhibit excellent gap fill capability, minimal shrinkage, and uniform film density, and low metal contamination, without plasma damage, in accordance with the present invention.

The above description of experiments demonstrates the suitability of the deposited USG film for use, by way of example, as a high quality oxide layer for filling high aspect ratio trenches for shallow trench isolation. The same CVD apparatus also may be used to deposit USG films at temperatures lower than 500° C. for IMD applications. Of course, the above description should not be considered as limiting the scope of the invention.

It is to be understood that the above description is intended to be illustrative and not restrictive. Many embodiments will be apparent to those of skill in the art upon reviewing the above description. By way of example, the inventions herein have been illustrated primarily with regard to a USG, BSG, PSG, and BPSG process recipes, but they are not so limited. For example, the dielectric film formed according to other embodiments may be an arsenic doped silicon oxide film, or other doped film. As another example, the deposition of dielectric films has been described using carrier gas such as helium, but other carrier gases like argon or nitrogen, may be used as well. As a further example, dielectric layers have been described for particular applications, including doped junction formation, PMD layers, IMD layers, oxide filling layers, capping layers, etc. Of course, it is recognized that the same CVD apparatus discussed above may be used to deposit dielectric layers at temperatures lower than about 400° C., as well as temperatures above 500° C. Additionally, various aspects of the present invention may also be used for other applications. Those skilled in the art will recognize other equivalent or alternative methods of depositing the dielectric layer while remaining within the scope of the claims of the present invention. The scope of the invention should, therefore, be determined not with reference to the above description, but should instead be determined with reference to the appended claims, along with the full scope of equivalents to which such claims are entitled.

What is claimed is:

1. A process for forming an ultra-shallow doped region in a substrate in a chamber, said process comprising the steps of:

depositing a doped silicon oxide film on said substrate on a heater at a temperature of at least 500° C. from a reaction of silicon, oxygen and dopants in said chamber, wherein said doped silicon oxide film includes dopant atoms, and wherein said chamber is at a pressure of between about 100–760 torr; and heating said doped silicon oxide film to diffuse said dopant atoms into said substrate to form said ultra-shallow doped region.

2. The process of claim 1 wherein said ultra-shallow region formed in said substrate is selected from a group consisting of a source region, a drain region, a lightly doped drain region, and a channel-stop region in shallow trench isolation.

3. The process of claim 1 wherein said heating step diffuses said dopant atoms into said substrate to form said ultra-shallow region to a depth of less than about 0.1 μm.

4. The process of claim 1 wherein said heating step diffuses said dopant atoms into said substrate to form said ultra-shallow region to a depth of less than about 0.35 µm.

5. The process of claim 1 wherein said heating step is at between about 950–1050° C. for about 1–2 minutes.

6. The process of claim 1 wherein said heating step is at about 1050° C. for about 1 minute.

7. The process of claim 1 wherein said heating step is done in situ by heating said heater in said chamber.

8. The process of claim 1, wherein said silicon is from TEOS and said oxygen is from ozone.

9. The process of claim 1, wherein said process further comprises the step of removing said doped silicon oxide film from said substrate after said heating step.

10. The process of claim 8 wherein said doped silicon oxide film comprises a film selected from a group consisting of a borosilicate glass (BSG) film and a phosphosilicate glass (PSG) film.

11. The process of claim 10 wherein said doped silicon oxide film is between about 50–500 Å thick.

12. A process for forming an ultra-shallow doped region in a substrate in a chamber, said process comprising the steps of:

depositing a doped silicon oxide film on said substrate on a heater at a temperature of at least 500° C. from a reaction of silicon, oxygen and dopants in said chamber, wherein said doped silicon oxide film includes dopant atoms, and wherein said chamber is at a pressure of between about 100–760 torr; and heating said doped silicon oxide film to diffuse said dopant atoms into said substrate to form said ultra-shallow doped region;

depositing an undoped silicate glass (USG) film on said doped silicon oxide film from a reaction of silicon and oxygen in said chamber, wherein said USG film depositing step is performed after said doped silicon oxide film depositing step; and removing said USG film and said doped silicon oxide film after said heating step.

13. The process of claim 12 wherein said USG film depositing step is done at a pressure of between about 50–760 torr in said chamber, and said heater at a temperature of between about 200–600° C.

14. The process of claim 12 wherein deposition of said USG film is performed immediately after deposition of said doped silicon oxide film in an in situ process in said chamber.

15. The process of claim 12 further comprising cleaning the substrate of native oxides in an in situ process in said chamber.

16. The process of claim 12 wherein said USG film is deposited by stopping the introduction of said dopants near completion of formation of said doped silicon oxide film while maintaining introduction of said silicon and oxygen for between about 1–30 seconds.

17. The process of claim 12 wherein said removing step is done in situ in said chamber.

18. The process of claim 1 further comprising cleaning the substrate of native oxides in an in situ process in said chamber.

* * * * *